(12) United States Patent
Yamaguchi

(10) Patent No.: US 10,804,328 B2
(45) Date of Patent: Oct. 13, 2020

(54) SOLID-STATE IMAGING DEVICE, METHOD OF MANUFACTURING THE SAME, AND ELECTRONIC APPARATUS

(71) Applicant: Sony Corporation, Tokyo (JP)

(72) Inventor: Tetsuji Yamaguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/140,769

(22) Filed: Sep. 25, 2018

(65) Prior Publication Data

US 2019/0035854 A1    Jan. 31, 2019

Related U.S. Application Data

(63) Continuation of application No. 15/790,373, filed on Oct. 23, 2017, now Pat. No. 10,147,766, which is a continuation of application No. 15/214,016, filed on Jul. 19, 2016, now Pat. No. 9,887,243, which is a continuation of application No. 14/811,632, filed on Jul. 28, 2015, now Pat. No. 9,426,399, which is a
(Continued)

(30) Foreign Application Priority Data

Jul. 23, 2009    (JP) .............................. 2009-172383

(51) Int. Cl.
| | |
|---|---|
| *H04N 5/374* | (2011.01) |
| *H04N 5/3745* | (2011.01) |
| *H04N 9/04* | (2006.01) |
| *H01L 27/30* | (2006.01) |
| *H01L 27/146* | (2006.01) |
| *H01L 27/28* | (2006.01) |

(52) U.S. Cl.
CPC ...... *H01L 27/307* (2013.01); *H01L 27/14605* (2013.01); *H01L 27/14632* (2013.01); *H01L 27/14636* (2013.01); *H01L 27/14645* (2013.01); *H01L 27/14647* (2013.01); *H01L 27/14687* (2013.01); *H01L 27/14689* (2013.01); *H01L 27/286* (2013.01); *H04N 5/3741* (2013.01); *H04N 5/37457* (2013.01); *H04N 9/045* (2013.01)

(58) Field of Classification Search
CPC .. H04N 5/3741; H04N 5/37457; H04N 9/045; H01L 27/307; H01L 27/286; H01L 27/14636; H01L 27/14605; H01L 27/14645; H01L 27/14647; H01L 27/14687; H01L 27/14689; H01L 27/14632
See application file for complete search history.

(56) References Cited

U.S. PATENT DOCUMENTS 5,873,003 A * 2/1999 Inoue ................... G02B 7/287
                                                    257/E27.136
8,049,256 B2 * 11/2011 Guidash ............ H01L 27/14634
                                                    257/292

(Continued)

*Primary Examiner* — Lin Ye
*Assistant Examiner* — John H Morehead, III
(74) *Attorney, Agent, or Firm* — Sheridan Ross P.C.

(57) ABSTRACT

A solid state imaging device that includes a substrate having oppositely facing first and second surfaces and a photoelectric conversion unit layer having a light incident side facing away from the substrate. The substrate includes a first photoelectric conversion unit and a second photoelectric conversion and the photoelectric conversion layer includes a third photoelectric conversion unit.

19 Claims, 49 Drawing Sheets

Related U.S. Application Data continuation of application No. 13/649,548, filed on Oct. 11, 2012, now Pat. No. 9,123,653, which is a continuation-in-part of application No. 12/836,741, filed on Jul. 15, 2010, now Pat. No. 8,368,784.

(56) References Cited

U.S. PATENT DOCUMENTS

| | | | | |
|---|---|---|---|---|
| 8,228,411 B2* | 7/2012 | Dai | H01L 27/14603 | 348/308 |
| 2005/0029643 A1* | 2/2005 | Koyanagi | H01L 27/14685 | 257/680 |
| 2007/0045520 A1* | 3/2007 | Mitsui | H01L 27/1462 | 250/214 R |
| 2007/0052056 A1* | 3/2007 | Doi | H01L 27/1463 | 257/462 |
| 2007/0076108 A1* | 4/2007 | Misawa | H01L 27/14609 | 348/294 |
| 2007/0114622 A1* | 5/2007 | Adkisson | H01L 27/14627 | 257/414 |
| 2007/0290241 A1* | 12/2007 | Adachi | H04N 5/37452 | 257/292 |
| 2008/0079807 A1* | 4/2008 | Inuiya | H01L 27/14649 | 348/70 |
| 2008/0211047 A1* | 9/2008 | Iida | H01L 27/14603 | 257/432 |
| 2009/0050947 A1* | 2/2009 | Dungan | H01L 27/14625 | 257/294 |
| 2009/0188547 A1* | 7/2009 | Hayashi | H01L 27/307 | 136/249 |
| 2009/0242911 A1* | 10/2009 | Ishihara | H01L 51/5052 | 257/89 |
| 2009/0250594 A1* | 10/2009 | Tanaka | G02B 5/201 | 250/208.1 |
| 2009/0315025 A1* | 12/2009 | Kitamura | C09K 19/3483 | 257/40 |
| 2009/0315136 A1* | 12/2009 | Hayashi | H01L 27/14692 | 257/440 |
| 2009/0322923 A1* | 12/2009 | Maehara | H01L 27/307 | 348/308 |
| 2010/0053387 A1* | 3/2010 | Kim | H01L 31/02165 | 348/273 |
| 2010/0276670 A1* | 11/2010 | Shen | H01L 51/4246 | 257/40 |
| 2011/0031489 A1* | 2/2011 | Phillips | H01L 29/7869 | 257/43 |
| 2011/0129955 A1* | 6/2011 | Gambino | H01L 27/14632 | 438/70 |

* cited by examiner

SOLID-STATE IMAGING DEVICE, METHOD OF MANUFACTURING THE SAME, AND ELECTRONIC APPARATUS

RELATED APPLICATION DATA

This application is a continuation of U.S. patent Ser. No. 15/790,373, filed Oct. 23, 2017, which is a continuation of U.S. patent application Ser. No. 15/214,016, filed Jul. 19, 2016, now U.S. Pat. No. 9,887,243, which is a continuation of U.S. patent Ser. No. 14/811,632, filed Jul. 28, 2015, now U.S. Pat. No. 9,426,399, which is a continuation of U.S. patent application Ser. No. 13/649,548, filed Oct. 11, 2012, now U.S. Pat. No. 9,123,653, which is a continuation-in-part of U.S. patent application Ser. No. 12/836,741, filed Jul. 15, 2010, now U.S. Pat. No. 8,368,784, which claims priority to Japanese Patent Application No. JP 2009-172383, filed in the Japanese Patent Office on Jul. 23, 2009, the entire disclosures of which are hereby incorporated herein by reference.

BACKGROUND OF THE INVENTION

The present invention relates to a solid-state imaging device, a method of manufacturing the same, and an electronic apparatus.

Solid-state imaging devices are broadly classified into two representative kinds of solid-state imaging devices of a CCD (Charge Coupled Device) image sensor and a CMOS (Complementary Metal Oxide Semiconductor) image sensor. In recent years, the size of a pixel has decreased and the number of photons incident on a unit pixel has decreased in CCD image sensors and CMOS image sensors. As a result, sensitivity deteriorates the solid-state image sensor and there is a decrease in the signal to noise ratio (S/N).

In widely used pixel arrangements where red, green, and blue pixels are arranged on planar surface, such as the Bayer arrangement that uses primary color filters, green and blue light does not penetrate the color filter in red pixels and is not used in photoelectric conversion. Therefore, sensitivity of the image sensor may decrease. Moreover, when a color signal is formed by executing an interpolation process between pixels, false color may arise.

In order to solve these problems, Japanese Unexamined Patent Application Publication No. 2007-12796 discloses a solid-state imaging device in which green, blue, and red photoelectric conversion units are laminated in a depth direction in the same pixel. In this solid-state imaging device, a blue photodiode (photoelectric conversion unit) and a red photodiode (photoelectric conversion unit) are formed in the depth direction in a silicon substrate. In addition, the solid-state imaging device includes an organic photoelectric conversion unit in which a green organic photoelectric conversion layer is interposed between electrodes and formed on the upper layer of the front surface of the silicon substrate on the side of a light-sensing portion with a wiring layer interposed between the photoelectric conversion layer and the substrate. According to the configuration disclosed in Japanese Unexamined Patent Application Publication No. 2007-12796, light loss does not occur in the color filter and the sensitivity of the solid-state imaging device is improved. Moreover, since the interpolation process is not performed between pixels, false color does not occur.

Japanese Unexamined Patent Application Publication No. 2008-258474 discloses a back-illuminated CMOS image sensor including color filters, a photoelectric conversion unit with photodiodes laminated in a depth direction, and an organic photoelectric conversion layer. The solid-state imaging device disclosed in Japanese Unexamined Patent Application Publication No. 2008-258474 includes color filters arranged in a yellow and cyan check pattern. The photoelectric conversion unit formed by red and blue photodiodes is disposed in a manner that coordinates with the yellow and cyan filters. Moreover, an organic photoelectric conversion unit is disposed in the upper layer of each photodiode. In this solid-state imaging device, the organic photoelectric conversion unit is sensitive to green light, the photodiode of the yellow filter is sensitive to red light, and the photodiode of the cyan filter is sensitive to blue light.

SUMMARY OF THE INVENTION

In an organic and inorganic hybrid type photoelectric conversion unit, as disclosed in Japanese Unexamined Patent Application Publication No. 2007-12796, the wiring layer is interposed between the Si photodiode executing the photoelectric conversion and the organic photoelectric conversion unit on the upper layer. In this structure, the distance between the photodiodes and the organic photoelectric conversion unit is large. In solid-state imaging devices with this configuration, when an F number of a camera lens is changed, the influence of indirect light is small and the variation in sensitivity is small in the organic photoelectric conversion unit that is close to the on-chip lens. However, the variation in sensitivity may be large in photoelectric conversion units of the Si photodiode that are further from the on-chip lens and receives more indirect light. That is, when the configuration having the organic and inorganic hybrid type photoelectric conversion unit is used, spectral balance between colors may be varied in accordance with the F number. For this reason, when a linear matrix process synchronized with mechanical control of the F number is not executed, the color may be changed in each optical zoom factor. The mechanical control may be executed in principle. However, when a digital signal process (DSP) is executed to execute signal processing in synchronization with the lens control, cost may be increased. Therefore, application to a general DSP or the like is not practical.

It is desirable to provide a solid-state imaging device capable of suppressing the variation in sensitivity between colors by suppressing dependence on the F number of each color in a configuration of an organic and inorganic hybrid-type photoelectric conversion unit, and a method of manufacturing the solid-state imaging device.

It is desirable to provide an electronic apparatus, such as a camera, including the solid-state imaging device.

According to an embodiment of the invention, a solid state imaging device includes a substrate having oppositely facing first and second surfaces, a photoelectric conversion unit layer having a light incident side facing away from the substrate, a first photoelectric conversion unit and a second photoelectric conversion within the substrate and a third photoelectric conversion unit within the photoelectric conversion unit layer.

According to an embodiment of the invention, the solid state imaging device includes a multi-wiring layer outside of the substrate and located in a layer carried on the second substrate surface.

According to an embodiment of the invention the first and second photoelectric conversion units are an inorganic photoelectric conversion material and the third photoelectric conversion unit is an organic photoelectric conversion material.

According to an embodiment of the invention, the substrate has a first substrate surface that faces the light incident side and a second substrate surface that faces away from the incident light surface. In this embodiment, the first photoelectric conversion unit is between the first substrate surface and the second photoelectric conversion unit and the second photoelectric conversion unit is between the first photoelectric conversion unit and the second substrate surface.

According to an embodiment of the invention, the first photoelectric conversion unit is particularly sensitive to blue light, the second photoelectric conversion unit is particularly sensitive to red light and the third photoelectric conversion unit is particularly sensitive to green light.

According to an embodiment of the invention, the third photoelectric conversion unit further comprises a photoelectric conversion material layer, an upper electrode on a surface of the photoelectric conversion material layer facing the light incident side and a lower electrode on a surface of the photoelectric conversion material layer facing the substrate. In this embodiment, a signal charge in the third photoelectric conversion unit is transferred therefrom via the lower electrode.

According to an embodiment of the invention, a first insulating layer I located on each edge of the third photoelectric conversion material layer.

According to an embodiment of the invention a charge accumulation layer is located within the substrate adjacent to the second substrate surface.

According to an embodiment of the invention, the solid state imaging device includes an insulating layer made of $HfO_2$ and biased with a fixed negative voltage. In this embodiment, the insulating layer is between the photoelectric conversion unit layer and the substrate.

According to an embodiment of the invention, the solid state imaging device includes a thin film transistor within the photoelectric conversion unit layer.

According to an embodiment of the invention, a solid state imaging device includes a plurality of pixels arranged in a matrix having rows and columns. In this embodiment, each pixel comprises at least a portion of a substrate having oppositely facing first and second substrate surfaces, a photoelectric conversion unit layer having a light incident side facing away from the substrate, a first photoelectric conversion unit and a second photoelectric conversion within the at least a portion of a substrate and a third photoelectric conversion unit within the photoelectric conversion unit layer.

According to an embodiment of the invention, each pixel includes a thin film transistor within the photoelectric conversion unit layer. In this embodiment, the drain regions of the thin film transistors arranged along a common vertical line are commonly connected via a common wire.

According to an embodiment of the invention, there is a method for manufacturing a solid state imaging device that includes forming a substrate that has oppositely facing first and second surfaces and forming a first photoelectric conversion unit and a second photoelectric conversion within the substrate. This method also includes forming a photoelectric conversion unit layer, including a third photoelectric conversion unit therein. The photoelectric conversion unit layer has a light incident side facing away from the substrate.

According to an embodiment of the invention, there is an electronic device that includes a solid state imaging device. In this embodiment, the solid state imaging device includes a substrate having oppositely facing first and second surfaces and a photoelectric conversion unit layer having a light incident side facing away from the substrate. In this embodiment, a first photoelectric conversion unit and a second photoelectric conversion are located within the substrate and a third photoelectric conversion unit is within the photoelectric conversion unit layer. Furthermore, in this embodiment the electronic device has an imaging function.

In the solid-state imaging device according to the embodiments of the invention, since the inorganic photoelectric conversion unit is configured so as to be close to the organic photoelectric conversion unit, it is possible to suppress the dependence on the F number of each color. Therefore, it is possible to suppress the variation in the sensitivity between colors.

In the method of manufacturing the solid-state imaging device according to the embodiments of the invention, since the inorganic photoelectric conversion unit is configured so as to be close to the organic photoelectric conversion unit, it is possible to suppress the dependence on the F number of each color. Accordingly, the solid-state imaging device capable of suppressing the variation in the sensitivity between colors can be manufactured.

The electronic apparatus according to the embodiment of the invention includes the back-illuminated solid-state imaging device in which the inorganic photoelectric conversion unit is configured so as to be close to the organic photoelectric conversion unit in the same pixel. Therefore, it is possible to suppress the dependence on the F number of each color and suppress the variation in the sensitivity between colors. Accordingly, the electronic apparatus with high quality can be provided.

DESCRIPTION OF THE PREFERRED EMBODIMENTS

Hereinafter, preferred embodiments (hereinafter, referred to as embodiments) of the invention will described. The description will be made in the following order.
1. Configuration of CMOS Solid-State Imaging Device
2. First Embodiment (Configuration of Solid-State Imaging Device and Method of Manufacturing the Same)
3. Second Embodiment (Configuration of Solid-State Imaging Device and Method of Manufacturing the Same)
4. Third Embodiment (Configuration of Solid-State Imaging Device)
5. Fourth Embodiment (Configuration of Solid-State Imaging Device)

6. Fifth Embodiment (Configuration of Solid-State Imaging Device)
7. Sixth Embodiment (Configuration of Solid-State Imaging Device and Method of Manufacturing the Same)
8. Seventh Embodiment (Configuration of Solid-State Imaging Device)
9. Eighth Embodiment (Configuration of Solid-State Imaging Device)
10. Ninth Embodiment (Configuration of Electronic Apparatus)

1. Exemplary Overall Configuration of CMOS Solid-State Imaging Device

Figure 51:
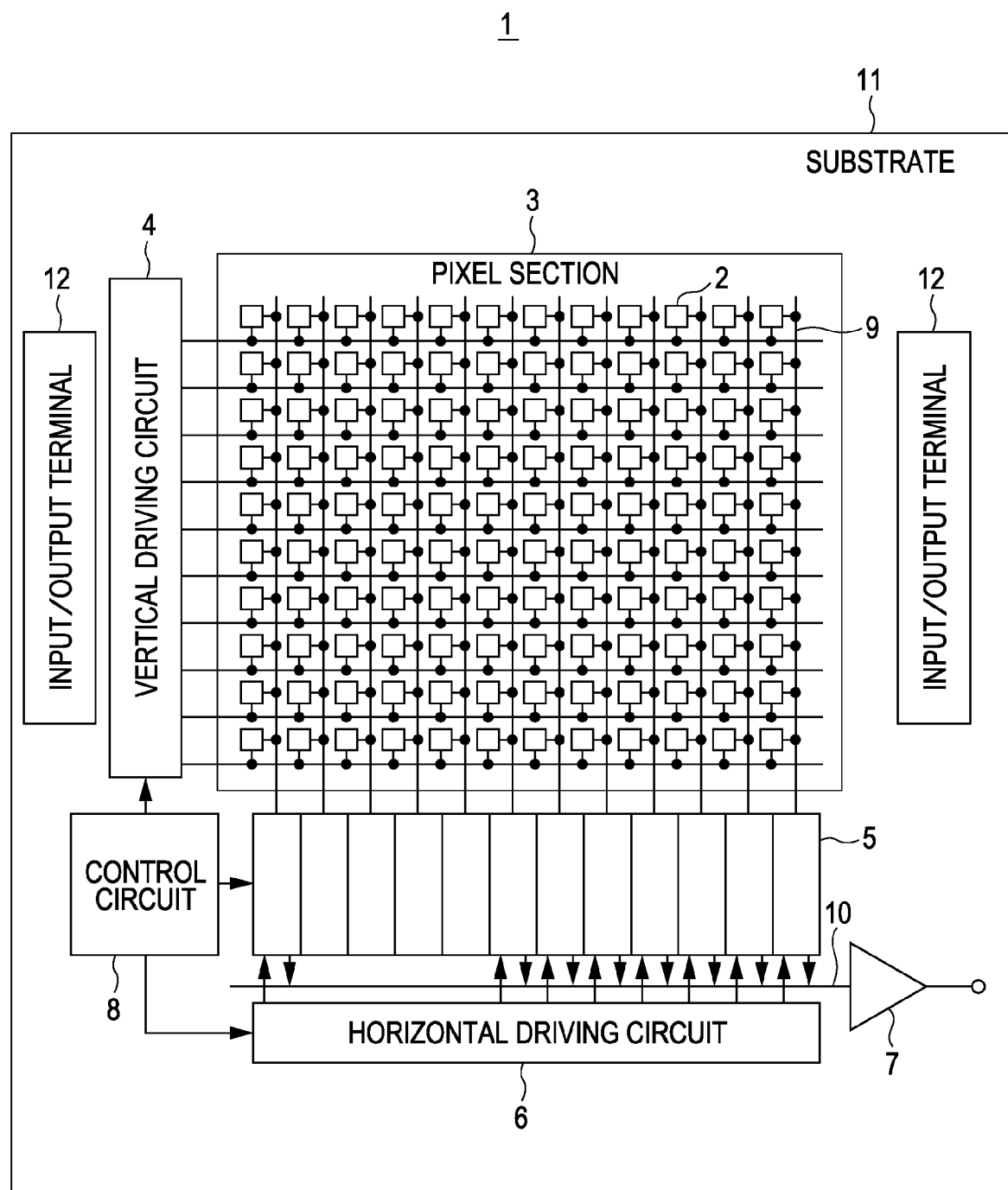
FIG. 51 is a schematic diagram illustrating the configuration of a CMOS solid-state imaging device.

FIG. 51 is a diagram illustrating an exemplary overall configuration of a CMOS solid-state imaging device according to each embodiment of the invention. As shown in FIG. 51, a solid-state imaging device 1 according to the embodiments includes a pixel section (so-called an imaging area) 3, where plural pixels 2 including a photoelectric conversion unit are regularly arranged two-dimensionally in a semiconductor substrate 11 such as a silicon substrate, and a peripheral circuit section. The pixel 2 includes the photoelectric conversion unit and plural pixel transistors (so-called MOS transistors). For example, the plural pixel transistors include three transistors such as a transmission transistor, a reset transistor, and an amplification transistor. Alternatively, the plural pixel transistors may include four transistors in addition to a selection transistor. Since an equivalent circuit of a unit pixel is the same as a general equivalent circuit, the detailed description is omitted. A so-called pixel shared structure may be applied in which the plural photoelectric conversion units share the other pixel transistors except for the transmission transistor and share the floating diffusion in the pixel.

The peripheral circuit section includes a vertical driving circuit 4, column signal processing circuits 5, a horizontal driving circuit 6, an output circuit 7, and a control circuit 8.

The control circuit 8 receives data instructing an input clock, an operation mode, or the like and outputs data such as internal information regarding the solid-state imaging device. That is, the control circuit 8 generates a clock signal or a control signal serving as a reference signal of the operations of the vertical driving circuit 4, the column signal processing circuits 5, the horizontal driving circuit 6, and the like in accordance with a vertical synchronous signal, a horizontal synchronous signal, and a master clock. These signals are input to the vertical driving circuit 4, the column signal processing circuits 5, the horizontal driving circuit 6, and the like.

The vertical driving circuit 4, which includes a shift register, for example, selects pixel driving wires, supplies pulses to drive pixels to the selected pixel driving wires, and drives the pixels in a row unit. That is, the vertical driving circuit 4 selectively scans the pixels 2 of the pixel section 3 sequentially in a row unit in a vertical direction and supplies the column signal processing circuits 5, via the vertical signal lines 9, with pixel signals corresponding to signal charges generated in accordance with an amount of light received in the photodiodes, for example, serving as the photoelectric conversion element of each pixel 2.

The column signal processing circuit 5 is disposed in each column of the pixels 2, for example. The column signal processing circuit 5 executes a signal processing operation, such as a noise removing operation, on signals output from the one-row pixels 2 in each pixel column. That is, the column signal processing circuit 5 executes a signal processing operation such as a CDS operation of removing a fixed pattern noise present in the pixel 2, a signal amplifying operation, or an AD converting operation. Horizontal selection switches (not shown) are disposed and connected between the output terminals of the column signal processing circuits 5 and the horizontal signal line 10.

The horizontal driving circuit 6 includes a shift register, for example. The horizontal driving circuit 6 sequentially outputs horizontal scanning pulses and sequentially selects the column signal processing circuits 5 to output the pixel signals from the column signal processing circuits 5 to the horizontal signal line 10.

The output circuit 7 executes a signal processing operation on the signals sequentially supplied from the column signal processing circuits 5 via the horizontal signal line 10 and outputs the signals. For example, the output circuit 7 executes only a buffering operation or executes a black-level adjusting operation, a column variation adjustment operation, and various digital signal processing operations. Input/output terminals 12 exchange signals with an external device.

2. First Embodiment

Configuration of Solid-State Imaging Device

Figure 1:
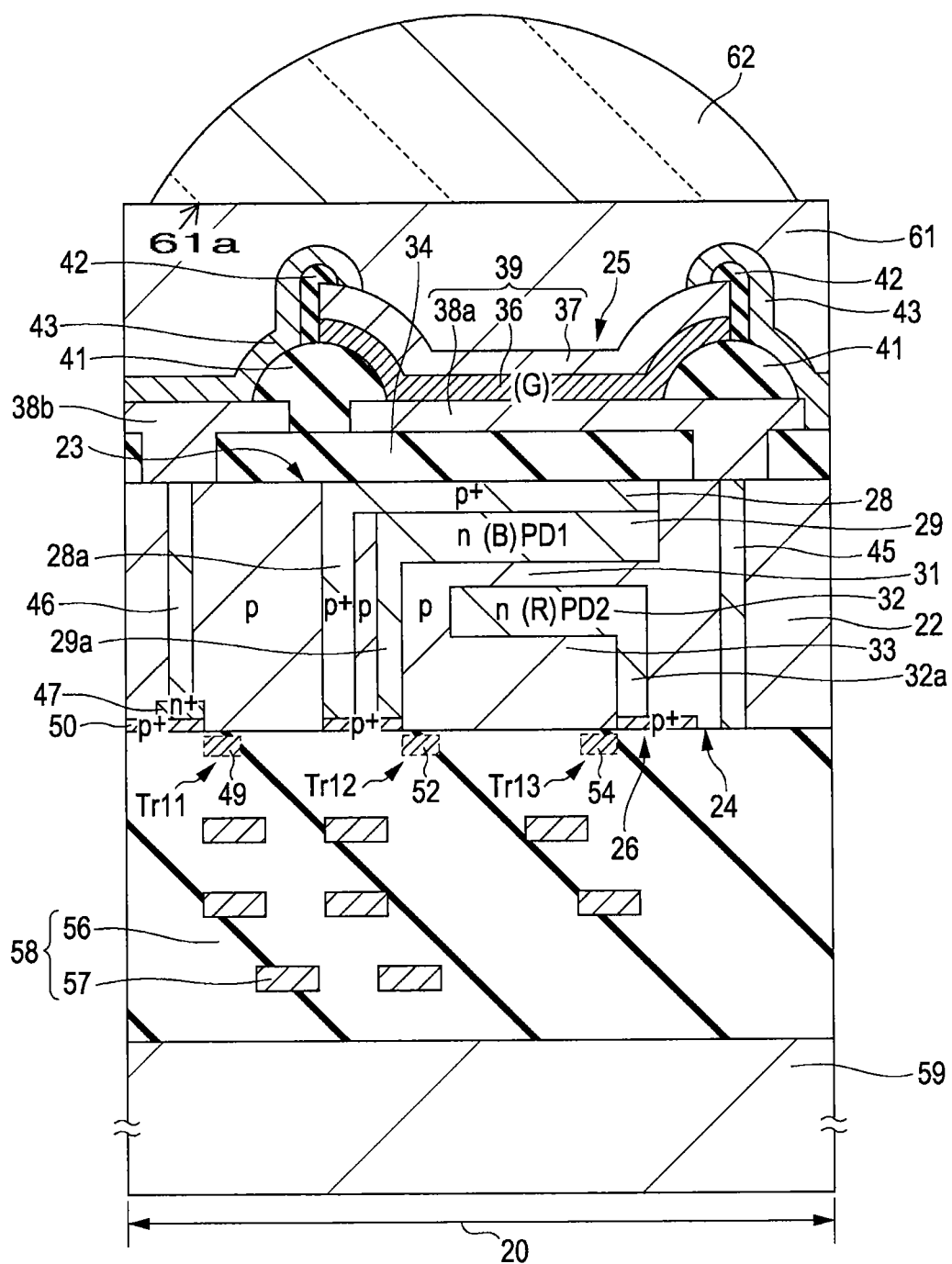
FIG. 1 is a diagram illustrating the configuration of major units of a solid-state imaging device according to a first embodiment of the invention.

FIG. 1 is a diagram illustrating a solid-state imaging device according to a first embodiment of the invention. The solid-state imaging device according to this embodiment is a CMOS solid-state imaging device. FIG. 1 is a sectional view illustrating one pixel 20 in the pixel section of the CMOS solid-state imaging device.

A solid-state imaging device 21 according to the first embodiment includes three photoelectric conversion units. The first and second photoelectric conversion units PD1 and PD2 are within a substrate 22. The substrate has a front surface, also called a second substrate surface (24) and a rear surface, also called a first substrate surface (23). The third photoelectric conversion unit 39 is within a photoelectric conversion layer 61. The photoelectric conversion layer 61 has an incident light side 61a. In this embodiment, the third photoelectric conversion unit 39 can be an inorganic photoelectric unit and the first and second photoelectric conversion units PD1 and PD2 can be inorganic and have a pn junction. Further, the organic photoelectric conversion unit 39 and the inorganic photoelectric conversion units PD1 and PD2 are laminated in the same pixel in a depth direction, that is, PD1 is between the first substrate surface and PD2 and PD2 is between PD1 and the second substrate surface.

More specifically, the solid-state imaging device 21 includes a semiconductor substrate (silicon substrate) 22 in which an inorganic photoelectric conversion unit, which is described below, is formed. A light-sensing portion on which light is incident is formed on a rear surface 23 of the substrate 22. The rear surface 23 can also be referred to as a first substrate surface. A circuit including so-called reading circuit is formed on a front surface 24 of the substrate 22. The front surface 24 can also be referred to as a second substrate surface. That is, the solid-state imaging device 21 include a light-sensing portion 25 formed on the rear surface 23 of the substrate 22 and a circuit formation surface 26 formed on the front surface 24 opposite to the light-sensing portion 25. The semiconductor substrate 22 is configured as a first type semiconductor substrate, for example, an n-type semiconductor substrate.

In the semiconductor 22, the two inorganic photoelectric conversion units having the pn junction, that is, a first photodiode PD1 and a second photodiode PD2 are laminated from the rear surface 23 in the depth direction. In the semiconductor substrate 22, a p-type semiconductor region 28 serving as a hole accumulation layer, an n-type semiconductor region 29 serving as a charge accumulation layer, and a p-type semiconductor region 31, an n-type semiconductor region 32 serving as a charge accumulation layer, and a p-type semiconductor region 33 are formed from the rear surface 23 in the depth direction. The first photodiode PD1 is formed to use the n-type semiconductor region 29 as a charge accumulation layer. The second photodiode PD2 is formed to use the n-type semiconductor region 32 as a charge accumulation layer.

In this embodiment, the first photodiode PD1 is a photodiode that is particularly sensitive to blue light and the second photodiode PD2 is a photodiode that is particularly sensitive to red light. A part of each of the n-type semiconductor regions 29 and 32 extends to the front surface 24 of the substrate 22. Extension portions 29a and 32a extend from the opposite ends of the n-type semiconductor regions 29 and 32, respectively. The p-type semiconductor region 28 serving as a hole accumulation layer is connected to a p-type semiconductor well region on the front surface. A p-type semiconductor region serving as a hole accumulation layer is formed in each interface between an insulating layer facing the front surface 24 of the substrate and the n-type semiconductor region 29 of the first photodiode PD1 and the n-type semiconductor region 32 of the second photodiode PD2.

A first color organic photoelectric conversion unit 39, aka, the third photoelectric conversion unit, in which an upper electrode 37 and a lower electrode 38a are formed on both upper and lower surfaces of an organic photoelectric conversion layer 36, is laminated on the upper layer of the rear surface of the substrate in the region where the first photodiode PD1 and the second photodiode PD2 are formed with an insulating layer 34 interposed therebetween. In this embodiment, the organic photoelectric conversion unit 39 is particularly sensitive to green light. The upper electrode 37 and the lower electrode 38a are formed of a transparent conductive layer such as an indium tin oxide (ITO) layer or an indium zinc oxide layer.

In this embodiment, the organic photoelectric conversion unit 39 is a unit for a green color, the first photodiode PD1 is a photodiode for a blue color, and the second photodiode PD2 is a photodiode for a red color or a combination except for the red color. However, another color combination is possible. For example, the organic photoelectric conversion unit 39 may be a unit for a red color or a blue color, and the first photodiode PD1 and the second photodiode PD2 may be photodiodes for other colors. In this case, the positions of the first photodiode PD1 and the second photodiode PD2 in the depth direction are determined in accordance with the colors.

The organic photoelectric conversion layer executing photoelectric conversion into light with a green wavelength may be formed of an organic photoelectric conversion material such as a rhodamine-based pigment, a merocyanine-based pigment, or a quinacridone-based pigment. The organic photoelectric conversion layer executing photoelectric conversion into light with a red wavelength may be formed of an organic photoelectric conversion material such as a phthalocyanine-based pigment. The organic photoelectric conversion layer executing photoelectric conversion into light with a blue wavelength may be formed of an organic photoelectric conversion material such as a coumarin-based pigment, tris-8-hydroxyquinolines Al(Alq3), or a merocyanine-based pigment.

In the organic photoelectric conversion unit 39, transparent lower electrodes 38a and 38b halved on the insulating layer 34 are formed and an insulating layer 41 is formed to isolate both the lower electrodes 38a and 38b from each other. The organic photoelectric conversion layer 36 on the lower electrode 38a and the transparent upper electrode 37 on the organic photoelectric conversion layer 36 are formed. An insulating layer 42 is formed to protect the end surfaces of the patterned upper electrode 37 and the patterned organic photoelectric conversion layer 36, that is, the end surfaces patterned by etching. In this state, the upper electrode 37 is connected to the other lower electrode 38b via a contact metal layer 43 by another conductive layer.

By forming the protective insulating layer, it is possible to protect the end surface of the organic photoelectric conversion layer, and thus to prevent the organic photoelectric conversion layer and the electrodes from coming into contact with each other. The material of the upper electrode 37 is selected in consideration of a work function. Therefore, when another electrode material comes into contact with the end surface of the organic photoelectric conversion layer, that is, the side wall thereof, a dark current may occur in the side wall of the organic photoelectric conversion layer. Since the organic photoelectric conversion layer 36 and the upper electrode 37 are consistently formed, the clean interface therebetween is formed. However, the side wall of the organic photoelectric conversion layer 36 patterned by dry etching or the like is not clean. Moreover, when another electrode material comes into contact with the side wall thereof, the interface may deteriorate, and thus a dark current may increase.

In the semiconductor substrate 22 in one pixel 20, a pair of conductive plugs 45 and 46 formed through the semiconductor substrate 22 is formed. The lower electrode 38a of the organic photoelectric conversion unit 39 is connected to the conductive plug 45, and the lower electrode 38b connected to the upper electrode 37 is connected to the other conductive plug 46. Since one conductive plug 45 may exist for the lower electrode, at least one conductive plug may exist across the pixel region, as long as the upper electrode is not isolated in each pixel.

In order to prevent short-circuit with Si, for example, the conductive plugs 45 and 46 may be formed of $SiO_2$, a W plug having a SiN insulating layer circumferentially, or a semiconductor layer formed by ion-implanting. In this embodiment, electrons are used as signal charges. Therefore, the conductive plug 45 is an n-type semiconductor layer, when the conductive plug 45 is formed in the semiconductor layer by ion-implanting. It is desirable that the upper electrode is of a p-type, since holes are extracted.

In this embodiment, in order to accumulate electrons, which serve as the signal charges in the pairs of electrons and holes subjected to photoelectric conversion by the organic photoelectric conversion unit 39, via the upper electrode 37 and the conductive plugs, an n-type semiconductor region 47 for charge accumulation is formed on the surface of the substrate 22.

Figure 2:
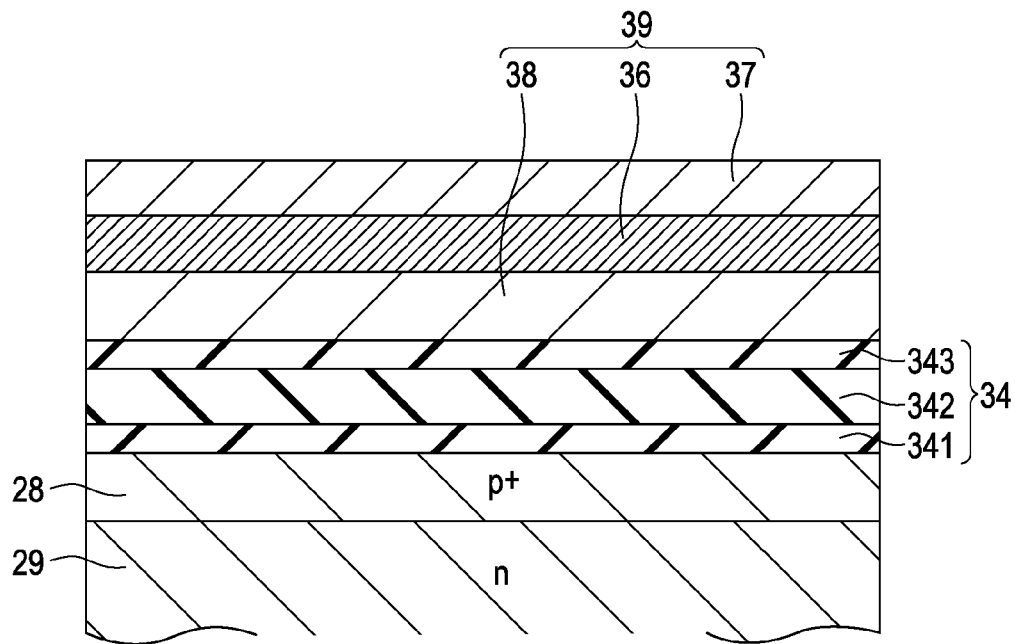
FIG. 2 is a sectional view illustrating the major units of a solid-state imaging device according to the first embodiment.

It is desirable to use a layer with negative fixed charges as the insulating layer 34 on the rear surface 23 of the semiconductor substrate 22. It is desirable to use a hafnium oxide layer 342 as the layer with negative fixed charges, for example, as shown in FIG. 2. That is, the insulating layer 34 has a three-layer structure in which a silicon oxide layer 341, the hafnium oxide layer 342, a silicon oxide layer 343 are laminated sequentially from the rear surface 23. Since the hafnium oxide layer 342 has the negative fixed charges, as described below, a hole accumulation state of the interface between the silicon of the p-type semiconductor region (silicon) 28 and the insulating layer 34 is enhanced. Therefore, it is advantageous to prevent the dark current from occurring.

Figure 3:
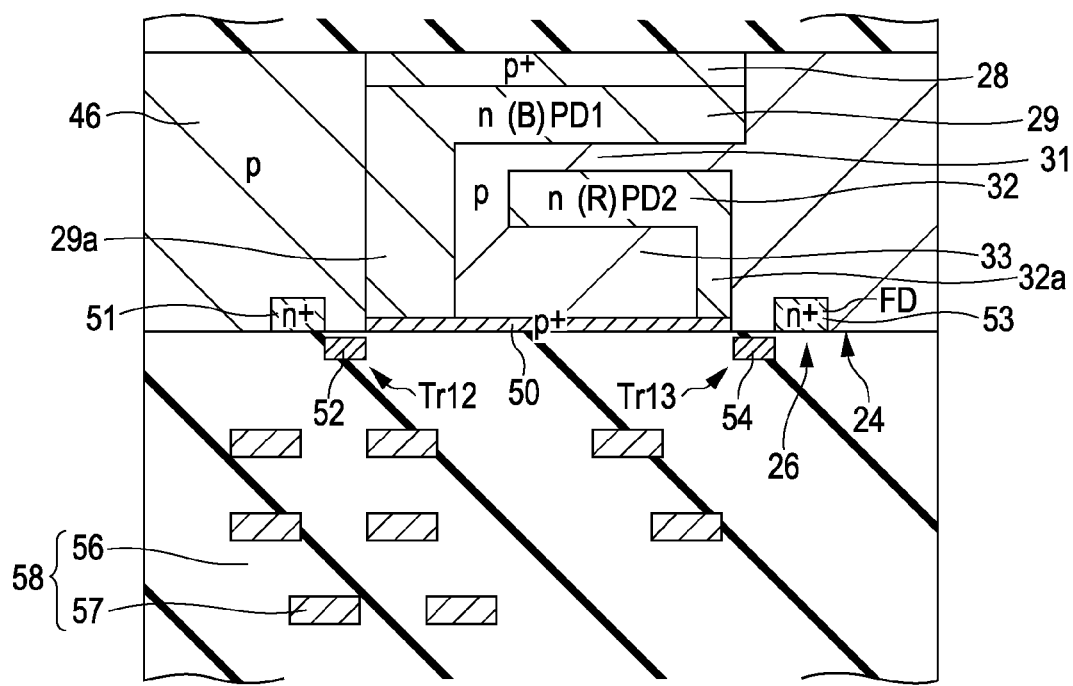
FIG. 3 is a sectional view illustrating transmission transistors Tr12 and Tr13 according to the first embodiment.
Figure 4:
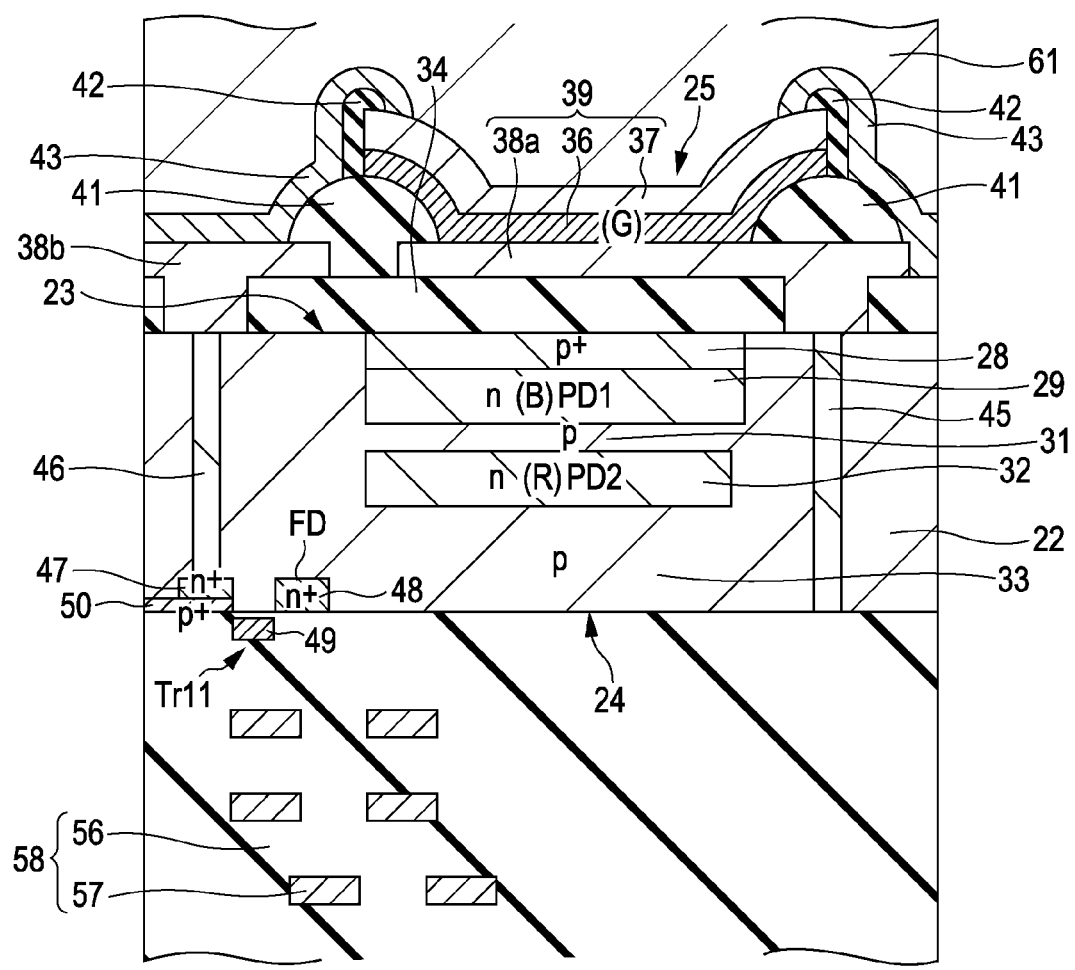
FIG. 4 is a sectional view illustrating a transmission transistor Tr11 according to the first embodiment.

The plural pixel transistors corresponding to the organic photoelectric conversion unit 39, the first photodiode PD1, and the second photodiode PD2 are formed on the circuit formation surface 26 on the side of the front surface of the substrate 22. The plural pixel transistors may have the above-described four-transistor configuration or three-transistor configuration. Alternatively, the above-described configuration sharing a pixel transistor may be applied. In FIGS. 3 and 4 illustrating the cross-section different from the cross-section in FIG. 1, the pixel transistor is schematically illustrated. FIGS. 3 and 4 representatively show the transmission transistor of the plural pixel transistors. That is, in the organic photoelectric conversion unit 39, as shown in FIG. 4, the n-type semiconductor region 47 for charge accumulation is connected to a transmission transistor Tr11 including an n-type semiconductor region 48 serving as a floating diffusion unit and a transmission gate electrode 49. In the first photodiode PD1, as shown in FIG. 3, the extension portion 29a of the n-type semiconductor region 29 serving as a charge accumulation layer is connected to a transmission transistor Tr12 including an n-type semiconductor region 51 serving as a floating diffusion unit and a transmission gate electrode 52. In the second photodiode PD2, as shown in FIG. 3, the extension portion 32a of the n-type semiconductor region 32 serving as a charge accumulation layer is connected to a transmission transistor Tr13 including an n-type semiconductor region 53 serving as a floating diffusion unit and a transmission gate electrode 54.

Even though the arrangement positions are different, the transmission transistors Tr11 to Tr13 in FIGS. 3 and 4 are illustrated as gate electrodes 49, 52, and 54 in FIG. 1 for convenience. The same is applied to the following embodiments.

At least, a p-type semiconductor region 50 serving as a hole accumulation layer is formed in the interface with the insulating layer, which faces the front surface 24 of the substrate of the n-type semiconductor regions 29a and 32a respectively forming the first photodiode PD1 and the second photodiode PD2. In FIG. 3, the p-type semiconductor region 50 serving as the hole accumulation layer is formed so as to include the interface between the p-type semiconductor region 33 and the insulating layer. The p-type semiconductor region 50 serving as the hole accumulation layer is formed in the interface with the insulating layer, which faces the front surface 24 of the substrate of the n-type semiconductor region 47 for charge accumulation in the organic photoelectric conversion unit 39. The pixel transistor including the transmission transistors Tr11 to Tr13 is formed in the p-type semiconductor well region on the front surface of the substrate.

Although not illustrated, the pixel transistors of the pixel section are formed on the front surface of the semiconductor substrate 22 and a peripheral circuit such as a logic circuit is formed in the peripheral circuit section.

A multi-layer wiring layer 58, in which layer wirings 57 of plural layers are disposed with an inter-layer insulating layer 56 interposed therebetween, is formed on the front surface of the semiconductor substrate 22. A supporting substrate 59 is joined to the multi-layer wiring layer 58.

The rear surface of the semiconductor substrate 22, more specifically, the surface of the upper electrode 37 of the organic photoelectric conversion unit 39 serves as the light-sensing portion 25. An on-chip lens 62 is formed on the organic photoelectric conversion unit 39 with a planarization layer 61 interposed therebetween. In this embodiment, no color filter is formed.

An operation (driving method) of the solid-state imaging device 21 according to the first embodiment will be described. The solid-state imaging device 21 is configured as a so-called back-illuminated solid-state imaging device emitting light from the rear surface of the substrate. In this embodiment, a negative fixed voltage VL (<0 V) is applied to the lower electrode 38a of the organic photoelectric conversion unit 39 via the necessary wiring 57 of the multi-layer wiring layer 58, and a voltage VU (>VL), such as a power voltage, higher than the voltage VL of the lower electrode 38a is applied to the upper electrode 37 at the time of accumulating the charges. That is, a negative voltage VL is applied to the lower electrode 38a close to the semiconductor substrate 22. The voltage of 0 V is applied from the necessary wiring 57 to the p-type semiconductor region 28 serving as the hole accumulation layer via the extension portion 28a.

Figure 5:
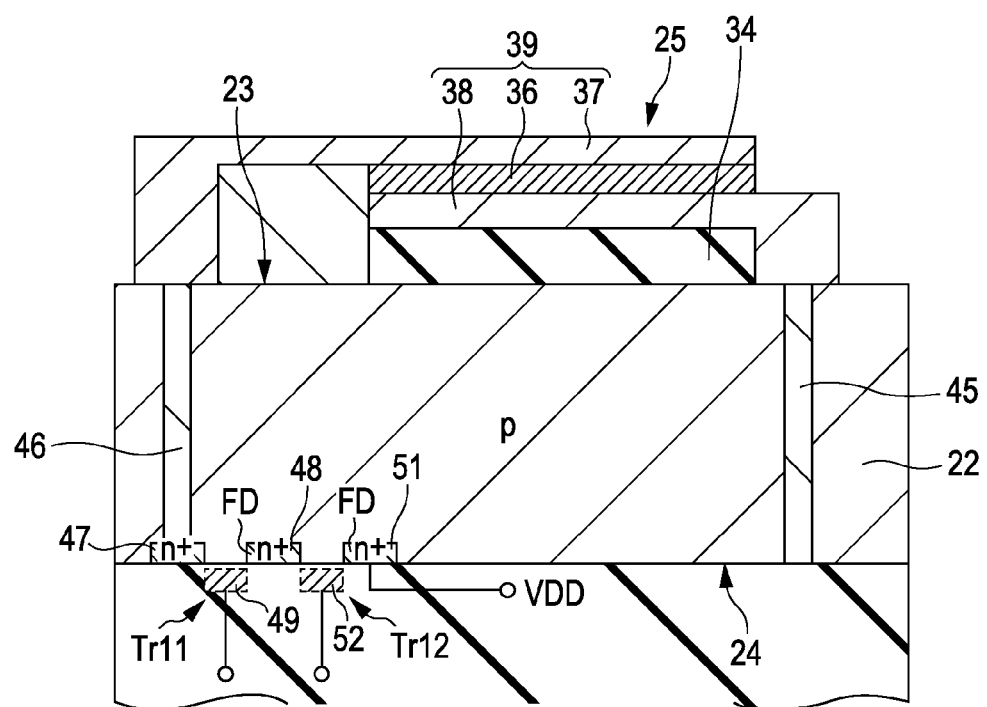
FIG. 5 is a schematic sectional view illustrating a driving operation according to the first embodiment.

The application of a high voltage VH to the upper electrode 37 at the time of accumulating the charges will be described with reference to FIG. 5. FIG. 5 is a schematic diagram illustrating the organic photoelectric conversion unit 39. At the time of reset, the reset transistor Tr2 and the transmission transistor Tr11 are turned on, and the n-type semiconductor region 48 serving as a floating diffusion unit (FD) and the n-type semiconductor region 47 for charge accumulation are reset by a power voltage VDD. Thereafter, when the reset transistor Tr2 and the transmission transistor Tr11 are turned off to accumulate charges, the potential of the n-type semiconductor region 47 and the upper electrode 37 connected to the n-type semiconductor region 47 are varied in accordance with the accumulated charges. The potential becomes a signal potential.

When light is incident on one pixel 20 without passing through a color filter at the time of accumulating the charges, green-wavelength light is subjected to photoelectric conversion by the organic photoelectric conversion layer 36 capable of absorbing the green-wavelength light. Of the pairs of the electrons and holes generated by the photoelectric conversion, the electrons serving as the signal charges are guided to the upper electrode 37 with the high voltage VU and are accumulated in the n-type semiconductor region 47 via the conductive plug 46. The holes subjected to the photoelectric conversion are guided to the lower electrode 38a with the potential VL and are discharged via the conductive plug 45 and the necessary wiring 57. The blue-wavelength light is absorbed and subjected to photoelectric conversion by the first photodiode PD1 formed in a shallow portion close to the rear surface of the semiconductor substrate 22, and the signal charges corresponding to the blue color are accumulated in the n-type semiconductor region 29. The red-wavelength light is absorbed and subjected to photoelectric conversion by the second photodiode PD2 formed in a deep portion from the rear surface of the semiconductor substrate 22, and the signal charges corresponding to the red color are accumulated in the n-type semiconductor region 32.

At the time of reading the charges, the transmission transistors Tr11, Tr12, and Tr13 are turned on. When the transmission transistors are turned on, the accumulated signal charges (electrons) of the organic photoelectric conversion unit 39, the first photodiode PD1, and the second photodiode PD2 are transmitted to the floating diffusion units (FD) 48, 51, and 54, respectively. The pixels signals of the red, green, and blue colors are read and output by the vertical signal lines via the other pixel transistors.

In the solid-state imaging device 21 according to the first embodiment, the organic photoelectric conversion unit 39, the first photodiode PD1, and the second photodiode PD2 of a back-illuminated type are laminated in the depth direction. With such a configuration, the first photodiode PD1 and the organic photoelectric conversion unit 39 are close to each other. That is, since the multi-layer wiring layer 58 does not exist between the first photodiode PD1 and the organic photoelectric conversion unit 39, the first photodiode PD1 and the organic photoelectric conversion unit 39 are very close to each other. Of course, the first photodiode PD1 and the second photodiode PD2 are very close to each other. That is, the dependence on the red, green, and blue F number s is suppressed. Therefore, even when the F number s are changed, the spectral balance of each color is not changed. That is, it is possible to suppress the variation in sensitivity between the colors.

At the time of accumulating the charges, the negative voltage VL is applied to the lower electrode 38a of the organic photoelectric conversion unit 39. Therefore, the hole concentration of the p-type semiconductor region 28 serving as the hole accumulation layer of the first photodiode PD1 shows a tendency to increase. Accordingly, it is possible to prevent the dark current from occurring in the interfaces with the insulating layer 34 of the p-type semiconductor region 28.

The voltage VL of the lower electrode is set to a voltage (VL>0 V) higher than 0 V and the voltage VU of the upper electrode is set to a voltage (VU>VL) lower than the voltage VL of the lower electrode to accumulate the charges, the hole concentration of the hole accumulation layer of the first photodiode PD1 shows a tendency to decrease. Therefore, the hole accumulation state of the hole accumulation layer becomes weak, and thus the dark current may easily occur. In this case, of the pairs of the electrons and holes subjected to the photoelectric conversion by the organic photoelectric conversion layer, the electrons serving as the signal charges flow to the lower electrode and are accumulated in the charge accumulation layer. At this time, it is necessary to form a charge accumulation layer in the end of the conductive plug to which the lower electrode is connected.

In this embodiment, since a hafnium oxide ($HfO_2$) layer with a negative fixed charge shown in FIG. 2 is used as the insulating layer 34 on the first photodiode PD1, the hole accumulation state is enhanced in the p-type semiconductor region 28 serving as the hole accumulation layer. Since the hole accumulation state can be further enhanced by permitting the lower electrode 38a of the organic photoelectric conversion unit 39 to become a negative potential, it is possible to further suppress the dark current in the interface between the silicon and the insulating layer.

In this embodiment, since the red, green, and blue photoelectric conversion units are laminated in one pixel, a color filter is not necessary. Therefore, there is no loss of the incident light and it is possible to improve sensitivity. Moreover, since the red, green, and blue signals can be obtained from the same pixel, an interpolation process between pixels is not necessary. Therefore, a false color does not occur.

In the front-illuminated solid-state imaging device, when a photodiode serving as an organic photoelectric conversion unit is formed on a multi-layer wiring layer and photoelectric conversion units corresponding two colors are formed in a semiconductor substrate, only the aperture ratio of the organic photoelectric conversion unit may be increased and the aperture ratios of the photodiodes for the other two colors may be decreased. In this embodiment, however, by configuring the back-illuminated solid-state imaging device, it is possible to improve not only the aperture ratio of the organic photoelectric conversion unit but also the aperture ratios of the two photodiodes in the semiconductor substrate. Therefore, the solid-state imaging device according to this embodiment can increase the sensitivity, compared to a case where photodiodes corresponding three colors are simply laminated.

In this embodiment, the potential of the upper electrode 37 is set to a positive potential and the potential of the lower electrode 38a is set to a negative potential. However, the potential of the lower electrode 38a may be set to a positive weak potential lower than the potential of the upper electrode 37. Even in this case, the electrons serving as the signal charge can be obtained from the upper electrode 37 and can be read via the transmission transistor Tr11.

Exemplary Method of Manufacturing Solid-State Imaging Device

FIGS. 6 to 17 are diagrams illustrating a method of manufacturing the solid-state imaging device 21 according to the first embodiment. In the drawings, only the major units corresponding to one pixel are shown.

Figure 6:
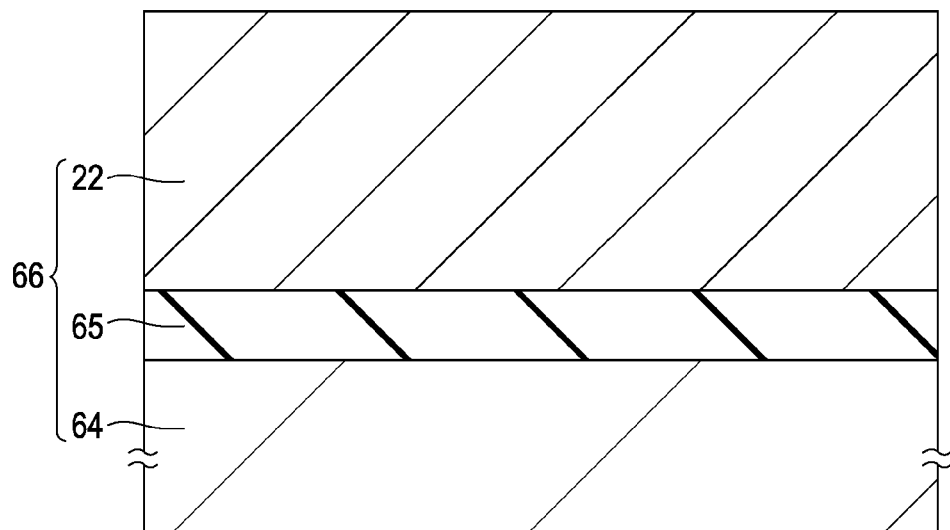
FIG. 6 is a diagram illustrating a process of manufacturing the solid-state imaging device according to the first embodiment.

First, as shown in FIG. 6, there is prepared a so-called SOI substrate 66 in which a silicon layer 22 is formed on a silicon base substrate 64 with a silicon oxide layer 65 interposed therebetween. The silicon layer 22 corresponds to the above-described semiconductor substrate 22. The silicon layer 22 is formed on an n-type silicon layer.

Figure 7:
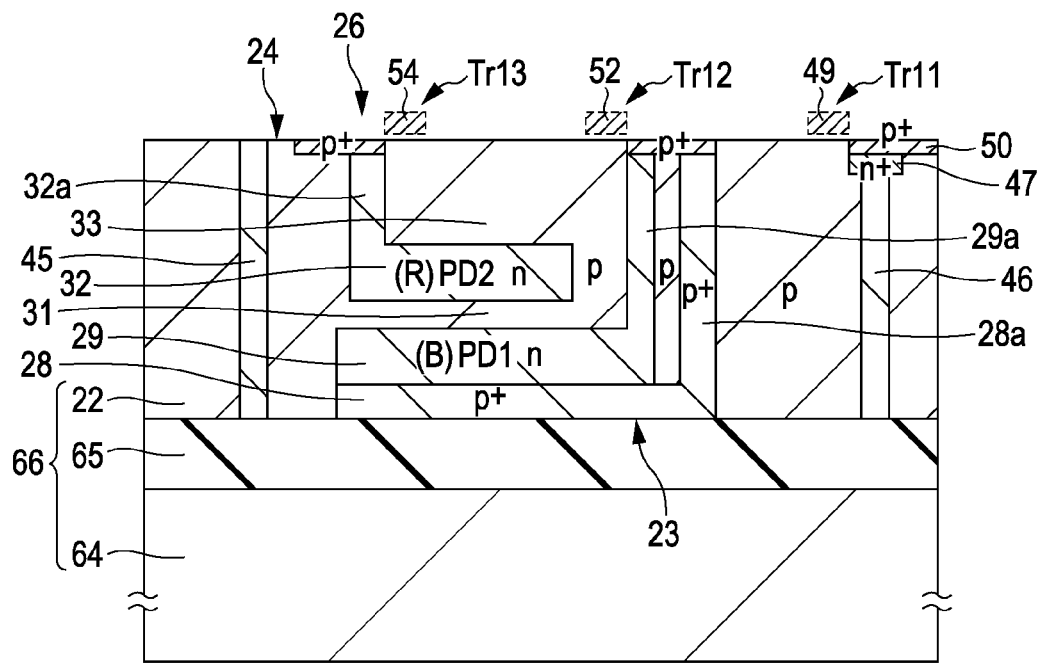
FIG. 7 is a diagram illustrating a process of manufacturing the solid-state imaging device according to the first embodiment.

Subsequently, as shown in FIG. 7, a pair of conductive plugs 45 and 46 formed through the silicon layer 22 is formed in the silicon layer 22 corresponding to one pixel. The conductive plugs 45 and 46 may be formed by a conductive impurity semiconductor layer formed by ion-implanting, for example, or a through via structure in which an insulating layer $SiO_2$ or SiN, a barrier metal TiN, and tungsten (W) are buried.

Subsequently, the first photodiode PD1 for a second color and the second photodiode PD2 for a third color are laminated at positions of different depths in the silicon layer 22. In this embodiment, the first photodiode PD1 is formed as a photodiode absorbing blue-wavelength light. The second photodiode PD2 is formed as a photodiode absorbing red-wavelength light.

Although not shown, the plural pixel transistors including the transmission transistors Tr11 to Tr13 are formed and the peripheral circuit such as a logic circuit is formed in the peripheral circuit section. The first photodiode PD1 is formed on the side of the rear surface 23 of the silicon layer 22 by ion-implanting the p-type semiconductor region 34 serving as the hole accumulation layer and the n-type semiconductor region 29 serving as the charge accumulation layer so as to have a pn junction. The p-type semiconductor region 28 and the n-type semiconductor region 29 are formed so as to have the extension portion 28a and 29a extending from one ends of the p-type semiconductor region 28 and the n-type semiconductor region 29 to the front surface 24, respectively. The second photodiode PD2 is formed on the side of the front surface 24 of the silicon layer 22 by ion-implanting the n-type semiconductor region 32 serving as the charge accumulation layer so as to have a pn junction. The second photodiode PD2 is formed by the n-type semiconductor region 32 and the semiconductor region 31 of the lower layer. The n-type semiconductor region 32 is formed so as to have the extension portion 32a extending from one end of the n-type semiconductor region 32 to the front surface 24.

The transmission transistor Tr11 is formed so as to have the n-type semiconductor region 48 serving as the floating diffusion unit (FD) and the transmission gate electrode 49 with the gate insulating layer interposed therebetween (see FIG. 4). The transmission transistor Tr12 is formed so as to have the n-type semiconductor region 51 serving as the floating diffusion unit (FD) and the transmission gate electrode 52 with the gate insulating layer interposed therebetween (see FIG. 3). The transmission transistor Tr13 is formed so as to have the n-type semiconductor region 53 serving as the floating diffusion unit (FD) and the transmission gate electrode 54 with the gate insulating layer interposed therebetween (see FIG. 3).

The n-type semiconductor region 47 serving as the charge accumulation layer is formed on the side of the front surface 24 of the silicon layer 22 so as to be connected to the conductive plug 46 (see FIG. 4). In this case, the conductive plug 46 is formed so as to reach to the n-type semiconductor region 47 and so as not to completely penetrate the silicon layer 22. The n-type semiconductor regions 47, 48, 51, and 53 may be formed simultaneously by the same ion-implanting process. Moreover, the p-type semiconductor region 50 serving as the hole accumulation layer is formed (see FIGS. 3 and 4).

Figure 8:
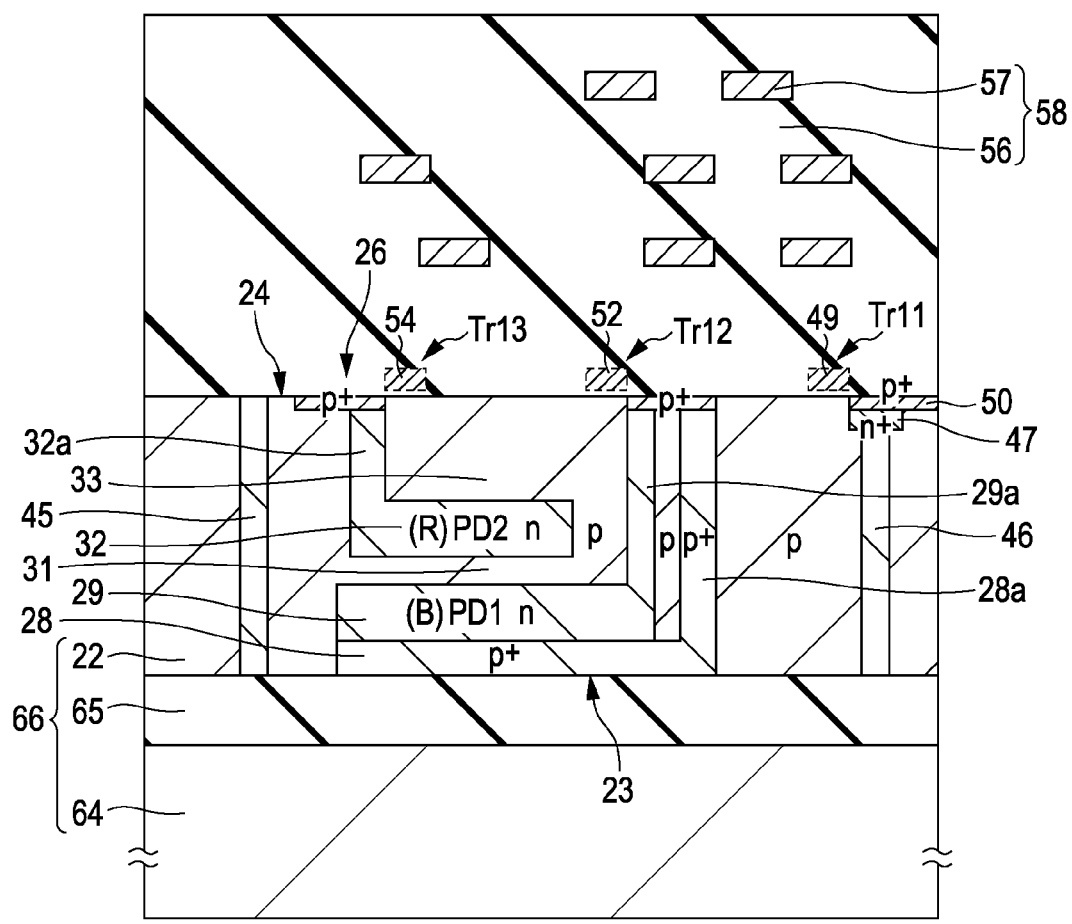
FIG. 8 is a diagram illustrating a process of manufacturing the solid-state imaging device according to the first embodiment.

Subsequently, as shown in FIG. 8, the multi-layer wiring layer 58 including the wirings 57 of plural layers is formed on the front surface 24 of the silicon layer 22 with the inter-layer insulating layer 56 interposed therebetween.

In this embodiment, the photodiodes absorbing blue and red-wavelength light are used as the first photodiode PD1 and the second photodiode PD2. However, the color the configuration is not limited to the blue and red colors.

Figure 9:
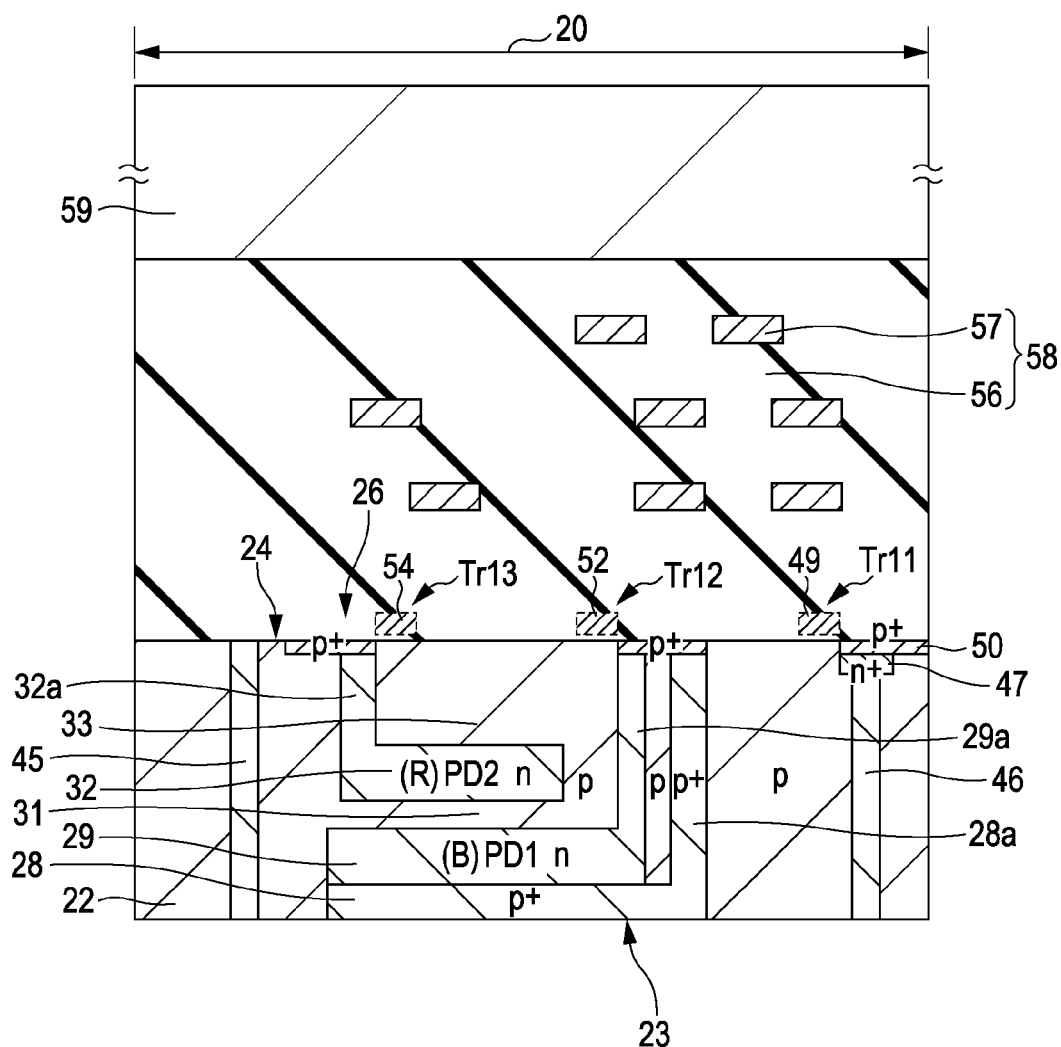
FIG. 9 is a diagram illustrating a process of manufacturing the solid-state imaging device according to the first embodiment.

Subsequently, as shown in FIG. 9, the supporting substrate 59 is attached to the multi-layer wiring layer 58. For example, a silicon substrate may be used as the supporting substrate 59.

Figure 10:
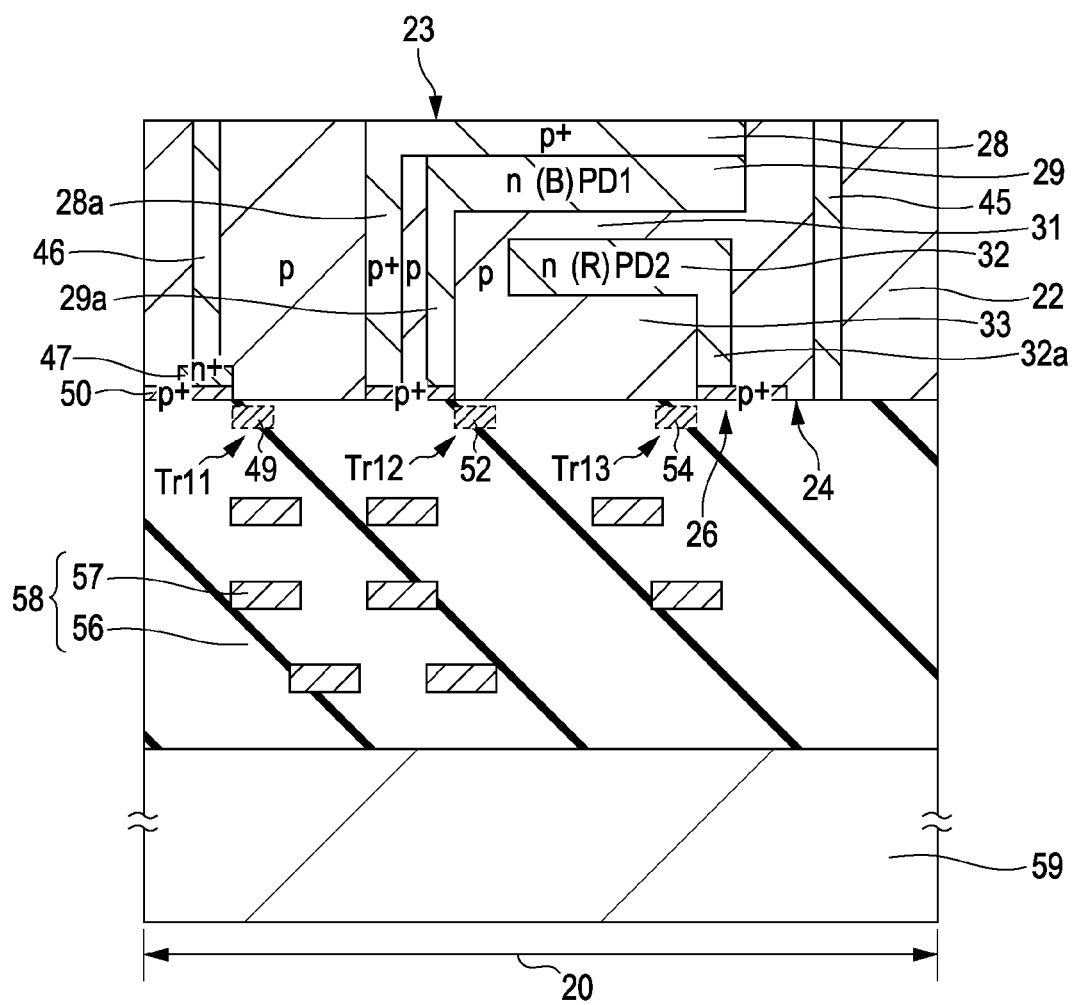
FIG. 10 is a diagram illustrating a process of manufacturing the solid-state imaging device according to the first embodiment.

Subsequently, as shown in FIG. 10, the silicon base substrate 64 and the silicon oxide layer 65 of the initial SOI substrate 66 are removed to expose the rear surface 23 of the thin silicon layer 22.

Figure 11:
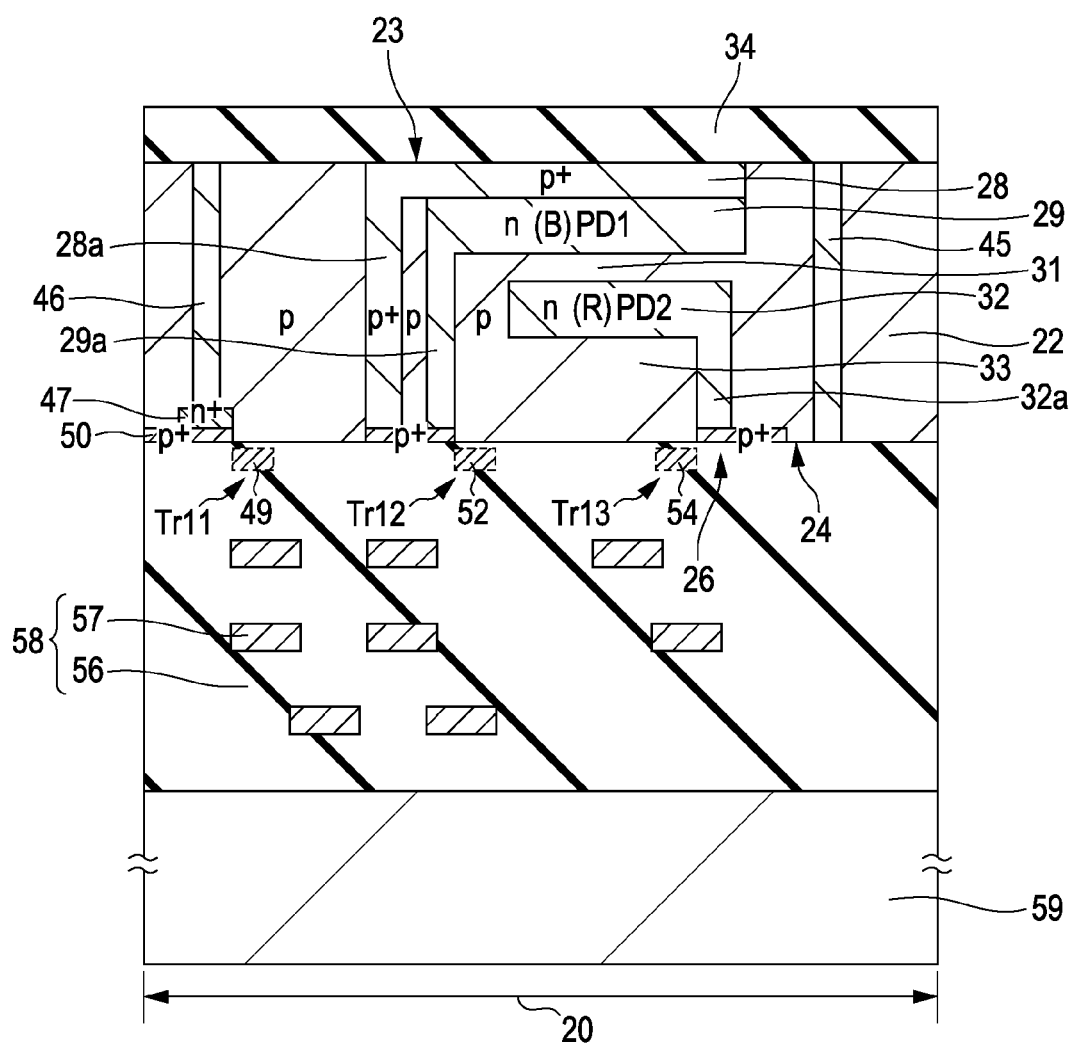
FIG. 11 is a diagram illustrating a process of manufacturing the solid-state imaging device according to the first embodiment.

Subsequently, as shown in FIG. 11, the insulating layer 34 is formed on the rear surface 23 of the silicon layer 22. It is desirable that the interface state of the insulating layer 34 is low to suppress the dark current from occurring from the interface between the silicon layer 22 and the insulating layer 34 by reducing the interface state with the silicon layer 22. As the insulating layer 34, there may be used the layer having the lamination structure in which the hafnium oxide ($HfO_2$) layer formed by ALD (Atomic layer deposition), for example, and the silicon oxide ($SiO_2$) layer formed by plasma CVD (Chemical Vapor Deposition) are laminated, as described in FIG. 2.

Figure 12:
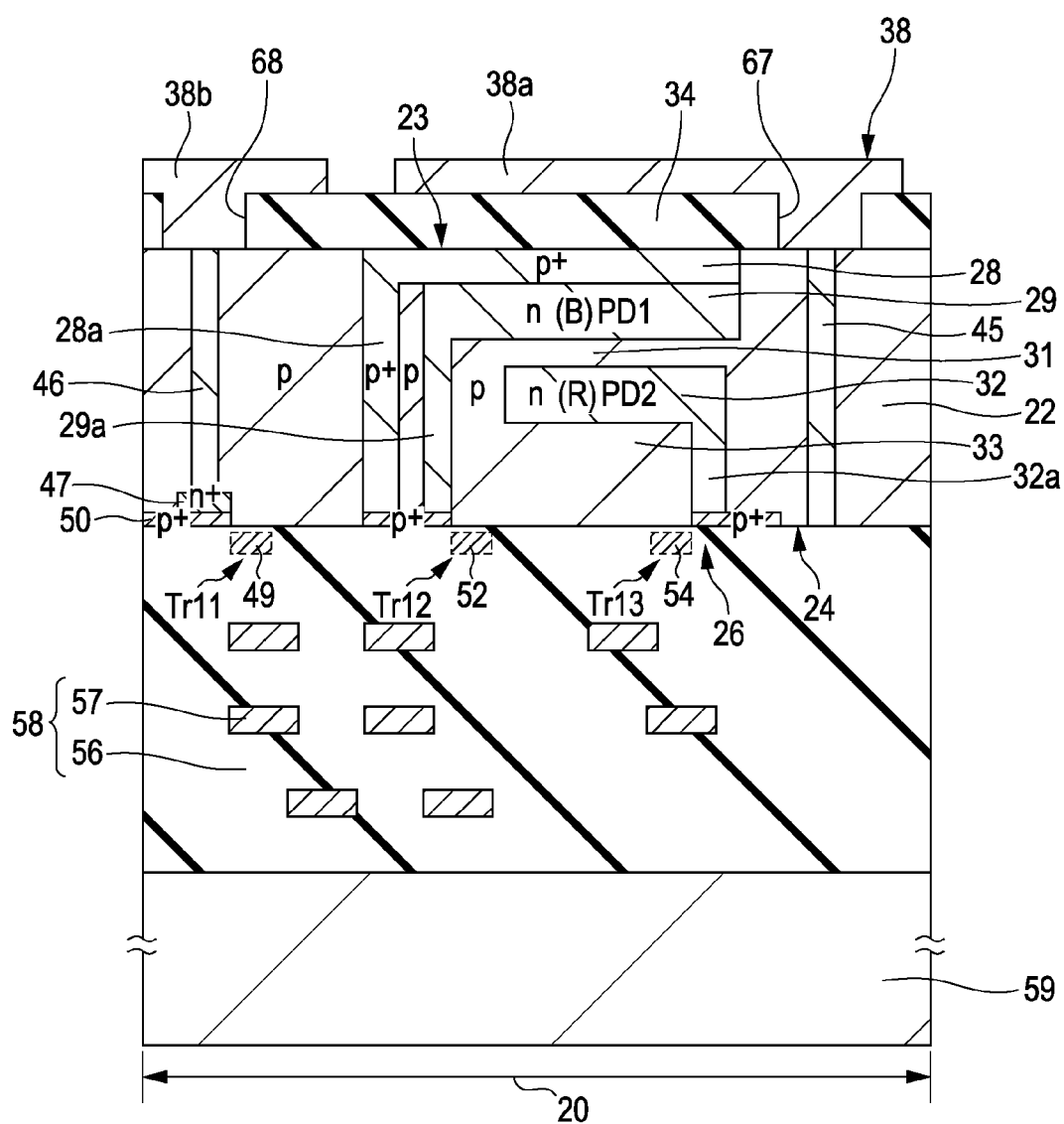
FIG. 12 is a diagram illustrating a process of manufacturing the solid-state imaging device according to the first embodiment.

Subsequently, as shown in FIG. 12, contact holes 67 and 68 are formed in the insulating layer 34 so as to face the conductive plugs 45 and 46, respectively. Subsequently, the lower electrode 38 is formed on the insulating layer 34 so as to be connected to the conductive plugs 45 and 46 facing the contact holes 67 and 68, respectively. The lower electrode 38 is formed of a transparent conductive layer such as ITO, since light has to pass through the lower electrode 38. Subsequently, the lower electrode 38 is selectively etched to be separated in each pixel and to be halved in one pixel. That is, the lower electrode 38 is separated into the lower electrode 38a and the lower electrode 38b. When the electrode from which the signal charges are obtained is separated in each pixel, the electrode from which the charges with no signal are obtained may be connected to the entire pixel region. The lower electrode 38a to which the conductive plug 45 is connected is formed broadly so as to face the photodiodes PD1 and PD2 of the lower layer. The ITO layer may be patterned by dry etching or wet etching. In the dry etching, a mixture etching gas of, for example, $Cl_2$, $BCl_3$, and Ar may be used. In the wet etching, an etchant such as a phosphoric acid solution or a mixture solution of oxalic acid and phosphoric acid may be used.

Figure 13:
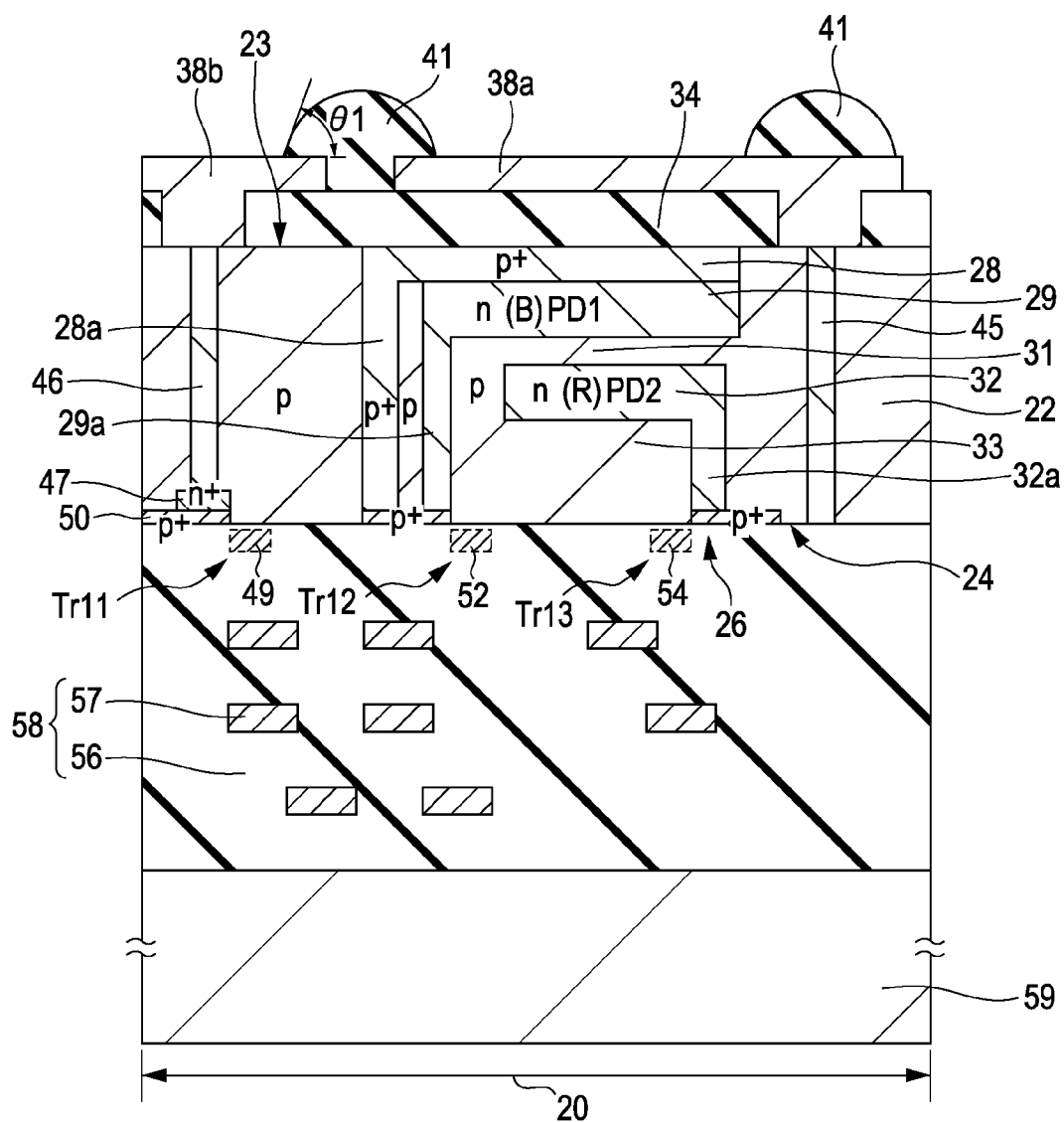
FIG. 13 is a diagram illustrating a process of manufacturing the solid-state imaging device according to the first embodiment.

Subsequently, as shown in FIG. 13, the insulating layer 41 is formed to reduce the step difference between the lower electrodes 38a and 38b. A taper angle θ1 of the bottom of the insulating layer 41 is preferably 30° or less. Specifically, the desired taper angle can be obtained by forming the taper angle with a photosensitive insulating layer or subjecting a silicon oxide ($SiO_2$) layer formed by CVD to etch back using a tapered resist mask.

Figure 14:
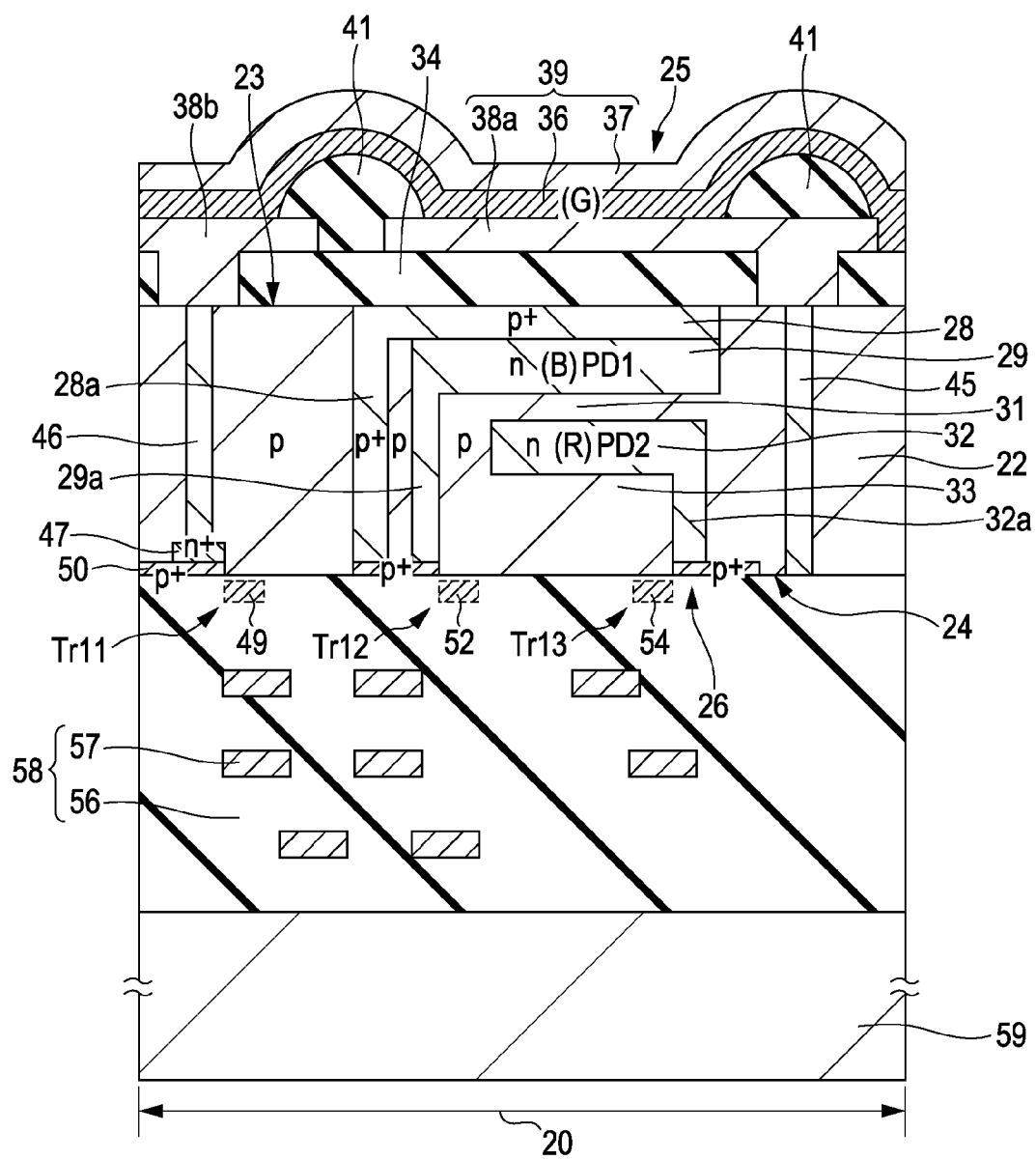
FIG. 14 is a diagram illustrating a process of manufacturing the solid-state imaging device according to the first embodiment.

Subsequently, as shown in FIG. 14, the organic photoelectric conversion layer 36 is formed on the entire surface including the insulating layer 34. The upper electrode 37 is formed on the organic photoelectric conversion layer 36. In this embodiment, the organic photoelectric conversion layer 36 is formed to execute photoelectric conversion on green-wavelength light. The above-described quinacridone layer, for example, may be used as the organic layer executing the photoelectric conversion on green-wavelength light. The quinacridone layer may be formed by vacuum deposition. It is necessary to make the upper electrode 37 transparent. Therefore, an ITO layer formed by a sputter method, for example, may be used as the upper electrode 37.

Figure 15:
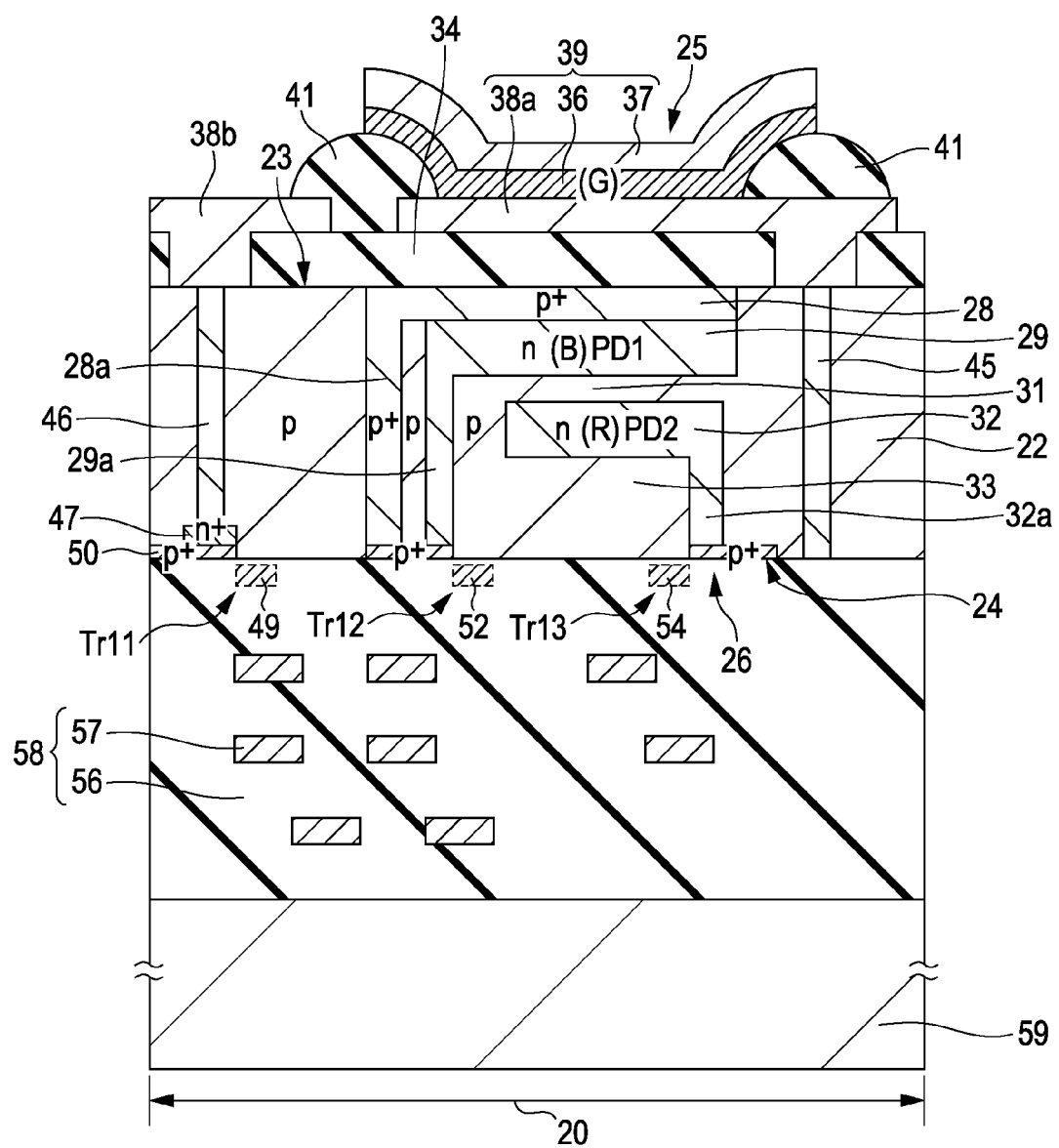
FIG. 15 is a diagram illustrating a process of manufacturing the solid-state imaging device according to the first embodiment.

Subsequently, as shown in FIG. 15, the upper electrode 37 and the organic photoelectric conversion layer 36 are patterned so that the lamination layer of the upper electrode 37 and the organic photoelectric conversion layer 36 remain in each pixel. By this patterning, the conductive plug 46 is connected to the upper electrode 37 so as to supply a necessary potential to the upper electrode 37. The patterning is performed by dry etching so as to be terminated on the insulating layer 41.

Figure 16:
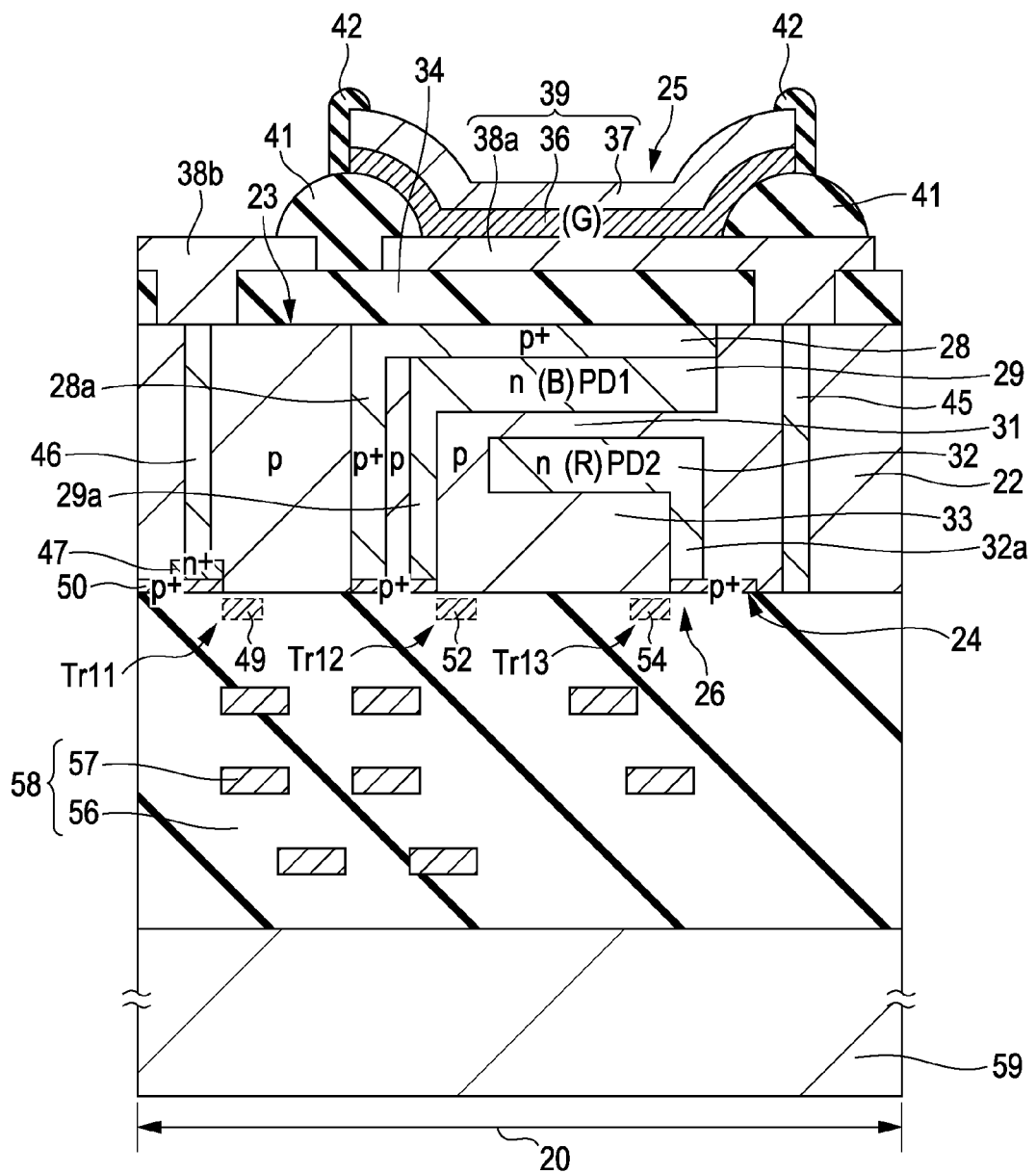
FIG. 16 is a diagram illustrating a process of manufacturing the solid-state imaging device according to the first embodiment.

Subsequently, as shown in FIG. 16, in order to protect the sidewall surface of the organic photoelectric conversion layer 36 removed by the etching, the protective insulating layer 42 is formed so as to cover the sidewall surfaces of the organic photoelectric conversion layer 36 and the upper electrode 37.

Figure 17:
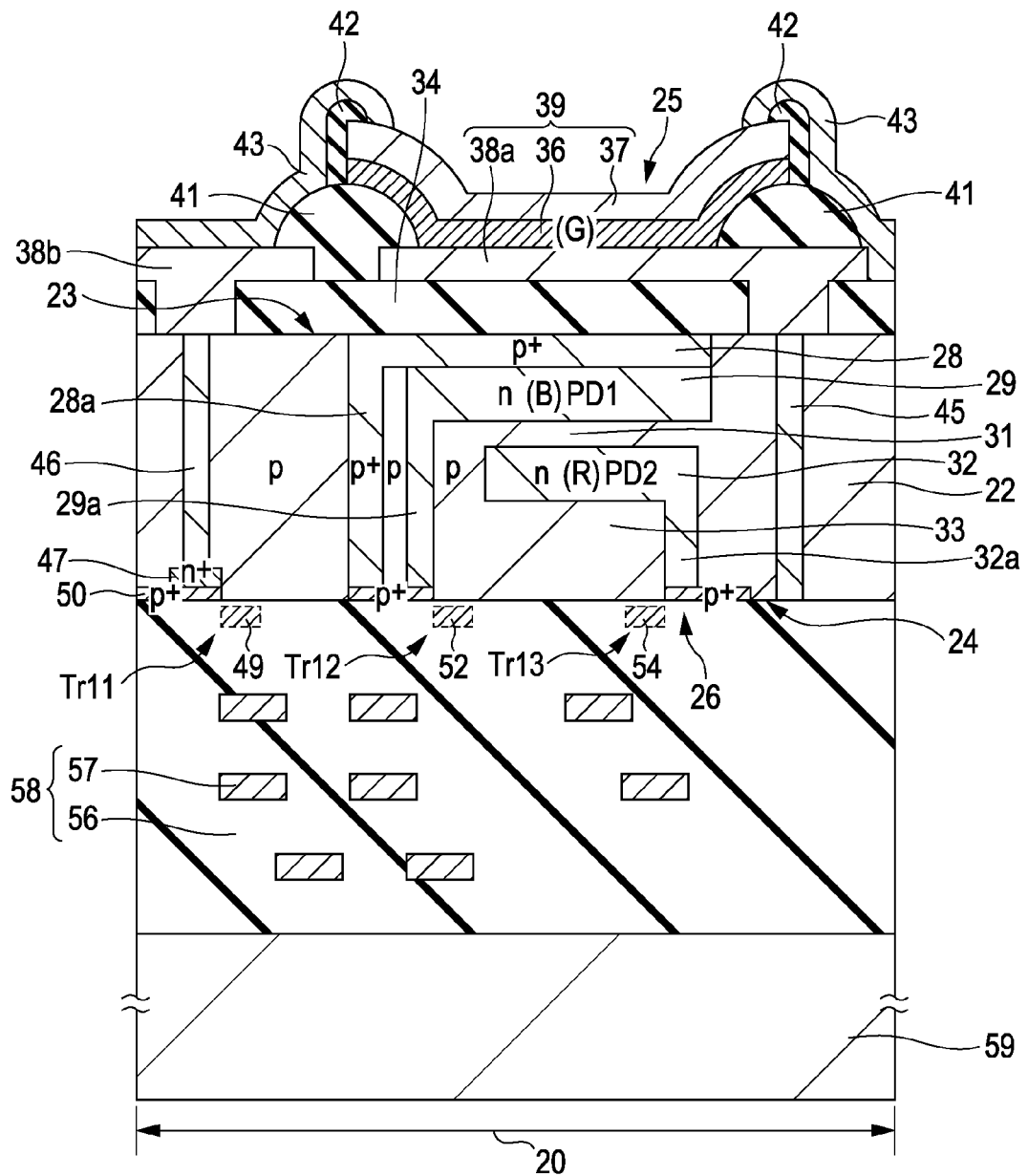
FIG. 17 is a diagram illustrating a process of manufacturing the solid-state imaging device according to the first embodiment.

Subsequently, as shown in FIG. 17, the contact metal layer 43 connecting the upper electrode 37 to the lower electrode 38b connected to the conductive plug 46 is formed so as to cover the protective insulating layer 42. The respective different potentials may be supplied to the upper electrode 37 and the lower electrode 38a via the conductive plugs 45 and 46, respectively.

Subsequently, the on-chip lens 62 is formed on the surface including the organic photoelectric conversion unit 39 with the planarization layer 61 interposed therebetween to obtain the desired solid-state imaging device 21 shown in FIG. 1.

According to the method of manufacturing the solid-state imaging device of this embodiment, it is possible to manufacture the back-illuminated solid-state imaging device in which the laminated organic photoelectric conversion unit 39 for one color is close to the photodiodes PD1 and PD2 for two colors. That is, the organic photoelectric conversion unit 39 can be formed on the upper layer of the photodiodes PD1 and PD2 without interposing the multi-layer wiring layer 58. Accordingly, it is possible to suppress the dependence on the red, green, and blue F numbers. It is possible to manufacture the solid-state imaging device capable of suppressing the variation in the sensitivity between the colors without the variation in the spectral balance of each color even when the F numbers are changed.

3. Second Embodiment

Exemplary Configuration of Solid-State Imaging Device

Figure 18:
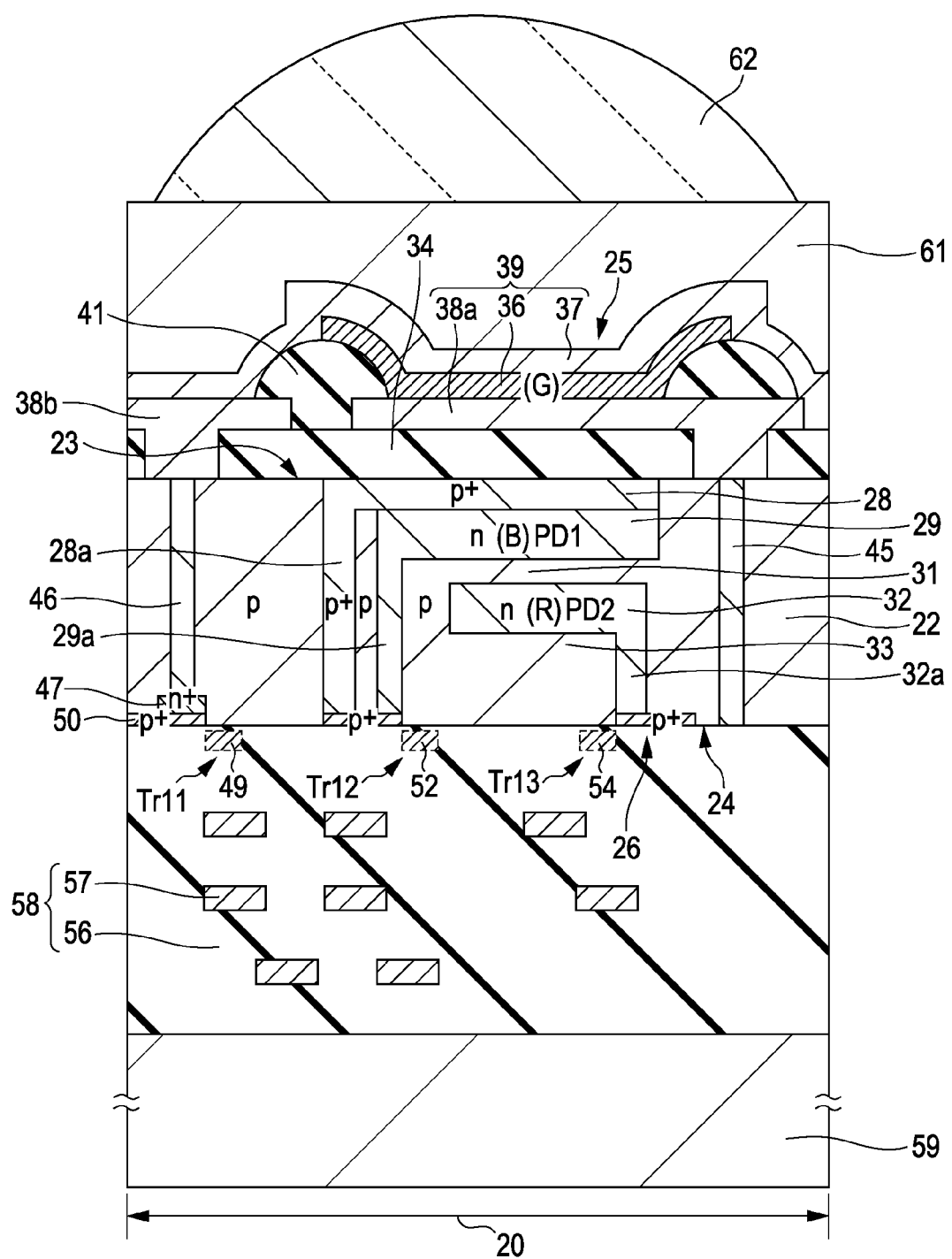
FIG. 18 is a diagram illustrating the configuration of major units of a solid-state imaging device according to a second embodiment of the invention.

In FIG. 18, a solid-state imaging device according to a second embodiment of the invention is shown. The solid-state imaging device according to this embodiment is a CMOS solid-state imaging device. FIG. 18 is a sectional view illustrating one pixel 20 in the pixel section of the CMOS solid-state imaging device.

A solid-state imaging device 71 according to the second embodiment is a modified example of the first embodiment. In the solid-state imaging device, the insulating layer 42 protecting the sidewall of the organic photoelectric conversion layer 36 is omitted. The upper electrode 37 of the organic photoelectric conversion unit 39 extends to be directly connected to the other lower electrode 38b. The other configuration is the same as that described in the first embodiment. The same reference numerals are given to the units corresponding to those in FIG. 1, and the repeated description is omitted.

The operation (driving method) of the solid-state imaging device 71 according to the second embodiment is the same as that of the first embodiment.

In the solid-state imaging device 71 according to the second embodiment, as in the above-described first embodiment, the organic photoelectric conversion unit 39 is close to the two photodiodes PD1 and PD2. Therefore, the dependence on the F numbers of the colors is suppressed. Even when the F numbers are changed, it is possible to suppress the variation in the sensitivity between the colors without the variation in the spectral balance of each color. Moreover, since the negative voltage is applied to the lower electrode 38a at the time of accumulating the charges, the interface with the silicon insulating layer 34 becomes the hole accumulation state. When the insulating layer 34 has the negative fixed charges, the hole accumulation state is further enhanced and thus it is possible to suppress the dark current. The same advantages as those of the first embodiment are obtained.

Since the protective insulating layer 42 formed in the first embodiment is omitted and the upper electrode 37 is directly connected to the other lower electrode 38b, the manufacturing process can be simplified.

Exemplary Method of Manufacturing Solid-State Imaging Device

FIGS. 19 to 29 are diagrams illustrating a method of manufacturing the solid-state imaging device 71 according to the second embodiment. In the drawings, only the major units corresponding to one pixel are shown. Processes shown in FIGS. 19 to 26 are the same as the processes of the first embodiment shown in FIGS. 6 to 13.

Figure 19:
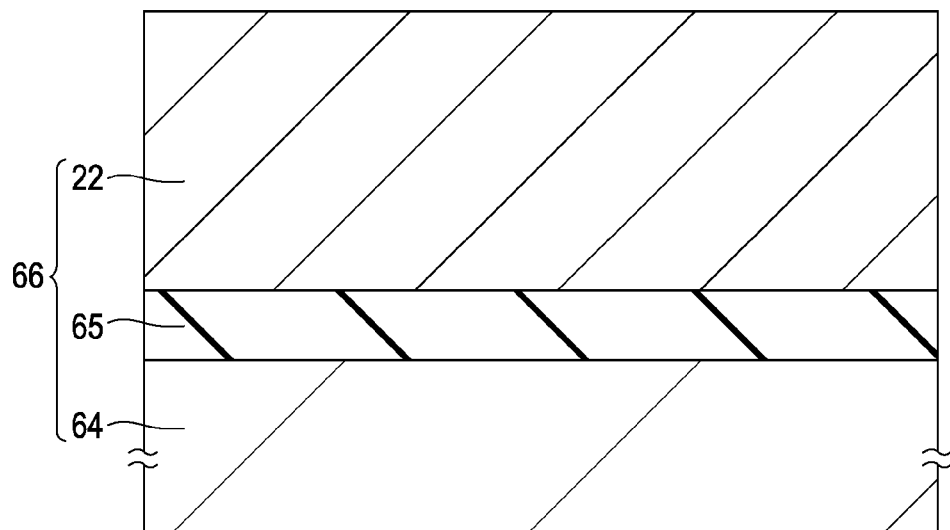
FIG. 19 is a diagram illustrating a process of manufacturing the solid-state imaging device according to the second embodiment.

First, as shown in FIG. 19, there is prepared a so-called SOI substrate 66 in which a silicon layer 22 is formed on a silicon base substrate 64 with a silicon oxide layer 65 interposed therebetween. The silicon layer 22 corresponds to the above-described semiconductor substrate 22. The silicon layer 22 is formed on an n-type silicon layer.

Figure 20:
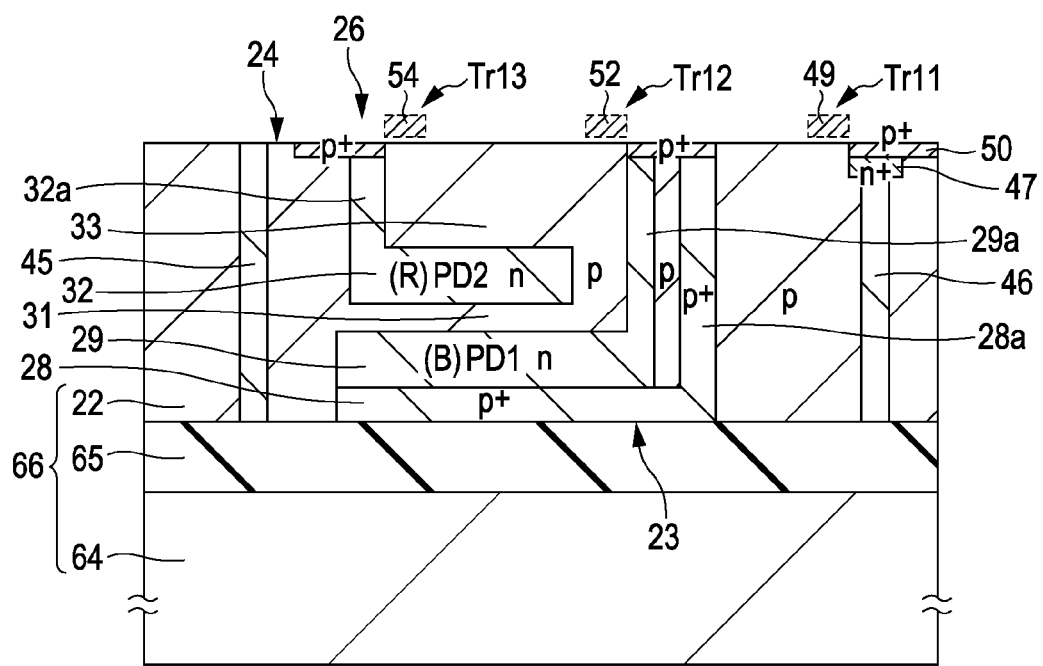
FIG. 20 is a diagram illustrating a process of manufacturing the solid-state imaging device according to the second embodiment.

Subsequently, as shown in FIG. 20, a pair of conductive plugs 45 and 46 formed through the silicon layer 22 are formed in the silicon layer 22 corresponding to one pixel. The conductive plugs 45 and 46 may be formed by a conductive impurity semiconductor layer formed by ion-implanting or a through via structure in which an insulating layer $SiO_2$ or SiN, a barrier metal TiN, and tungsten (W) are buried.

Subsequently, the first photodiode PD1 for a second color and the second photodiode PD2 for a third color are laminated at positions of different depths in the silicon layer 22. In this embodiment, the first photodiode PD1 is formed as a photodiode absorbing blue-wavelength light. The second photodiode PD2 is formed as a photodiode absorbing red-wavelength light.

The plural pixel transistors including the transmission transistors Tr11 to Tr13 are formed and, although not shown, the peripheral circuit such as a logic circuit is formed in the peripheral circuit section. The first photodiode PD1 is formed on the side of the rear surface 23 of the silicon layer 22 by ion-implanting the p-type semiconductor region 34 serving as the hole accumulation layer and the n-type semiconductor region 29 serving as the charge accumulation layer so as to have a pn junction. The p-type semiconductor region 28 and the n-type semiconductor region 29 are formed so as to have the extension portion 28a and 29a extending from one ends of the p-type semiconductor region 28 and the n-type semiconductor region 29 to the front surface 24, respectively. The second photodiode PD2 is formed on the side of the front surface 24 of the silicon layer 22 by ion-implanting the n-type semiconductor region 32 serving as the charge accumulation layer so as to have a pn junction. The second photodiode PD2 is formed by the n-type semiconductor region 32 and the semiconductor region 31 of the lower layer. The n-type semiconductor region 32 is formed so as to have the extension portion 32a extending from one end of the n-type semiconductor region 32 to the front surface 24.

The transmission transistor Tr11 is formed so as to have the n-type semiconductor region 48 serving as the floating diffusion unit (FD) and the transmission gate electrode 49 with the gate insulating layer interposed therebetween. The transmission transistor Tr12 is formed so as to have the n-type semiconductor region 51 serving as the floating diffusion unit (FD) and the transmission gate electrode 52 with the gate insulating layer interposed therebetween. The transmission transistor Tr13 is formed so as to have the n-type semiconductor region 53 serving as the floating diffusion unit (FD) and the transmission gate electrode 54 with the gate insulating layer interposed therebetween.

The n-type semiconductor region 47 serving as the charge accumulation layer is formed on the side of the front surface 24 of the silicon layer 22 so as to be connected to the conductive plug 46. In this case, the conductive plug 46 is formed so as to reach to the n-type semiconductor region 47 and so as not to completely penetrate the silicon layer 22. The n-type semiconductor regions 47, 48, 51, and 53 may be formed simultaneously by the same ion-implanting process.

Figure 21:
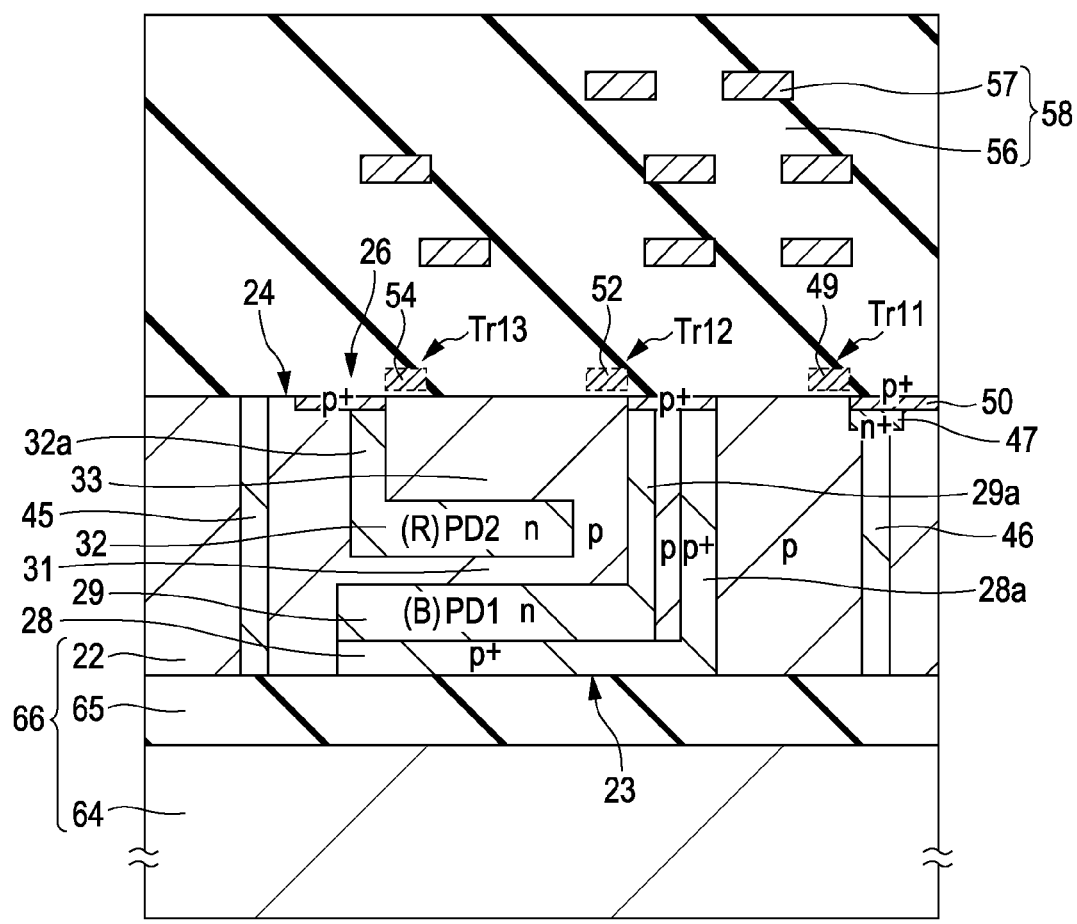
FIG. 21 is a diagram illustrating a process of manufacturing the solid-state imaging device according to the second embodiment.

Subsequently, as shown in FIG. 21, the multi-layer wiring layer 58, in which the wirings 57 of plural layers are disposed with the inter-layer insulating layer 56 interposed therebetween, is formed on the front surface 24 of the silicon layer 22.

In this embodiment, the photodiodes absorbing blue and red-wavelength light are used as the first photodiode PD1 and the second photodiode PD2. However, the color the configuration is not limited to the blue and red colors.

Figure 22:
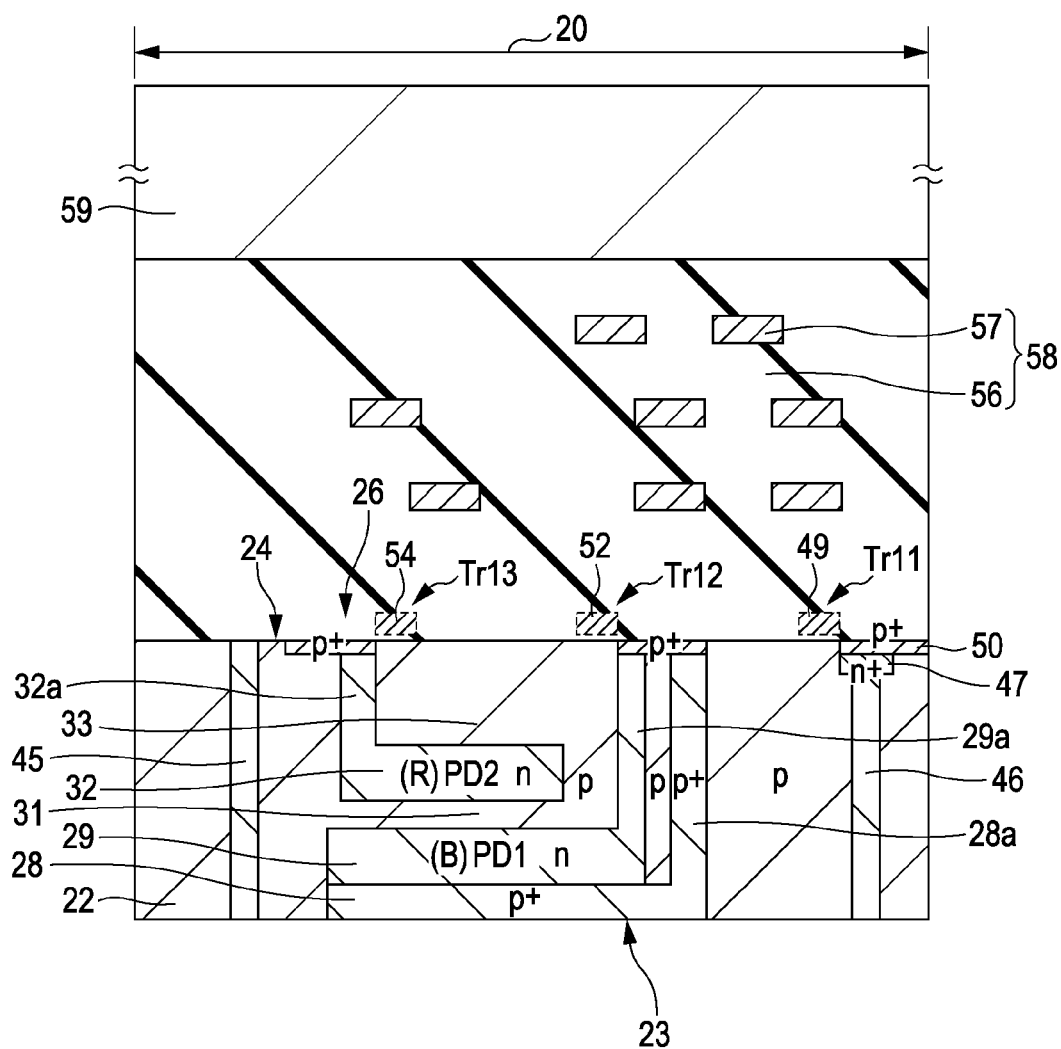
FIG. 22 is a diagram illustrating a process of manufacturing the solid-state imaging device according to the second embodiment.

Subsequently, as shown in FIG. 22, the supporting substrate 59 is attached to the multi-layer wiring layer 58. For example, a silicon substrate may be used as the supporting substrate 59.

Figure 23:
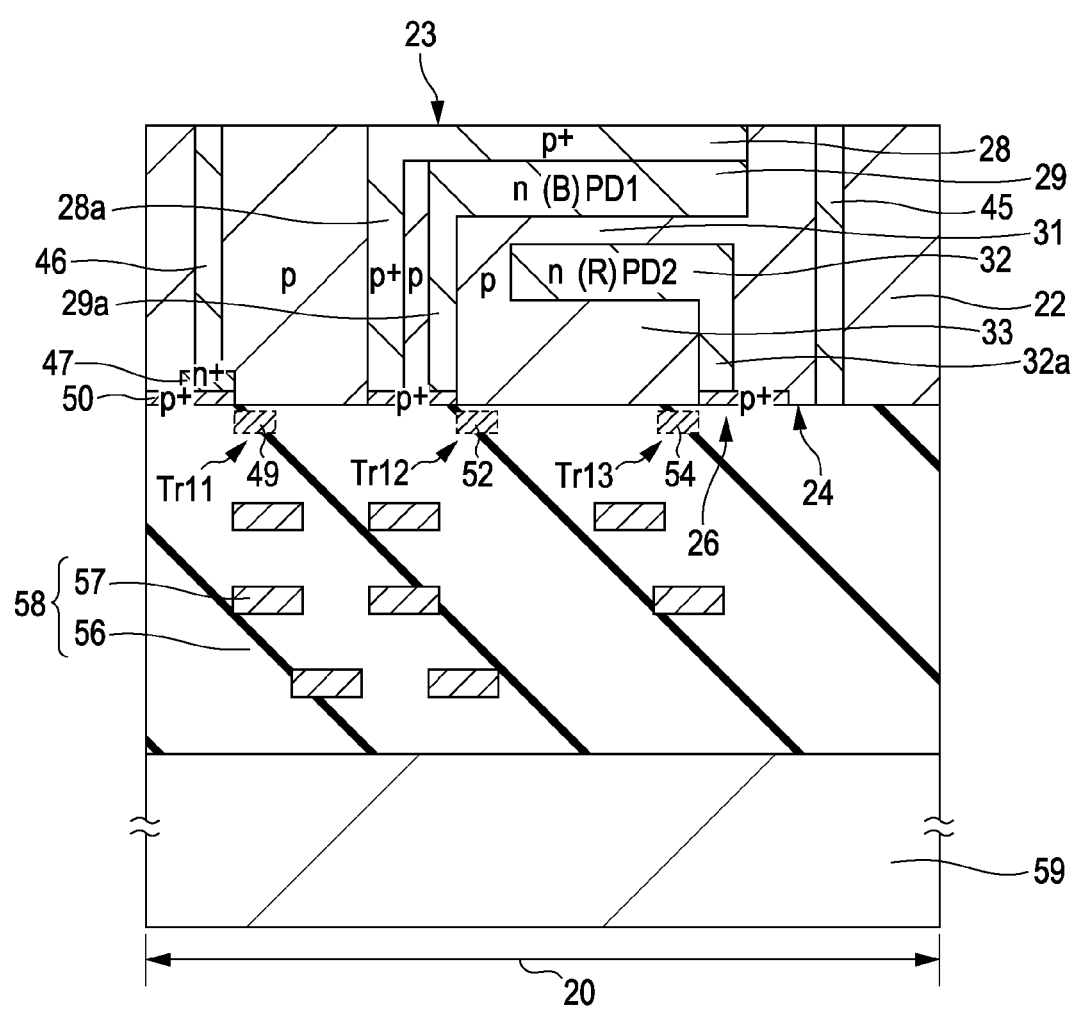
FIG. 23 is a diagram illustrating a process of manufacturing the solid-state imaging device according to the second embodiment.

Subsequently, as shown in FIG. 23, the silicon base substrate 64 and the silicon oxide layer 65 of the initial SOI substrate 66 are removed to expose the rear surface 23 of the thin silicon layer 22.

Figure 24:
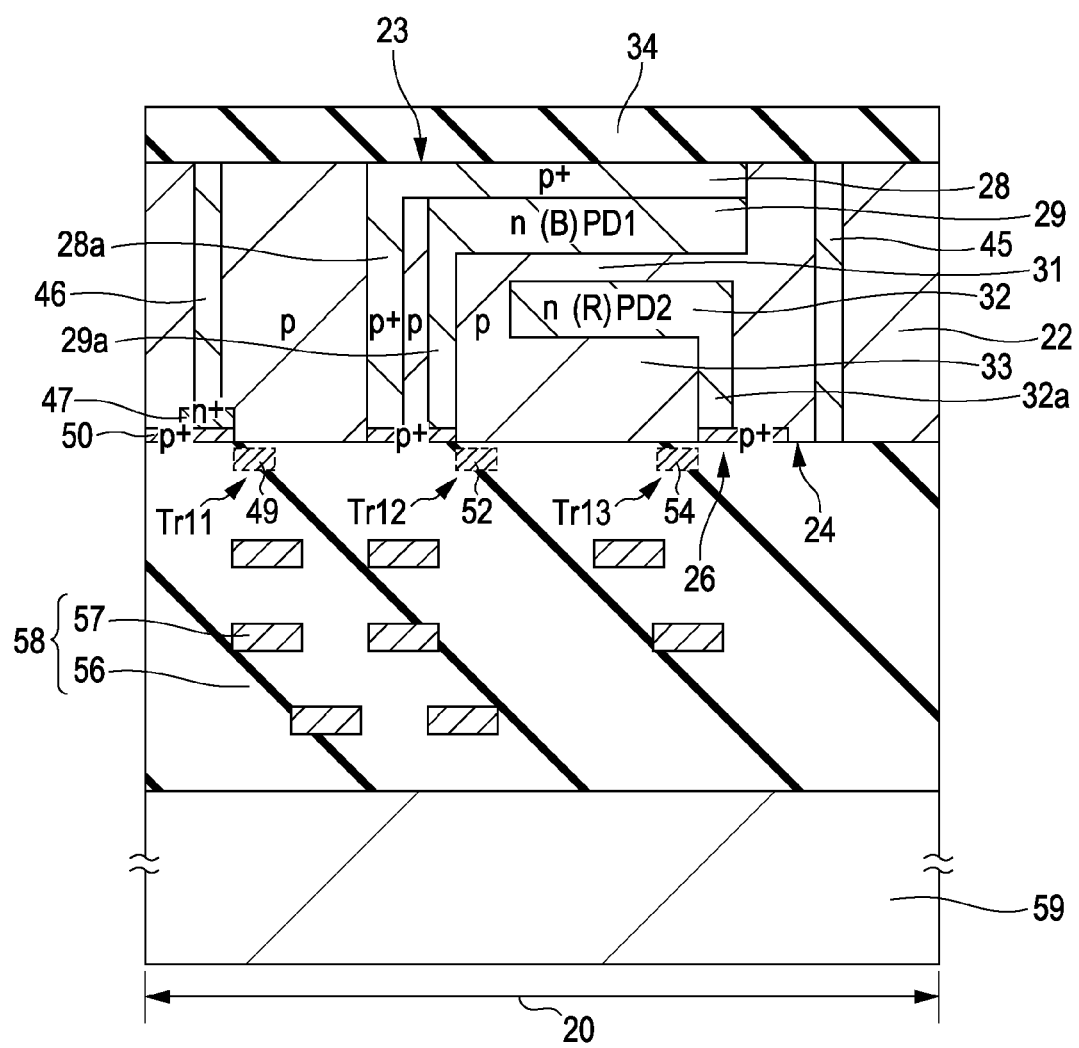
FIG. 24 is a diagram illustrating a process of manufacturing the solid-state imaging device according to the second embodiment.

Subsequently, as shown in FIG. 24, the insulating layer 34 is formed on the rear surface 23 of the silicon layer 22. It is desirable that the interface state of the insulating layer 34 is low to suppress the dark current from occurring from the interface between the silicon layer 22 and the insulating layer 34 by reducing the interface state with the silicon layer 22. As the insulating layer 34, there may be used the layer having the lamination structure in which the hafnium oxide ($HfO_2$) layer formed by ALD (Atomic layer deposition), for example, and the silicon oxide ($SiO_2$) layer formed by plasma CVD (Chemical Vapor Deposition) are laminated, as described in FIG. 2.

Figure 25:
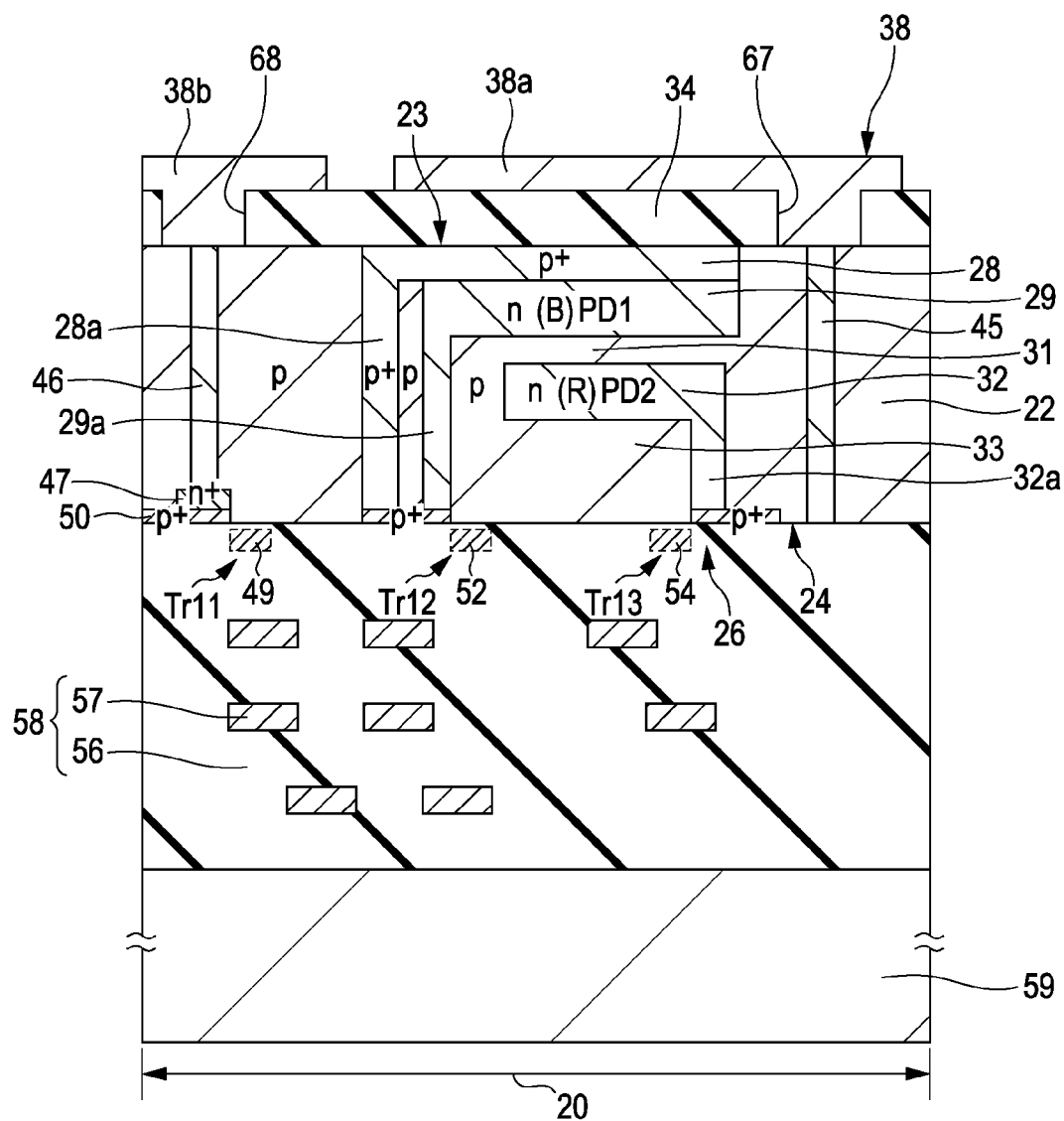
FIG. 25 is a diagram illustrating a process of manufacturing the solid-state imaging device according to the second embodiment.

Subsequently, as shown in FIG. 25, the contact holes 67 and 68 are formed in the insulating layer 34 so as to face the conductive plugs 45 and 46, respectively. Subsequently, the lower electrode 38 is formed on the insulating layer 34 so as to be connected to the conductive plugs 45 and 46 facing the contact holes 67 and 68, respectively. The lower electrode 38 is formed of a transparent conductive layer such as ITO, since light has to pass through the lower electrode 38. Subsequently, the lower electrode 38 is selectively etched to be separated in each pixel and to be halved in one pixel. That is, the lower electrode 38 is separated into the lower electrode 38a and the lower electrode 38b. The lower electrode 38a to which the conductive plug 45 is connected is formed broadly so as to face the photodiodes PD1 and PD2 of the lower layer.

Figure 26:
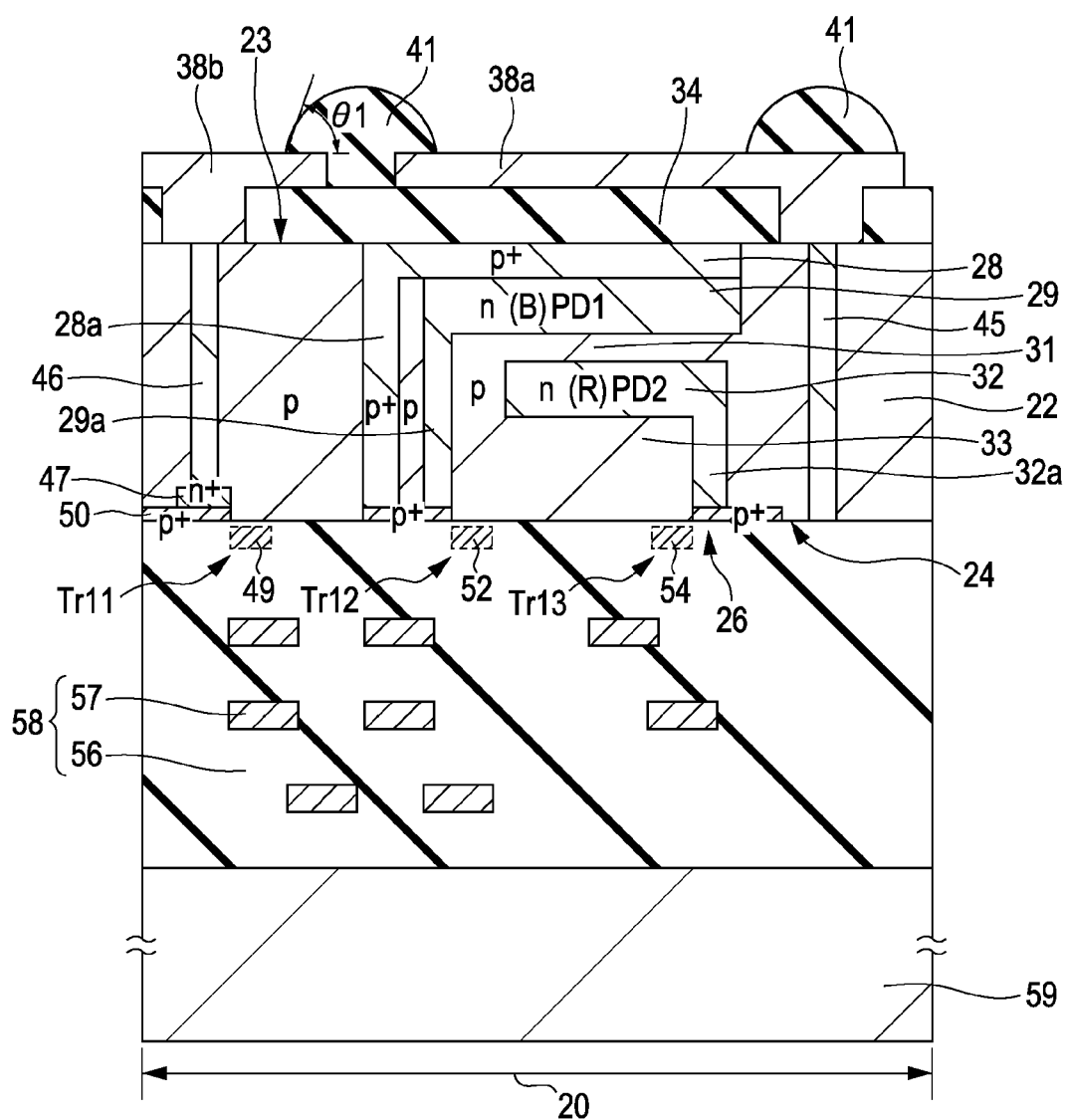
FIG. 26 is a diagram illustrating a process of manufacturing the solid-state imaging device according to the second embodiment.

Subsequently, as shown in FIG. 26, the insulating layer 41 is formed to reduce the step difference between the lower electrodes 38a and 38b. A taper angle θ1 of the bottom of the insulating layer 41 is preferably 30° or less. Specifically, the desired taper angle can be obtained by forming the taper angle with a photosensitive insulating layer or subjecting a silicon oxide ($SiO_2$) layer formed by CVD to etch back using a tapered resist mask.

Figure 27:
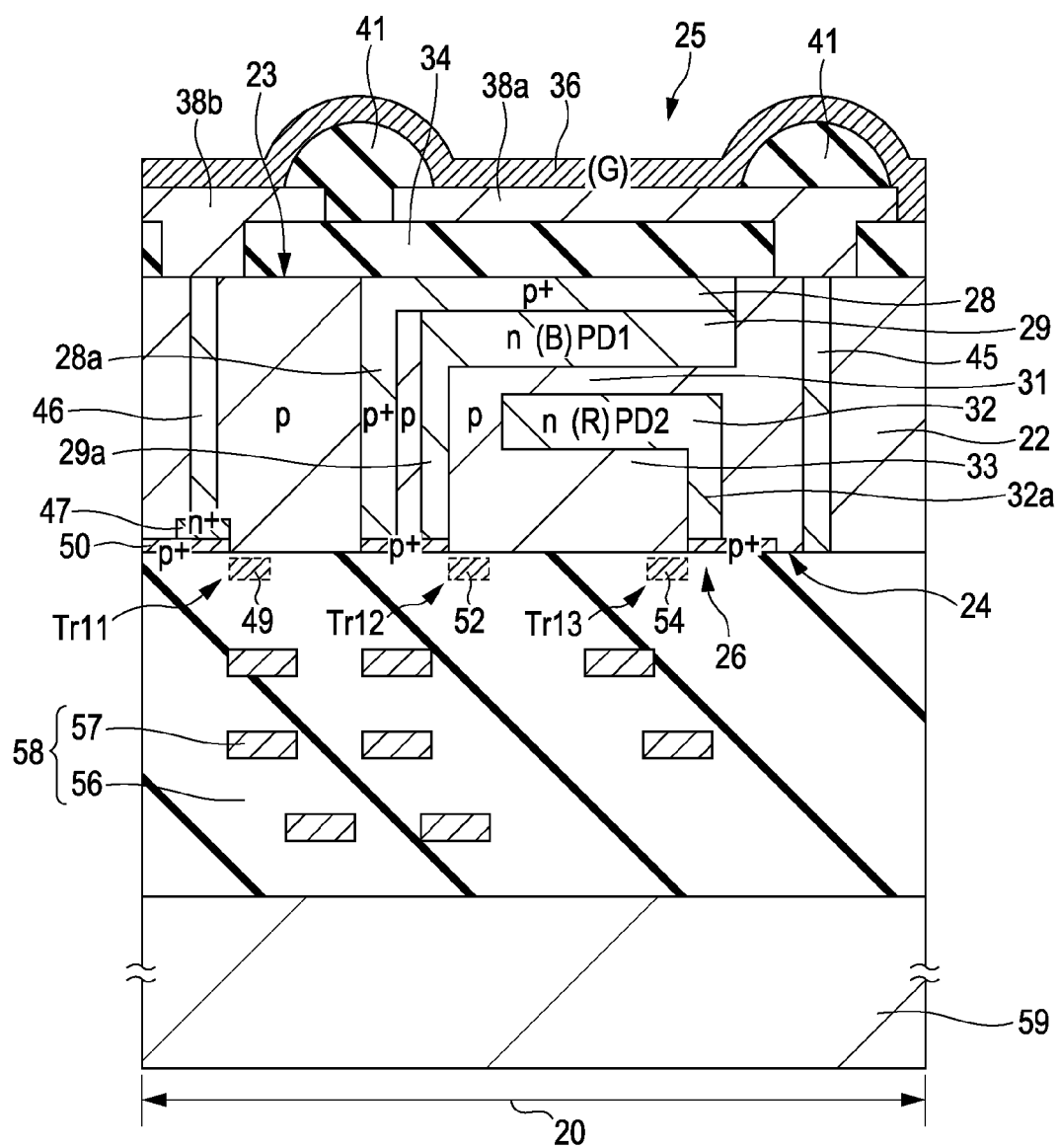
FIG. 27 is a diagram illustrating a process of manufacturing the solid-state imaging device according to the second embodiment.

The above-described manufacturing method is the same as the manufacturing method of the first embodiment. In this embodiment, as shown in FIG. 27, the organic photoelectric conversion layer 36 is formed on the entire surface including the lower electrodes 28 [28a and 28b] and the insulating layer 41. In this embodiment, the organic photoelectric conversion layer 36 is formed to execute photoelectric conversion on green-wavelength light. The above-described quinacridone layer, for example, may be used as the organic layer executing the photoelectric conversion on green-wavelength light. The quinacridone layer may be formed by vacuum deposition. It is necessary to make the upper electrode 37 transparent. Therefore, an ITO layer formed by a sputter method, for example, may be used as the upper electrode 37.

Figure 28:
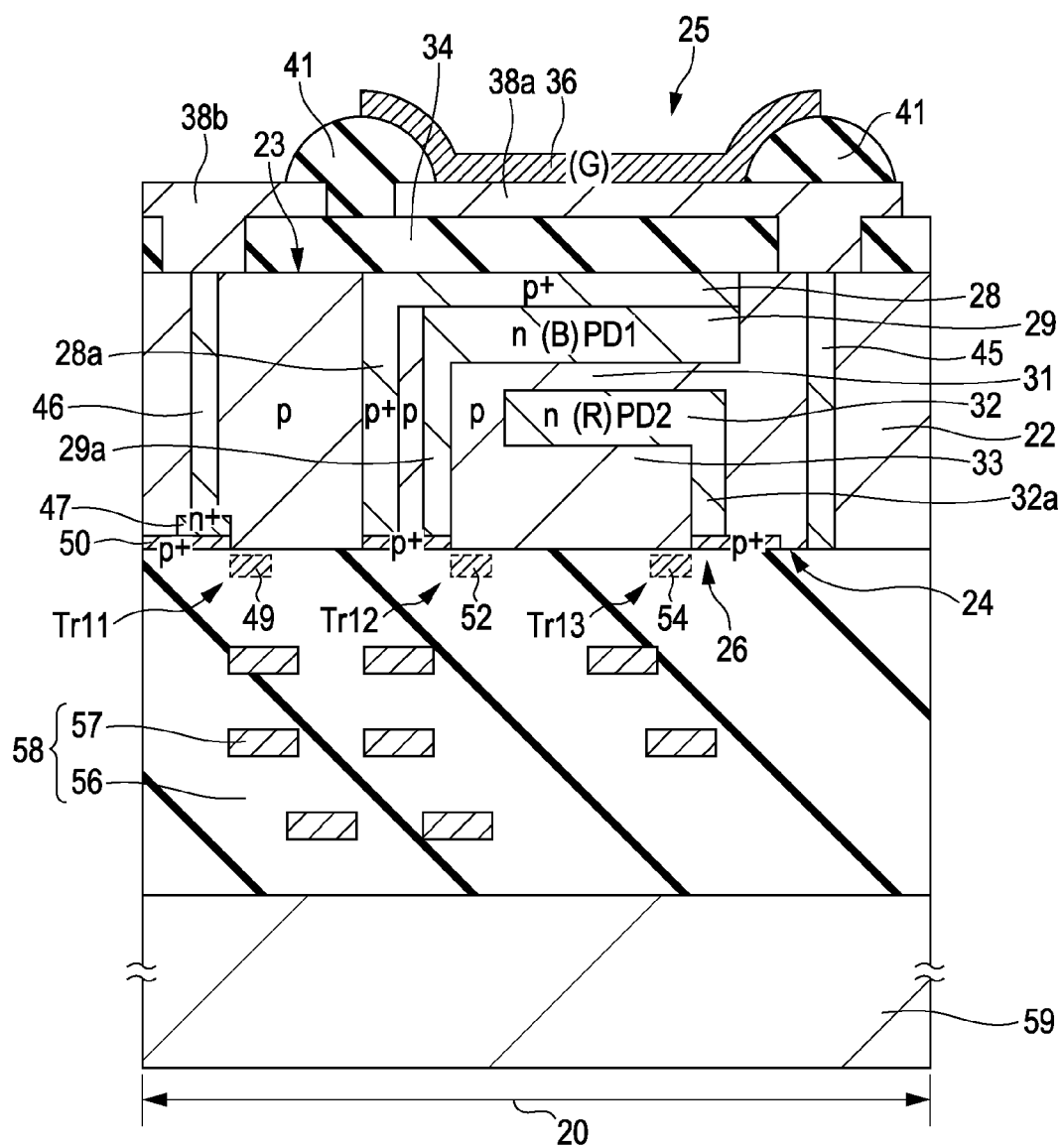
FIG. 28 is a diagram illustrating a process of manufacturing the solid-state imaging device according to the second embodiment.

Subsequently, as shown in FIG. 28, the organic photoelectric conversion layer 36 is patterned so that the organic photoelectric conversion layer 36 remains in each pixel. This patterning is stopped on the insulating layer 41. The patterning is performed by dry etching, as in the first embodiment.

Figure 29:
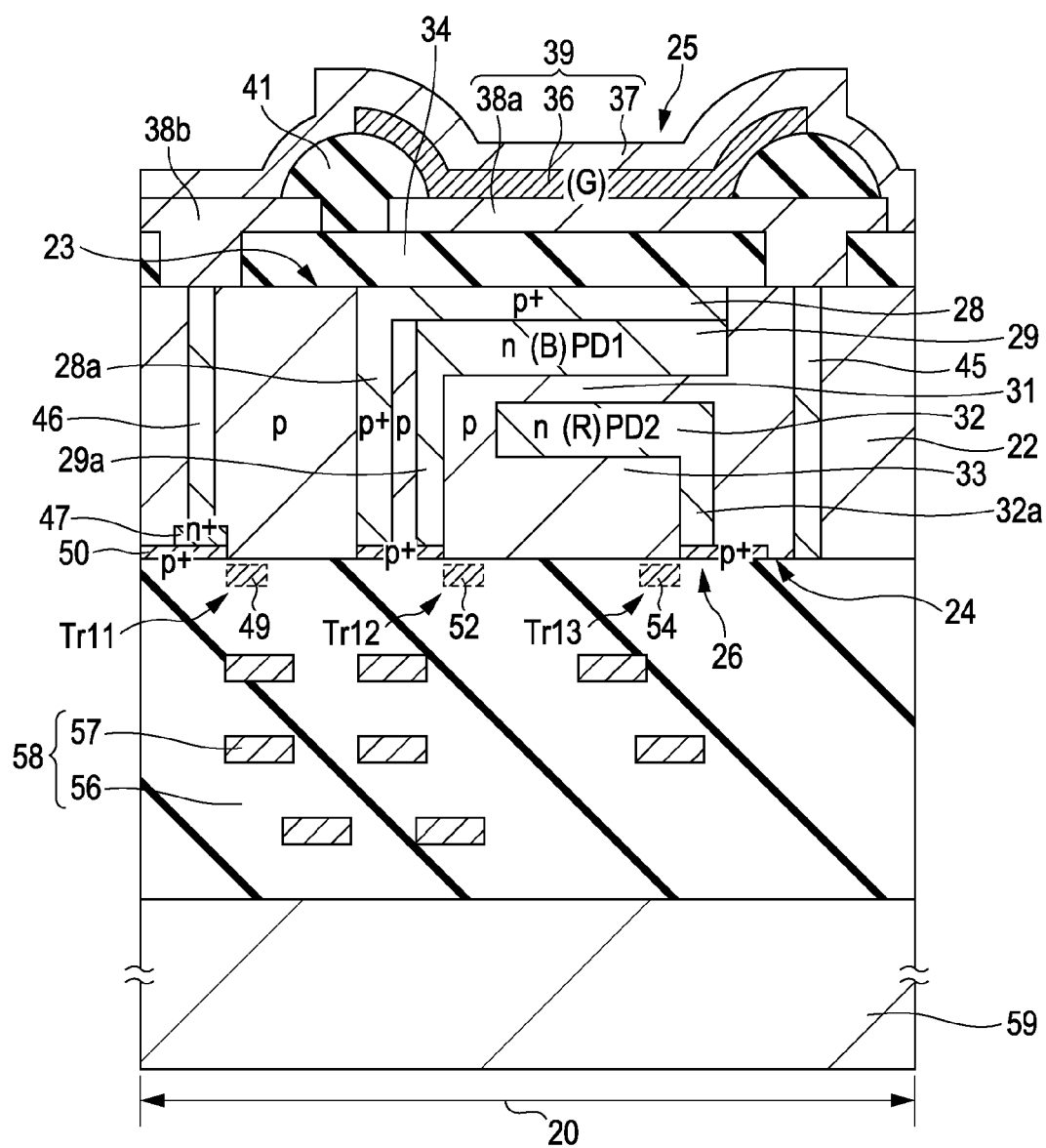
FIG. 29 is a diagram illustrating a process of manufacturing the solid-state imaging device according to the second embodiment.

Subsequently, as shown in FIG. 29, the upper electrode 37 is formed on the entire surface including the organic photoelectric conversion layer 36 so that a part of the upper electrode 37 is directly connected to the lower electrode 38b, and then the upper electrode 37 is patterned so as to be separated in each pixel. It is necessary to make the upper electrode 37 transparent. Therefore, an ITO layer formed by a sputter method may be used as the upper electrode 37. The respective different potentials may be supplied to the upper electrode 37 and the lower electrode 38a via the conductive plugs 46 and 45, respectively.

Subsequently, the on-chip lens 62 is formed on the surface including the organic photoelectric conversion unit 39 with the planarization layer 61 interposed therebetween to obtain the desired solid-state imaging device 71 shown in FIG. 18.

According to the method of manufacturing the solid-state imaging device 71 of this embodiment, it is possible to manufacture the back-illuminated solid-state imaging device in which the laminated organic photoelectric conversion unit 39 for one color is close to the photodiodes PD1 and PD2 for two colors. That is, the organic photoelectric conversion unit 39 can be formed on the upper layer of the photodiodes PD1 and PD2 without interposing the multi-layer wiring layer 58. Accordingly, it is possible to suppress the dependence on the red, green, and blue F numbers. It is possible to manufacture the solid-state imaging device capable of suppressing the variation in the sensitivity between the colors without the variation in the spectral balance of each color even when the F numbers are changed. Since the upper electrode 37 is directly connected to other the lower electrode 38b, the number of manufacturing processes can be reduced more than that of the first embodiment.

4. Third Embodiment

Exemplary Configuration of Solid-State Imaging Device

Figure 30:
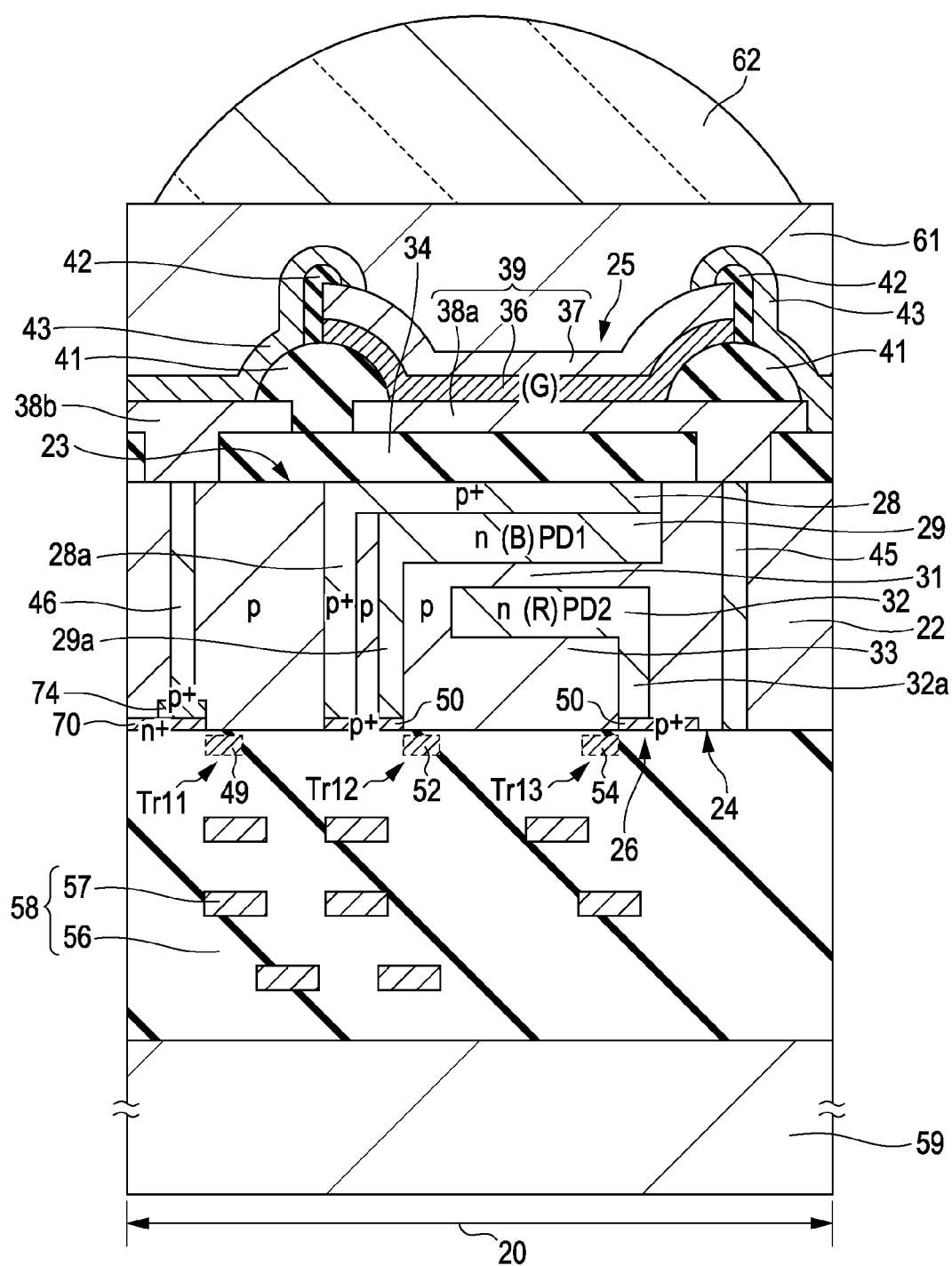
FIG. 30 is a diagram illustrating the configuration of major units of a solid-state imaging device according to a third embodiment of the invention.

In FIG. 30, a diagram illustrating a solid-state imaging device according to a third embodiment of the invention is shown. The solid-state imaging device according to this embodiment is a CMOS solid-state imaging device. FIG. 30 is a sectional view illustrating one pixel 20 in the pixel section of the CMOS solid-state imaging device.

A solid-state imaging device 73 according to the third embodiment has the same configuration as that of the first embodiment. The holes are read as the signal charges from the organic photoelectric conversion unit 39 and the electrons are read as the signal charges from the two first photodiode PD1 and second photodiode PD2. The holes of the signal charges in the organic photoelectric conversion unit 39 are configured so as to be read from the upper electrode 37. That is, as described above, the solid-state imaging device 73 according to this embodiment is the back-illuminated solid-state imaging device in which the organic photoelectric conversion unit 39, the first photodiode PD1, and the second photodiode PD2 are laminated in the depth direction in one pixel. The first photodiode PD1 for the second color and the second photodiode PD2 for the third color are formed at the positions of different depths in the semiconductor substrate 22. The organic photoelectric conversion unit 39 for the first color is laminated on the upper layer of the semiconductor substrate 22 with the insulating layer 34 interposed therebetween, so as to be close to the second photodiode PD2. In this embodiment, the solid-state imaging device includes the organic photoelectric conversion unit 39 executing the photoelectric conversion to the green-wavelength light, the first photodiode PD1 executing the photoelectric conversion to the blue-wavelength light, and the second photodiode PD2 executing the photoelectric conversion to the red-wavelength light.

The organic photoelectric conversion unit 39 includes the organic photoelectric layer 36 and includes the lower electrode 38a and the upper electrode 37 which interpose the organic photoelectric conversion layer 36. The lower electrode 38a is connected to the conductive plug 45. The upper electrode 37 is connected to the other conductive plug 46 with the contact metal layer 43 and the other lower electrode 38*b* interposed therebetween.

In this embodiment, of the pairs of the electrons and holes generated by the photoelectric conversion by the organic photoelectric conversion unit 39, the holes serving as the signal charges are guided and accumulated on the side of the front surface 34 of the substrate. Therefore, the p-type semiconductor region 74 serving as the accumulation layer is formed on the side of the front surface 24 of the substrate. The p-type semiconductor region 75 forms the floating diffusion unit (FD) to which the signal charges (holes) of the p-type semiconductor region 74 are transmitted via the transmission transistor Tr11. The other conductive plug 46 connected to the upper electrode 37 is formed so as to reach to the p-type semiconductor region 74 serving as the charge accumulation layer. When the conductive plugs 45 and 46 are formed in an impurity semiconductor layer by ion implanting, the conductive lugs 45 and 46 are formed in the p-type semiconductor layer.

The first photodiode PD1 and the second photodiode PD2 use the electrons of the pairs of the electrons and holes generated by the photoelectric conversion as the signal charges. Therefore, the n-type semiconductor regions 51 and 53 form the floating diffusion units (FD) to which the signal charges (electrons) of the first photodiode PD1 and the second photodiode PD2 are transmitted via the transmission transistors Tr12 and Tr13, respectively.

Figure 31:
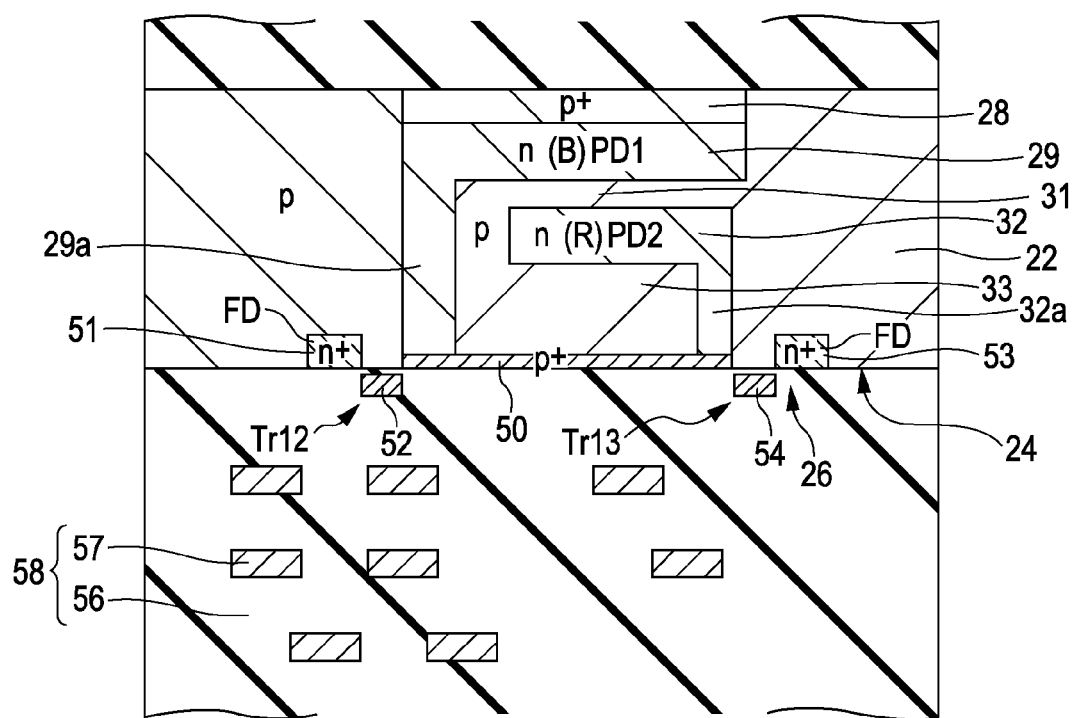
FIG. 31 is a sectional view illustrating transmission transistors Tr12 and Tr13 according to the third embodiment.
Figure 32:
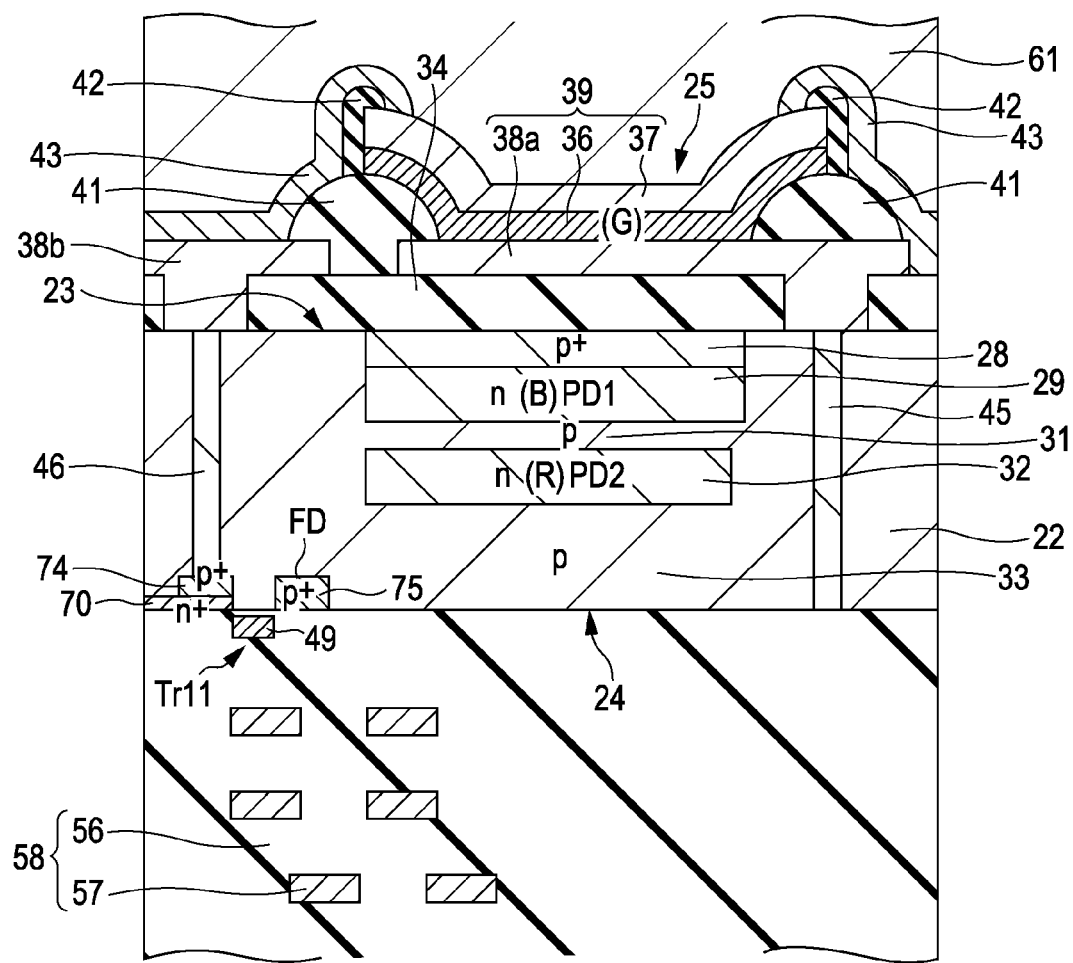
FIG. 32 is a sectional view illustrating a transmission transistor Tr11 according to the third embodiment.

As in the first embodiment, the pixel transistors having the cross-section different from that in FIG. 30 are schematically illustrated in FIGS. 31 and 32. In FIGS. 31 and 32, the transmission transistors among the plural pixel transistors are representatively shown. That is, in the organic photoelectric conversion unit 39, as shown in FIG. 32, the p-type semiconductor region 74 for charge accumulation is connected to the transmission transistor Tr11 having the n-type semiconductor region 75 serving as the floating diffusion unit and the transmission gate electrode 49. In the first photodiode PD1, as shown in FIG. 31, the extension portion 29*a* of the n-type semiconductor region 29 serving as the charge accumulation layer is connected to the transmission transistor Tr12 including the n-type semiconductor region 51 serving as the floating diffusion unit and the transmission gate electrode 52. In the second photodiode PD2, as shown in FIG. 31, the extension portion 32*a* of the n-type semiconductor region 32 serving as the charge accumulation layer is connected to the transmission transistor Tr13 including the n-type semiconductor region 53 serving as the floating diffusion unit and the transmission gate electrode 54.

At least, a p-type semiconductor region 50 serving as the hole accumulation layer is formed in the interface with the insulating layer, which faces the front surface 24 of the substrate of the n-type semiconductor regions 29*a* and 32*a* respectively forming the first photodiode PD1 and the second photodiode PD2. In FIG. 31, the p-type semiconductor region 50 serving as the hole accumulation layer is formed so as to include the interface between the p-type semiconductor region 33 and the insulating layer. The n-type semiconductor region 70 serving as the electron accumulation layer is formed in the interface with the insulating layer, which faces the front surface 24 of the substrate of the p-type semiconductor region 74 for charge accumulation in the organic photoelectric conversion unit 39.

The other configuration is the same as that of the first embodiment. The same reference numerals are given to the units corresponding to the units in FIG. 1, and the repeated description is omitted.

An operation (driving method) of the solid-state imaging device 73 according to the third embodiment will be described. The solid-state imaging device 73 is configured as a back-illuminated solid-state imaging device emitting light from the rear surface of the substrate. In this embodiment, a negative voltage VL (<0 V) is applied to the lower electrode 38*a* of the organic photoelectric conversion unit 39, and an upper voltage VU (<VL) lower than the lower voltage VL is applied to the upper electrode 37. The upper voltage VU applied to the upper electrode 37 reading a signal is applied to the necessary wiring 57 via the conductive plug 46. The negative voltage VL applied to the lower electrode 38*a* of the organic photoelectric conversion unit 39 is negative at the time of reset. The voltage of 0 V is applied from the necessary wiring 57 to the p-type semiconductor region 28 serving as the hole accumulation layer via the extension portion 28*a*.

When light is incident on one pixel 20 without passing through a color filter at the time of accumulating the charges, green-wavelength light is subjected to photoelectric conversion by the organic photoelectric conversion unit 39. Of the pairs of the electrons and holes generated by the photoelectric conversion, the holes serving as the signal charges are guided to the upper electrode 37 with the potential VU (<VL) lower than the lower voltage VL and are accumulated in the p-type semiconductor region 74 serving as the charge accumulation layer via the conductive plug 46. The electrons subjected to the photoelectric conversion are guided to the lower electrode 38*a* with the negative voltage VL (<0 V) higher than the upper potential VU and are discharged via the conductive plug 45 and the necessary wiring 57. The blue-wavelength light is absorbed and subjected to photoelectric conversion by the first photodiode PD1 formed in a shallow portion close to the rear surface of the semiconductor substrate 22, and the signal charges corresponding to the blue color are accumulated in the n-type semiconductor region 29. The red-wavelength light is absorbed and subjected to photoelectric conversion by the second photodiode PD2 formed in a deep portion from the rear surface of the semiconductor substrate 22, and the signal charges corresponding to the red color are accumulated in the n-type semiconductor region 32.

At the time of reading the signals, the green signal charges (holes) accumulated in the p-type semiconductor region 74 are transmitted to the p-type semiconductor region 75 serving as the floating diffusion unit (FD), when the transmission transistor Tr11 is turned on. The blue signal charges (electrons) accumulated in the n-type semiconductor region 29 are transmitted to the n-type semiconductor region 51 serving as the floating diffusion unit (FD), when the transmission transistor Tr12 is turned on. The red signal charges (electrons) accumulated in the n-type semiconductor region 32 are transmitted to the n-type semiconductor region 53 serving as the floating diffusion unit (FD), when the transmission transistor Tr13 is turned on. The red, green, and blue pixel signals are read and output to the vertical signal lines via the other pixel transistors.

In the solid-state imaging device 73 according to the third embodiment, as in the above-described embodiments, the organic photoelectric conversion unit 39 is close to the two photodiodes PD1 and PD2. Even when the dependence on the F numbers of the colors is suppressed and the F numbers are changed, it is possible to suppress the variation in the sensitivity between the colors without the variation in the spectral balance of each color. Since the negative voltage VL (<0 V) is applied to the lower electrode 38a at the time of accumulating the charges, the interface with the silicon insulating layer 34 becomes the hole accumulation state. When the insulating layer 34 has the negative fixed charges, the hole accumulation state is further enhanced and it is possible to suppress the dark current.

In the third embodiment, the upper electrode 37 of the organic photoelectric conversion unit 39 is connected to the lower electrode 38b via the contact metal layer 43, as in the first embodiment. The upper electrode 37 according to the second embodiment may be directly connected to the other lower electrode 38b.

5. Fourth Embodiment

Exemplary Configuration of Solid-State Imaging Device

Figure 33:
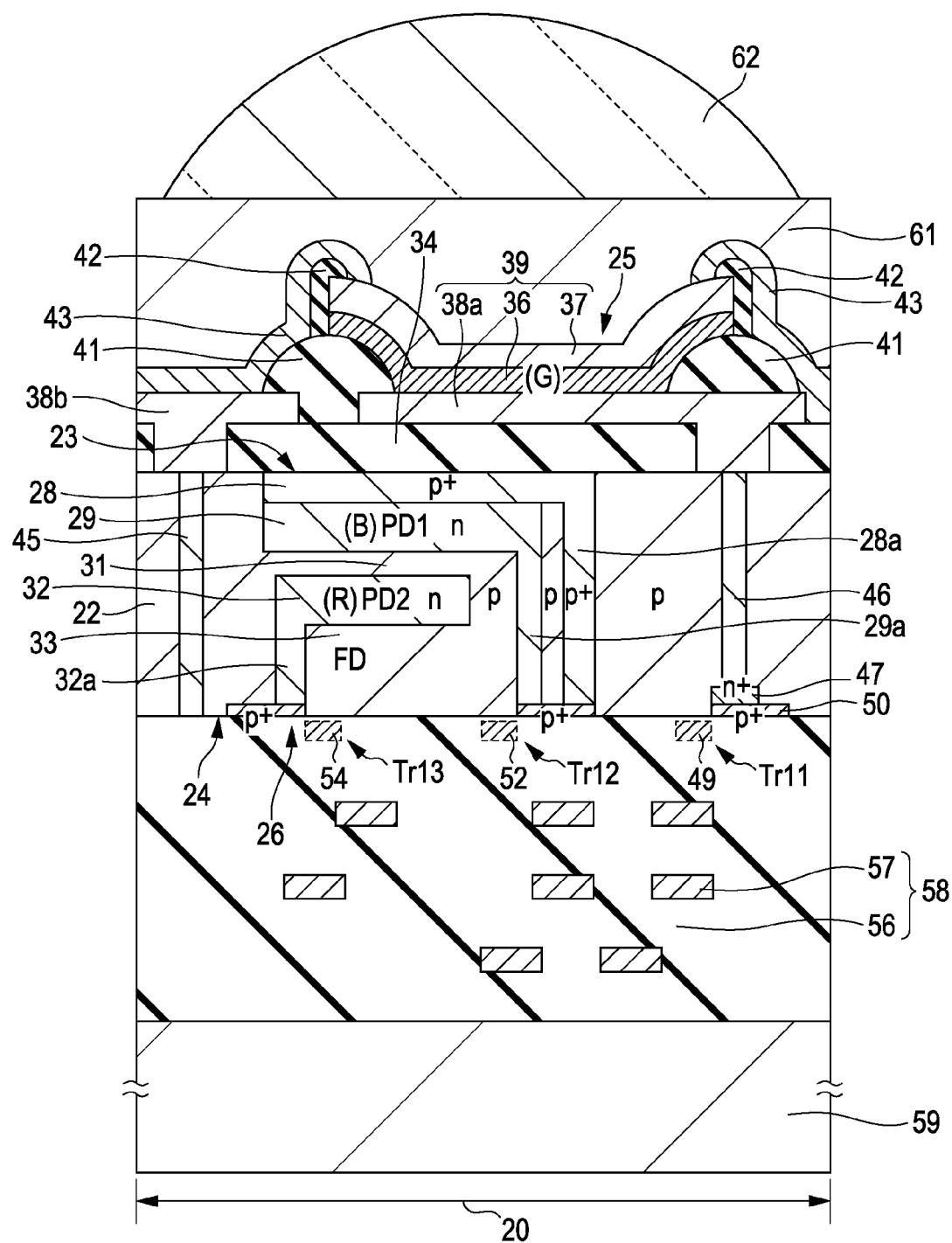
FIG. 33 is a diagram illustrating the configuration of major units of a solid-state imaging device according to a fourth embodiment of the invention.

In FIG. 33, a solid-state imaging device according to a fourth embodiment of the invention is shown. The solid-state imaging device according to this embodiment is a CMOS solid-state imaging device. FIG. 33 is a sectional view illustrating one pixel 20 in the pixel section of the CMOS solid-state imaging device.

A solid-state imaging device 75 according to the fourth embodiment has the same configuration as that of the first embodiment. However, the signal charges (electrons) from the organic photoelectric conversion unit 39 are read from the lower electrode 38a. The signal charges (electrons) from the two first photodiode PD1 and second photodiode PD2 are read as in the first embodiment. That is, the solid-state imaging device 75 according to this embodiment is the back-illuminated solid-state imaging device in which the organic photoelectric conversion unit 39, the first photodiode PD1, and the second photodiode PD2 are laminated in the depth direction in one pixel. The first photodiode PD1 for the second color and the second photodiode PD2 for the third color are formed at the positions of different depths in the semiconductor substrate 22. The organic photoelectric conversion unit 39 for the first color is laminated on the upper layer of the semiconductor substrate 22 with the insulating layer 34 interposed therebetween so as to be close to the second photodiode PD2. In this embodiment, the solid-state imaging device includes the organic photoelectric conversion unit 39 executing the photoelectric conversion to the green-wavelength light, the first photodiode PD1 executing the photoelectric conversion to the blue-wavelength light, and the second photodiode PD2 executing the photoelectric conversion to the red-wavelength light.

The organic photoelectric conversion unit 39 includes the organic photoelectric layer 36 and includes the lower electrode 38a and the upper electrode 37 which interpose the organic photoelectric conversion layer 36. The lower electrode 38a is connected to the conductive plug 45. The upper electrode 37 is connected to the other conductive plug 46 with the contact metal layer 43 and the other lower electrode 38b interposed therebetween.

In this embodiment, since the electrons serving as the signal charges generated by the photoelectric conversion by the organic photoelectric conversion unit 39 are read via the lower electrode 38a, the n-type semiconductor region 47 serving as the charge accumulation layer is formed on the front surface 24 of the substrate on the side of the conductive plug 45 connected to the lower electrode 38a. The n-type semiconductor region 48 serving as the floating diffusion unit (FD) is formed on the front surface 24 of the substrate so as to be close to the n-type semiconductor region 47.

Since the other configuration is the same as that of the first embodiment, the same reference numerals are given to the units corresponding to the unit in FIG. 1 and the repeated description is omitted. The different cross-sections of the transmission transistors Tr11 to Tr13 from those in FIG. 33 are illustrated. However, in FIG. 33, the gate electrodes 49, 52, and 54 are schematically illustrated for convenience.

An operation (driving method) of the solid-state imaging device 75 according to the fourth embodiment will be described. The solid-state imaging device 75 is configured as a back-illuminated solid-state imaging device emitting light from the rear surface of the substrate. In this embodiment, a negative voltage VL (<0 V) is applied to the lower electrode 38a of the organic photoelectric conversion unit 39, and an upper voltage VU (<VL) lower than the lower voltage VL is applied to the upper electrode 37. The upper voltage VU is given from the necessary wiring 57 on the front surface of the substrate via the conductive plug 45. The voltage of 0 V is applied from the necessary wiring 57 to the p-type semiconductor region 28 serving as the hole accumulation layer via the extension portion 28a.

When light is incident on one pixel 20 without passing through a color filter at the time of accumulating the charges, green-wavelength light is subjected to photoelectric conversion by the organic photoelectric conversion unit 39. Of the pairs of the electrons and holes generated by the photoelectric conversion, the electrons serving as the signal charges are guided to the lower electrode 38a with the potential VL (<VU) higher than the upper voltage VU and are accumulated in the n-type semiconductor region 47 serving as the charge accumulation layer via the conductive plug 45. The holes subjected to the photoelectric conversion are guided to the upper electrode 37 with the potential VU (<VL) lower than the lower potential VL and are discharged via the conductive plug 46 and the necessary wiring 57. The blue-wavelength light is absorbed and subjected to photoelectric conversion by the first photodiode PD1 formed in a shallow portion close to the rear surface of the semiconductor substrate 22, and the signal charges corresponding to the blue color are accumulated in the n-type semiconductor region 29. The red-wavelength light is absorbed and subjected to photoelectric conversion by the second photodiode PD2 formed in a deep portion from the rear surface of the semiconductor substrate 22, and the signal charges corresponding to the red color are accumulated in the n-type semiconductor region 32.

At the time of reading the charges, the transmission transistors Tr11, Tr12, and Tr13 are turned on. When the transmission transistors are turned on, the accumulated signal charges (electrons) of the organic photoelectric conversion unit 39, the first photodiode PD1, and the second photodiode PD2 are transmitted to the floating diffusion units (FD) 48, 51, and 54, respectively. The red, green, and blue pixel signals are read and output to the vertical signal line via the other pixel transistors.

In the solid-state imaging device 75 according to the fourth embodiment, as in the above-described embodiments, the organic photoelectric conversion unit 39 is close to the two photodiodes PD1 and PD2. Even when the dependence on the F numbers of the colors is suppressed and the F numbers are changed, it is possible to suppress the variation in the sensitivity between the colors without the variation in the spectral balance of each color. Since the negative voltage VL (<0 V) is applied to the lower electrode 38a at the time of accumulating the charges, the interface with the silicon insulating layer 34 becomes the hole accumulation state. When the insulating layer 34 has the negative fixed charges, the hole accumulation state is further enhanced and it is possible to suppress the dark current.

6. Fifth Embodiment

Exemplary Configuration of Solid-State Imaging Device

Figure 34:
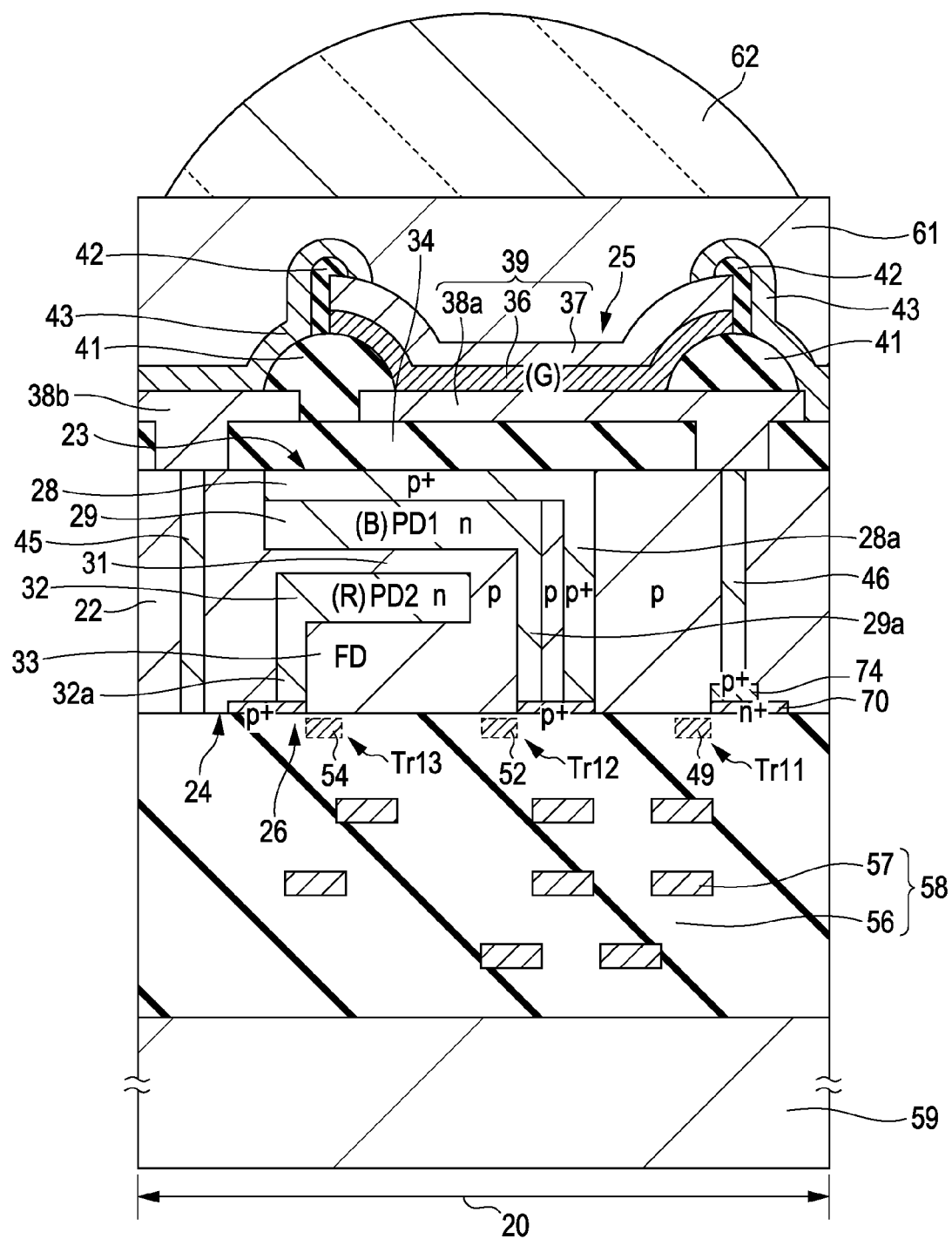
FIG. 34 is a diagram illustrating the configuration of major units of a solid-state imaging device according to a fifth embodiment of the invention.

In FIG. 34, a solid-state imaging device according to a fifth embodiment of the invention is shown. The solid-state imaging device according to this embodiment is a CMOS solid-state imaging device. FIG. 34 is a sectional view illustrating one pixel 20 in the pixel section of the CMOS solid-state imaging device.

A solid-state imaging device 77 according to the fifth embodiment has almost the same configuration as that of the first embodiment. However, the signal charges (holes) from the organic photoelectric conversion unit 39 are read from the lower electrode 38a. The signal charges (electrons) from the two first photodiode PD1 and second photodiode PD2 are read as in the first embodiment. That is, the solid-state imaging device 77 according to this embodiment is the back-illuminated solid-state imaging device in which the organic photoelectric conversion unit 39, the first photodiode PD1, and the second photodiode PD2 are laminated in the depth direction in one pixel. The first photodiode PD1 for the second color and the second photodiode PD2 for the third color are formed at the positions of different depths in the semiconductor substrate 22. The organic photoelectric conversion unit 39 for the first color is laminated on the upper layer of the semiconductor substrate 22 with the insulating layer 34 interposed therebetween so as to be close to the second photodiode PD2. In this embodiment, the solid-state imaging device includes the organic photoelectric conversion unit 39 executing the photoelectric conversion to the green-wavelength light, the first photodiode PD1 executing the photoelectric conversion to the blue-wavelength light, and the second photodiode PD2 executing the photoelectric conversion to the red-wavelength light.

The organic photoelectric conversion unit 39 includes the organic photoelectric layer 36 and includes the lower electrode 38a and the upper electrode 37 which interpose the organic photoelectric conversion layer 36. The lower electrode 38a is connected to the conductive plug 45. The upper electrode 37 is connected to the other conductive plug 46 with the contact metal layer 43 and the other lower electrode 38b interposed therebetween.

In this embodiment, of the pairs of the electrons and holes generated by the photoelectric conversion by the organic photoelectric conversion unit 39, the holes serving as the signal charges are guided and accumulated on the side of the front surface 34 of the substrate. Therefore, the p-type semiconductor region 74 serving as the charge accumulation layer is formed on the side of the front surface 24 of the substrate. The p-type semiconductor region 75 forms the floating diffusion unit (FD) to which the signal charges (holes) of the p-type semiconductor region 74 are transmitted via the transmission transistor Tr11. The other conductive plug 45 connected to the lower electrode 38a is formed so as to reach to the p-type semiconductor region 74 serving as the charge accumulation layer. When the conductive plugs 45 and 46 are formed in the impurity semiconductor layer by ion implanting, the conductive plugs 45 and 46 are formed in the p-type semiconductor layer.

The first photodiode PD1 and the second photodiode PD2 use the electrons of the pairs of the electrons and holes generated by the photoelectric conversion as the signal charges. Therefore, the n-type semiconductor regions 51 and 53 form the floating diffusion units (FD) to which the signal charges (electrons) of the first photodiode PD1 and the second photodiode PD2 are transmitted via the transmission transistors Tr12 and Tr13, respectively.

The other configuration is the same as those of the first and third embodiments. The same reference numerals are given to the units corresponding to the units in FIGS. 1 and 30, and the repeated description is omitted.

An operation (driving method) of the solid-state imaging device 77 according to the fifth embodiment will be described. The solid-state imaging device 77 is configured as the back-illuminated solid-state imaging device emitting light from the rear surface of the substrate. In this embodiment, the negative fixed voltage VL (<0 V) is applied to the lower electrode 38a of the organic photoelectric conversion unit 39, and the upper voltage VU (>VL) higher than the lower voltage VL is applied to the upper electrode 37. The voltage of 0 V is applied from the necessary wiring 57 to the extension portion 28a of the p-type semiconductor region 28 serving as the hole accumulation layer.

When light is incident on one pixel 20 without passing through a color filter at the time of accumulating the charges, green-wavelength light is subjected to photoelectric conversion by the organic photoelectric conversion unit 39. Of the pairs of the electrons and holes generated by the photoelectric conversion, the holes serving as the signal charges are guided to the lower electrode 38a with the negative potential VL and are accumulated in the p-type semiconductor region 74 serving as the charge accumulation layer via the conductive plug 45. The electrons subjected to the photoelectric conversion are guided to the upper electrode 37 with the potential VU (>VL) higher than the lower potential VL and are discharged via the conductive plug 46 and the necessary wiring 57. The blue-wavelength light is absorbed and subjected to photoelectric conversion by the first photodiode PD1 formed in a shallow portion close to the rear surface of the semiconductor substrate 22, and the signal charges corresponding to the blue color are accumulated in the n-type semiconductor region 29. The red-wavelength light is absorbed and subjected to photoelectric conversion by the second photodiode PD2 formed in a deep portion from the rear surface of the semiconductor substrate 22, and the signal charges corresponding to the red color are accumulated in the n-type semiconductor region 32.

At the time of reading the charges, the transmission transistors Tr11, Tr12, and Tr13 are turned on. When the transmission transistors are turned on, the accumulated signal charges (holes) of the organic photoelectric conversion unit 39 and the accumulated signal charges (electrons) of the first photodiode PD1 and the second photodiode PD2 are transmitted to the floating diffusion units (FD) 75, 51, and 54, respectively. The pixels signals of the red, green, and blue colors are read and output to the vertical signal lines via the other pixel transistors.

In the solid-state imaging device 77 according to the fifth embodiment, as in the above-described embodiments, the organic photoelectric conversion unit 39 is close to the two photodiodes PD1 and PD2. Even when the dependence on the F numbers of the colors is suppressed and the F numbers are changed, it is possible to suppress the variation in the sensitivity between the colors without the variation in the spectral balance of each color. Since the negative voltage VL (<0 V) is applied to the lower electrode 38a at the time of accumulating the charges, the interface with the silicon insulating layer 34 becomes the hole accumulation state. When the insulating layer 34 has the negative fixed charges, the hole accumulation state is further enhanced and it is possible to suppress the dark current.

In the fourth and fifth embodiments, the upper electrode 37 of the organic photoelectric conversion unit 39 is connected to the lower electrode 38b via the contact metal layer 43, as in the first embodiment. However, the upper electrode 37 may be connected directly to the lower electrode 38b, as in the second embodiment.

7. Sixth Embodiment

Exemplary Configuration of Solid-State Imaging Device

Figure 35:
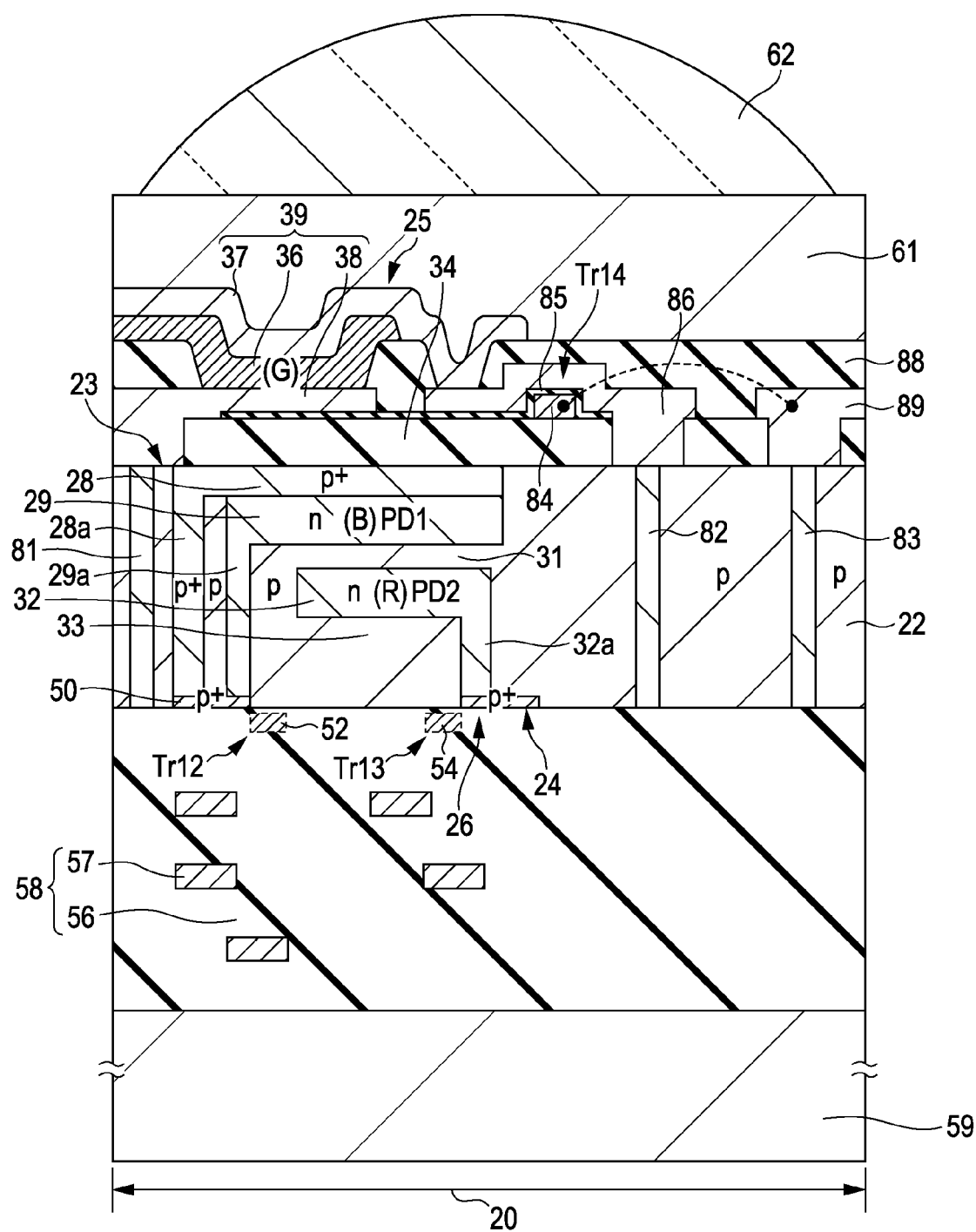
FIG. 35 is a diagram illustrating the configuration of major units of a solid-state imaging device according to a sixth embodiment of the invention.

In FIG. 35, a solid-state imaging device according to a sixth embodiment of the invention is shown. The solid-state imaging device according to this embodiment is a CMOS solid-state imaging device. FIG. 35 is a sectional view illustrating one pixel 20 in the pixel section of the CMOS solid-state imaging device.

The solid-state imaging device 79 according to the sixth embodiment is configured to read the signals of the organic photoelectric conversion unit 39 via the transmission transistors by the thin film transistor. That is, the solid-state imaging device according to the sixth embodiment is the back-illuminated solid-state imaging device in which the organic photoelectric conversion unit 39, the first photodiode PD1, and the second photodiode PD2 are laminated in the depth direction in one pixel. The first photodiode PD1 for the second color and the second photodiode PD2 for the third color are formed at the positions of different depths in the semiconductor substrate 22. The organic photoelectric conversion unit 39 for the first color is laminated on the upper layer of the semiconductor substrate 22 with the insulating layer 34 interposed therebetween so as to be close to the second photodiode PD2. In this embodiment, the solid-state imaging device includes the organic photoelectric conversion unit 39 executing the photoelectric conversion to the green-wavelength light, the first photodiode PD1 executing the photoelectric conversion to the blue-wavelength light, and the second photodiode PD2 executing the photoelectric conversion to the red-wavelength light.

The organic photoelectric conversion unit 39 includes the organic photoelectric layer 36 and includes the lower electrode 38 and the upper electrode 37 which interpose the organic photoelectric conversion layer 36.

In this embodiment, a thin film transistor Tr14 configured to read the signal charges of the organic photoelectric conversion unit 39 is formed on the insulating layer 34 formed between the first photodiode PD1 and the organic photoelectric conversion unit 39 on the side of the rear surface 23 of the substrate. The thin film transistor Tr14 corresponds to the transmission transistor among the plural pixel transistors. Therefore, the drain of the thin film transistor Tr14 corresponds to a floating diffusion unit (FD).

The thin film transistor Tr14 is a so-called bottom gate type thin film transistor having a configuration with a pair of source/drain and gate. The thin film transistor Tr14 is formed by forming a gate electrode 84 on the insulating layer 34, forming a gate insulating layer 85 on the gate electrode 84, and forming a semiconductor thin film (active layer) 86, which has a channel region c, a source region S, and a drain region D, on the gate insulating layer 85. The upper electrode 37 of the organic photoelectric conversion unit 39 is connected to the source region S via a contact hole of the insulating layer 88.

Conductive plugs 81, 82, and 83 formed through the substrate 22 are formed in the semiconductor substrate 22. The conductive plugs 81, 82 and 83 may be formed in an impurity semiconductor layer, a metal layer, or the like by ion implanting, as described above. The lower electrode 38 of the organic photoelectric conversion unit 39 is connected to the conductive plug 81. The drain region D of the thin film transistor Tr14 is connected to the conductive plug 82. The gate electrode 84 of the thin film transistor Tr14 is connected to the conductive plug 83 via the conductive layer 89.

Since the other configuration is the same as the configuration described in the first embodiment, the same reference numerals are given to the units corresponding to the units in FIG. 1 and the repeated description is omitted. The different cross-sections of the transmission transistors Tr12 and Tr13 from those in FIG. 35 are illustrated. However, in FIG. 35, the gate electrodes 52 and 54 are schematically illustrated for convenience.

An operation (driving method) of the solid-state imaging device 79 according to the sixth embodiment will be described. In this embodiment, the negative fixed voltage VL (<0 V) is applied to the lower electrode 38 of the organic photoelectric conversion unit 39 via the necessary wiring 57 and the conductive plug 81, and the voltage VU (>VL), such as a power voltage VDD, higher than the voltage VL of the lower electrode 38 is applied to the upper electrode 37 at the time of accumulating the charges. The drain region D of the thin film transistor Tr14 is connected to the source of a reset transistor (not shown) and the gate of an amplification transistor (not shown) via the necessary wiring 57. The voltage of 0 V is applied from the necessary wiring 57 to the extension portion 28a of the p-type semiconductor region 28 serving as the hole accumulation layer.

The potential of the upper electrode 37 at the time of accumulating the charges becomes high due to the source potential of the thin film transistor Tr14.

The source potential becomes the power potential, for example, as in the first embodiment. When the reset transistor and the thin film transistor Tr14 serving as the transmission transistor are turned on and reset, and then both the transistors are turned off, the source potential becomes the reset level and the potential is varied in accordance with the accumulated charges.

When light is incident on one pixel 20 without passing through a color filter at the time of accumulating the charges, green-wavelength light is subjected to photoelectric conversion by the organic photoelectric conversion layer 36. Of the pairs of the electrons and holes generated by the photoelectric conversion, the electrons serving as the signal charges are accumulated in the source region S of the thin film transistor Tr14 via the upper electrode 37. The holes subjected to the photoelectric conversion are guided to the lower electrode 38 with the potential VL and are discharged via the conductive plug 81 and the necessary wiring 57. The blue-wavelength light is subjected to photoelectric conversion by the first photodiode PD1 formed in a shallow portion close to the rear surface of the semiconductor substrate 22, and the signal charges (electrons) corresponding to the blue color are accumulated in the n-type semiconductor region 29. The red-wavelength light is subjected to photoelectric conversion by the second photodiode PD2 formed in a deep portion from the rear surface of the semiconductor substrate 22, and the signal charges (electrons) corresponding to the red color are accumulated in the n-type semiconductor region 32.

At the time of reading the charges, the thin film transistor Tr14, the transmission transistors Tr12, and Tr13 are turned on. When the transmission transistor Tr14 is turned on, the green signal charges accumulated in the source region S are transmitted to the drain region D serving as the floating diffusion unit (FD). When the other transmission transistors Tr12 and Tr13 are turned on, the blue and red signal charges accumulated in the first photodiode PD1 and the second photodiode PD2 are transmitted to the n-type semiconductor regions 51 and 53 serving as the floating diffusion units (FD), respectively. The pixels signals of the red, green, and blue colors are read and output to the vertical signal lines via the other pixel transistors.

In the solid-state imaging device 79 according to the sixth embodiment, as in the above-described embodiments, the organic photoelectric conversion unit 39 is close to the two photodiodes PD1 and PD2. Even when the dependence on the F numbers of the colors is suppressed and the F numbers are changed, it is possible to suppress the variation in the sensitivity between the colors without the variation in the spectral balance of each color. Since the negative voltage VL (<0 V) is applied to the lower electrode 38a at the time of accumulating the charges, the interface with the silicon insulating layer 34 becomes the hole accumulation state. When the insulating layer 34 has the negative fixed charges, the hole accumulation state is further enhanced and it is possible to suppress the dark current. By providing the thin film transistor Tr14, the conductive plugs can be shared, as described in a seventh embodiment (FIG. 42), which is described below.

Exemplary Method of Manufacturing Solid-State Imaging Device

Figure 36:
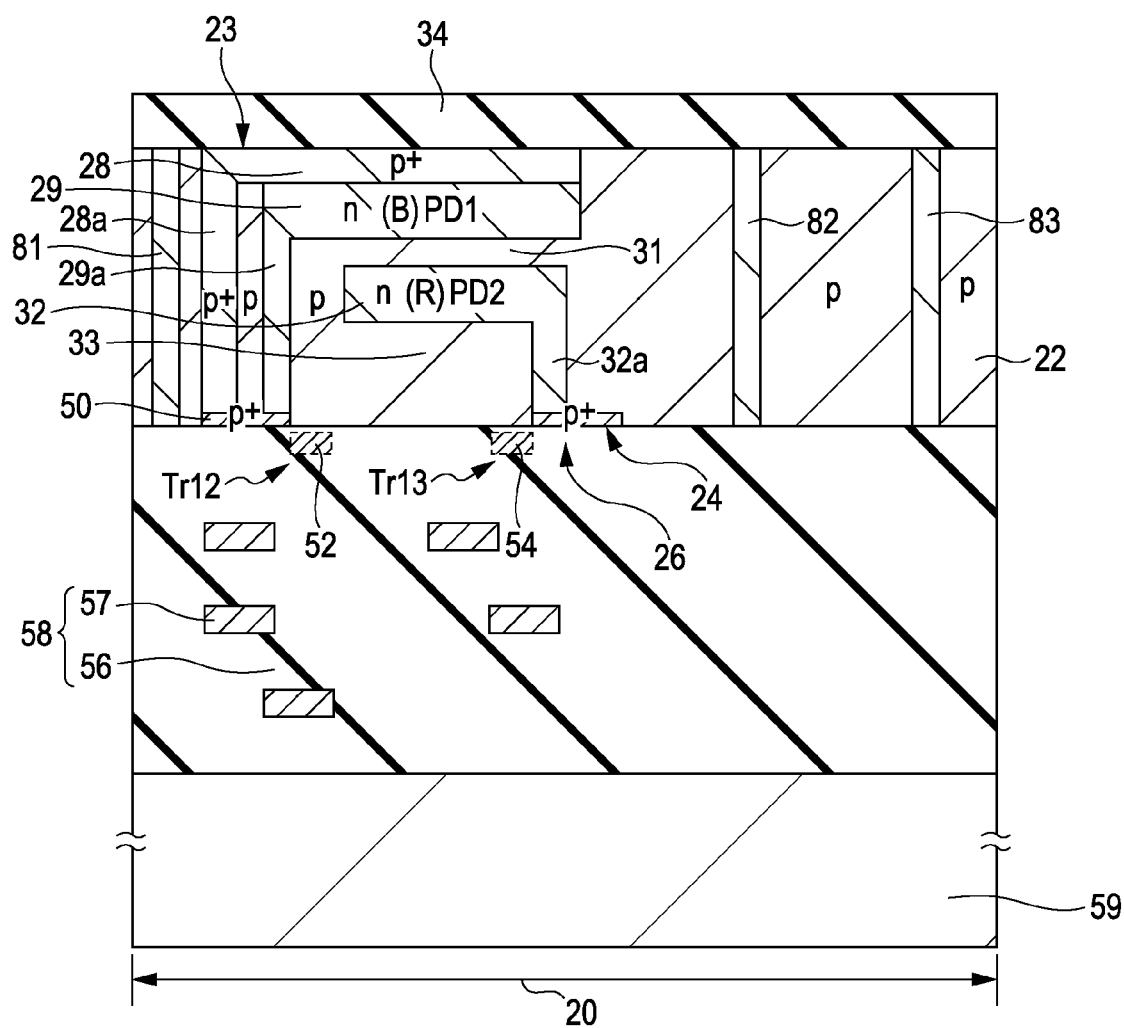
FIG. 36 is a diagram illustrating a process of manufacturing the solid-state imaging device according to the sixth embodiment.

FIGS. 36 to 45 are diagrams illustrating a method of manufacturing the solid-state imaging device 79 according to the sixth embodiment. In the drawings, only the major units corresponding to one pixel are shown. The process in FIG. 36 is the same as the process in FIG. 11 of the first embodiment except for forming the three conductive plugs 81 to 83 and the transmission transistors Tr12 and Tr13. That is, the configuration in FIG. 36 can be obtained by the processes in FIGS. 6 to 11.

In FIG. 36, the pixel transistors including the transmission transistors Tr12 and Tr13 are formed on the front surface of the semiconductor substrate 22, and the peripheral circuit such as a logic circuit is formed in the peripheral circuit section. The multi-layer wiring layer 58, in which the wirings 57 of plural layers are formed with the inter-layer insulating layer 56 interposed therebetween, is formed in the upper portion of the front surface of the semiconductor substrate 22. Moreover, the supporting substrate 59 is attached. The conductive plugs 81, 82, and 83 formed through the substrate 22 are formed in the semiconductor substrate 22. The first photodiode PD1 and the second photodiode PD2 are laminated in the depth direction. The insulating layer 34 is formed on the rear surface 23 of the semiconductor substrate 22. The insulating layer 34 can be formed of the layer with the negative fixed charges, as described above.

Figure 37:
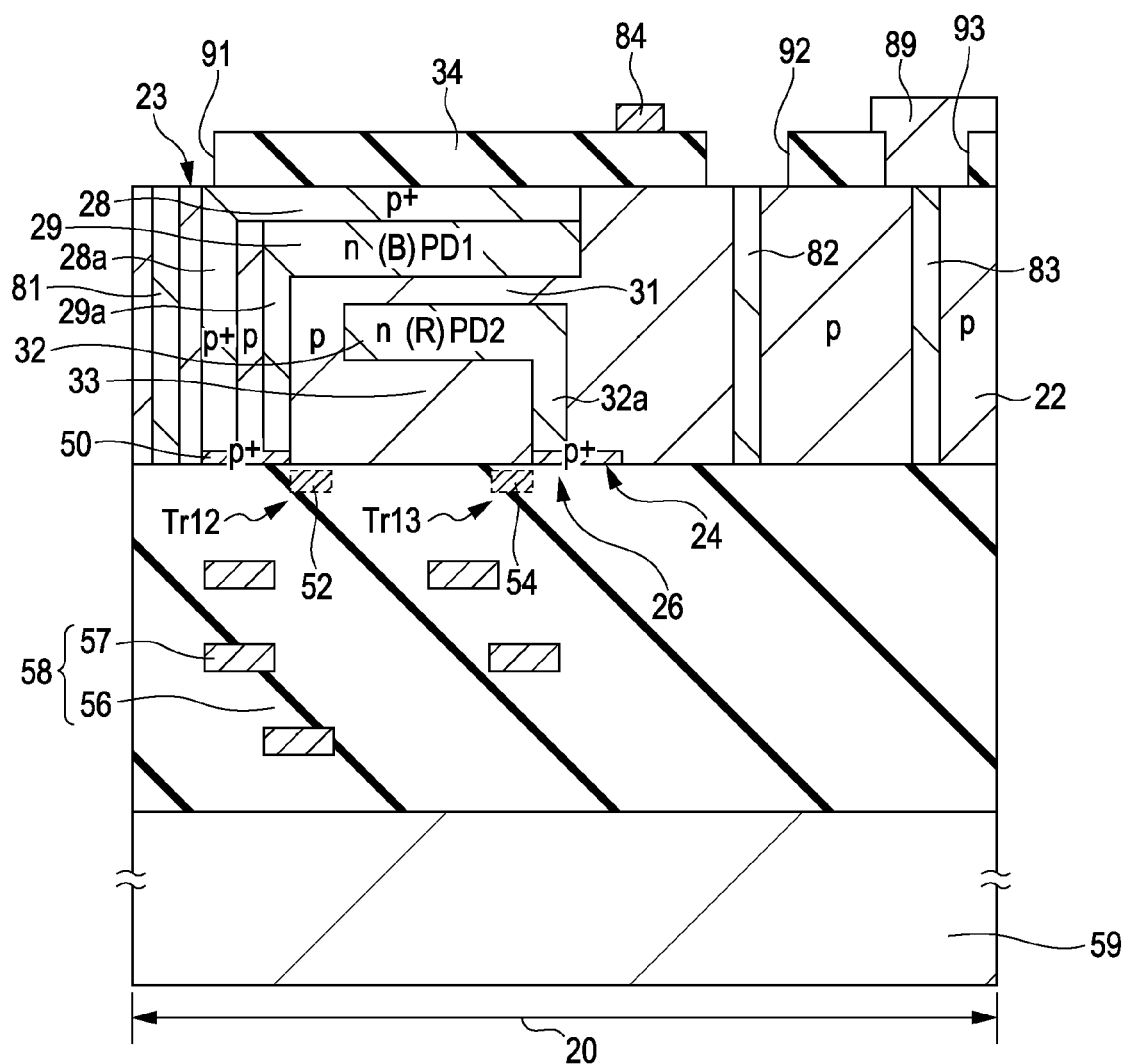
FIG. 37 is a diagram illustrating a process of manufacturing the solid-state imaging device according to the sixth embodiment.

Subsequently, as shown in FIG. 37, contact holes 91, 92, and 93 are formed to expose the conductive plugs 81, 82, and 83 to the insulating layer 34. Subsequently, a conductive material layer is formed and patterned to form the gate electrode 84 at the position necessary in the insulating layer 34, and the conductive layer 89 is simultaneously formed so as to be connected to the conductive plug 83 via the contact hole 93. The gate electrode 84 and the conductive layer 89 are formed of the same material and are continuously connected at the different positions. It is preferable to use low resistant material such as Al and W as the electrode material. The conductive plug 83 connected to the gate electrode 86 is formed in the peripheral circuit section.

Figure 38:
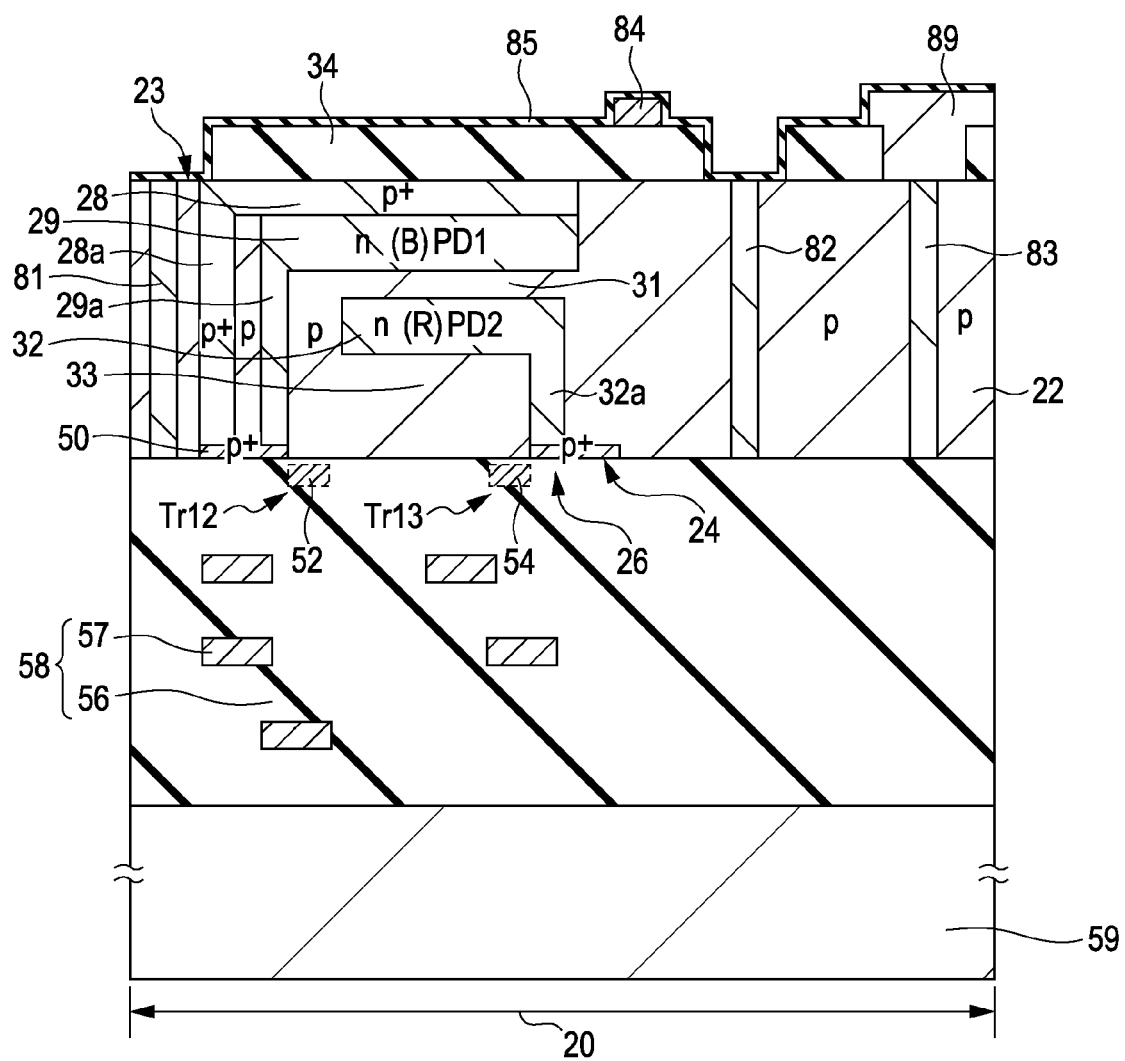
FIG. 38 is a diagram illustrating a process of manufacturing the solid-state imaging device according to the sixth embodiment.

Subsequently, as shown in FIG. 38, the gate insulating layer 85 is formed on the entire surface so as to cover the gate electrode 84.

Figure 39:
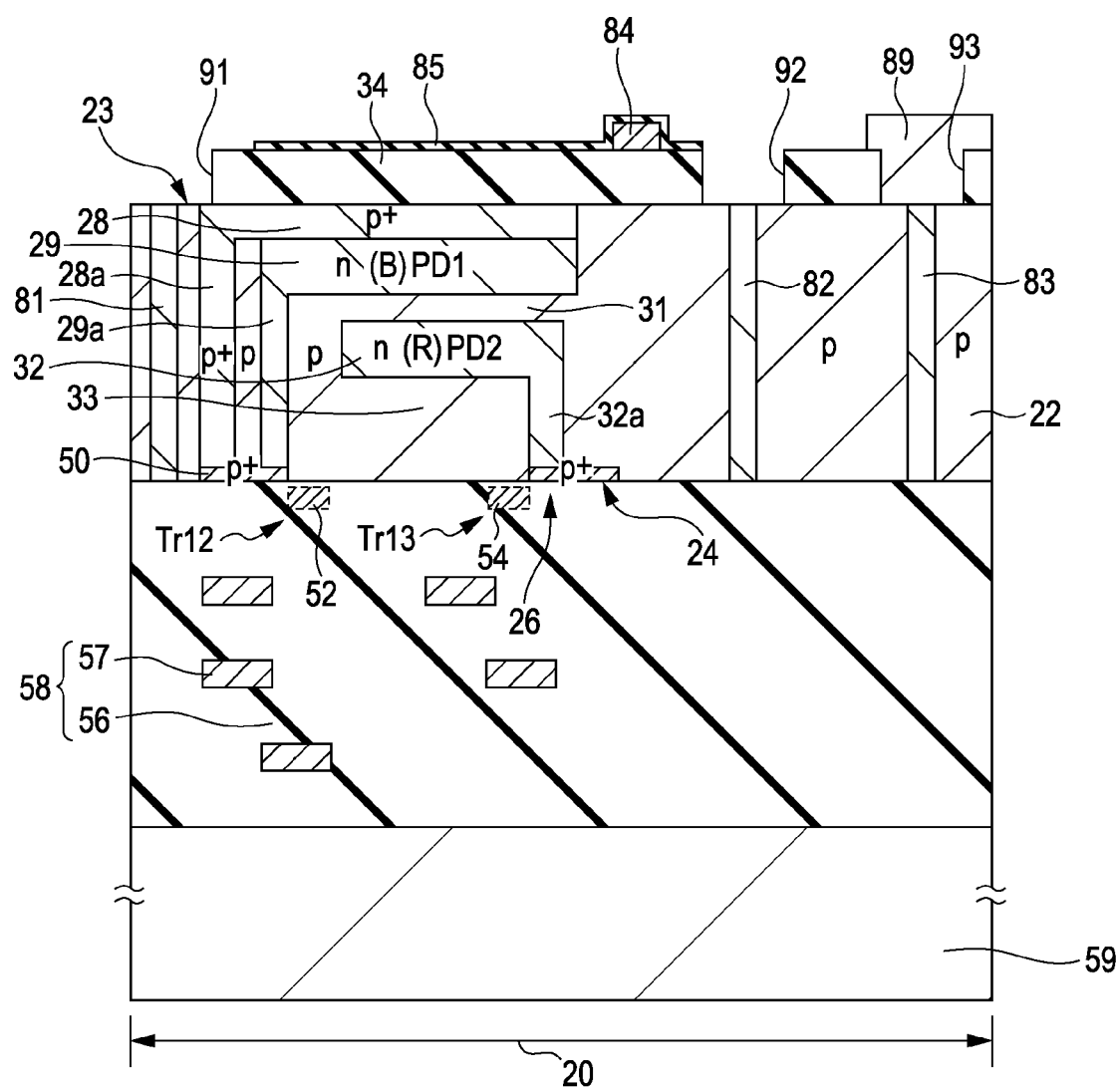
FIG. 39 is a diagram illustrating a process of manufacturing the solid-state imaging device according to the sixth embodiment.

Subsequently, as shown in FIG. 39, the gate insulating layer 85 is patterned to selectively remove the unnecessary portion of the gate insulating layer 85 and only the extension portion to the insulating layer 34 remains on the front surface of the gate electrode 84. The gate insulating layer 85 may remain up to the sidewall of the gate electrode and may not remain above the insulating layer 84.

Figure 40:
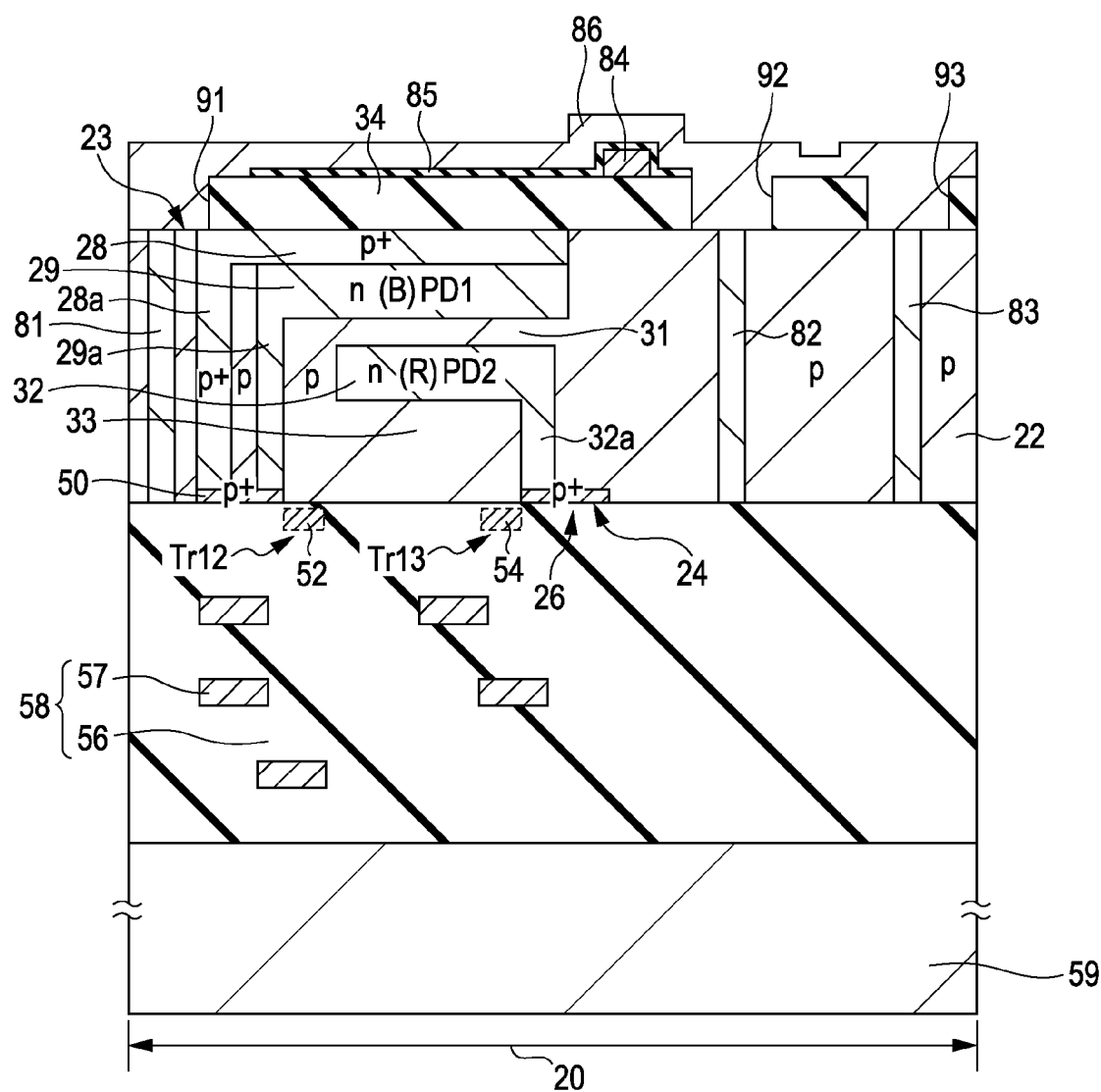
FIG. 40 is a diagram illustrating a process of manufacturing the solid-state imaging device according to the sixth embodiment.

Subsequently, as shown in FIG. 40, the semiconductor thin film 86 is formed on the entire surface including the gate insulating layer 85. An amorphous silicon layer, a fine crystal silicon layer, or the like may be used as the semiconductor thin film 86. When a transparent semiconductor such as ZnO, TnO, SnO, or CdO is used as the semiconductor thin film 86, it is more preferable in that an aperture ratio of the photoelectric conversion unit is improved.

Figure 41:
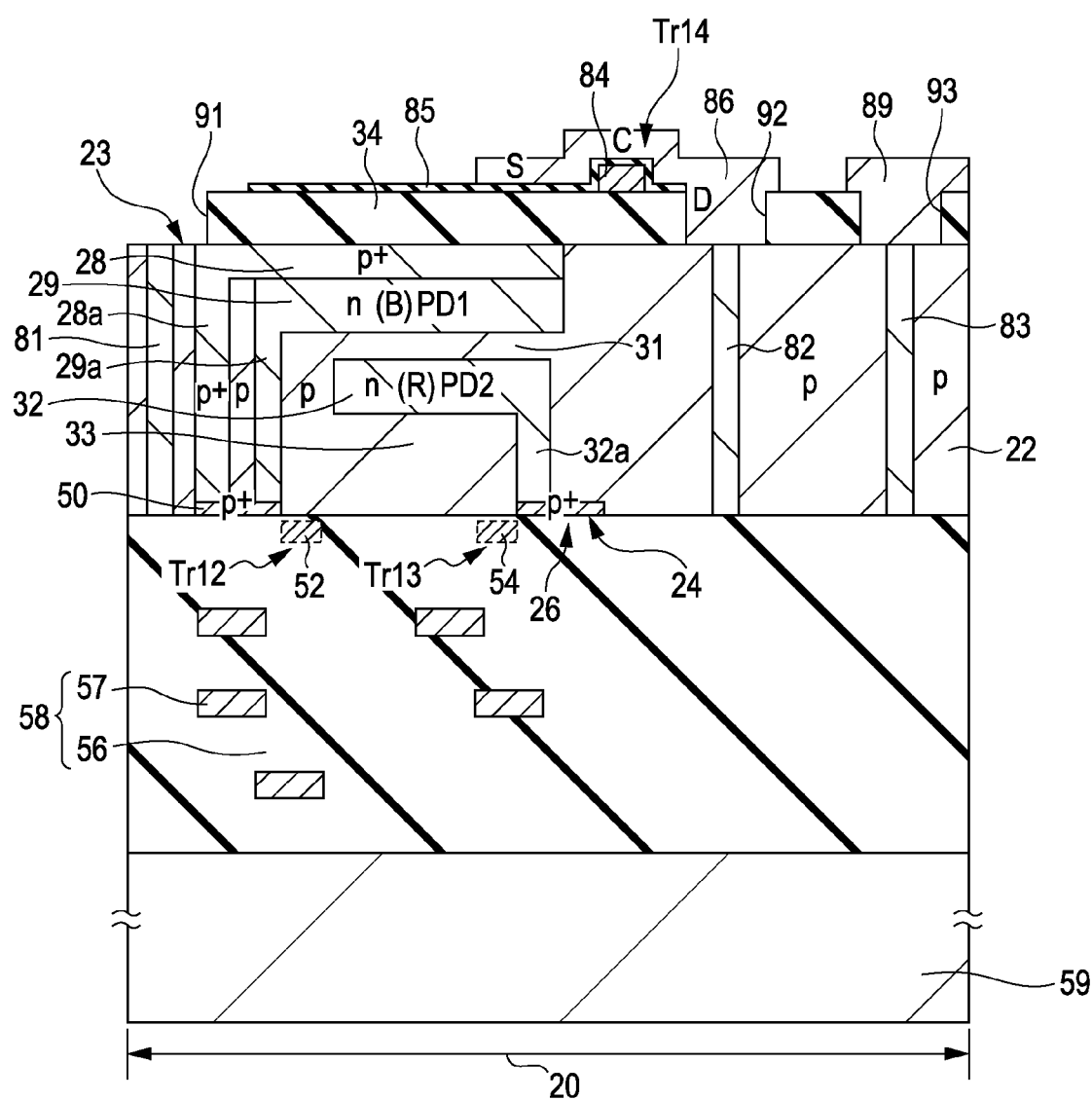
FIG. 41 is a diagram illustrating a process of manufacturing the solid-state imaging device according to the sixth embodiment.

Subsequently, as shown in FIG. 41, the semiconductor thin film 86 is patterned so that the active layer of the source region S, the channel region C, and the drain region D remains. The drain region D is connected to the conductive plug 82 via the contact hole 92. The source region S and the drain region D are formed as n-type impurity regions in this embodiment.

Figure 42:
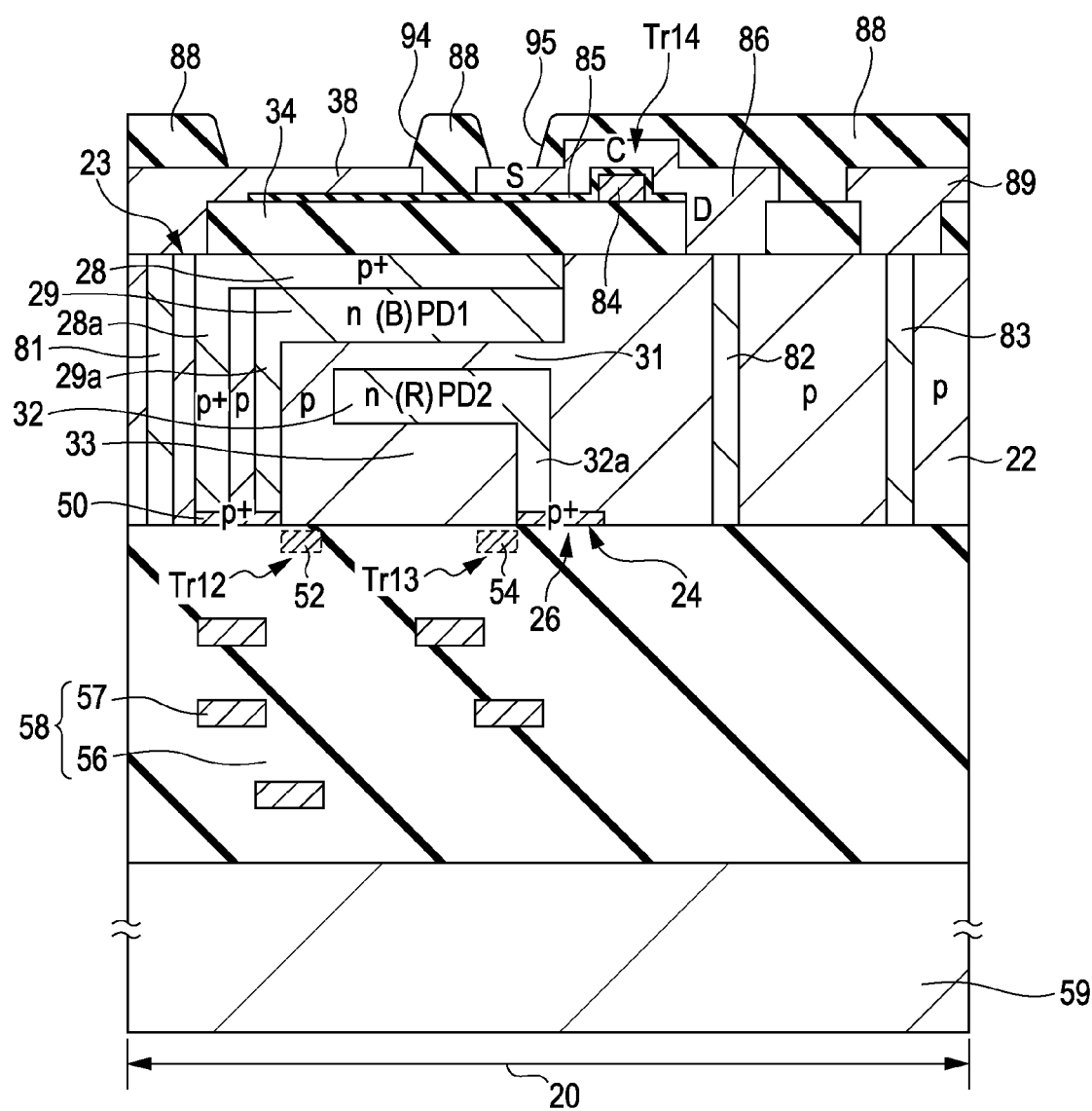
FIG. 42 is a diagram illustrating a process of manufacturing the solid-state imaging device according to the sixth embodiment.

Subsequently, as shown in FIG. 42, the lower electrode 38 formed of a transparent conductive layer is formed on the insulating layer 34 so as to be connected to the conductive plug 81 via the contact hole 91. Subsequently, the insulating layer 88 is formed on the entire surface, and then the insulating layer 88 is patterned so that region where the organic photoelectric conversion unit is formed and the source region S of the semiconductor thin film (active layer) 86 face each other, and openings 94 and 95 with a taper are formed.

Figure 43:
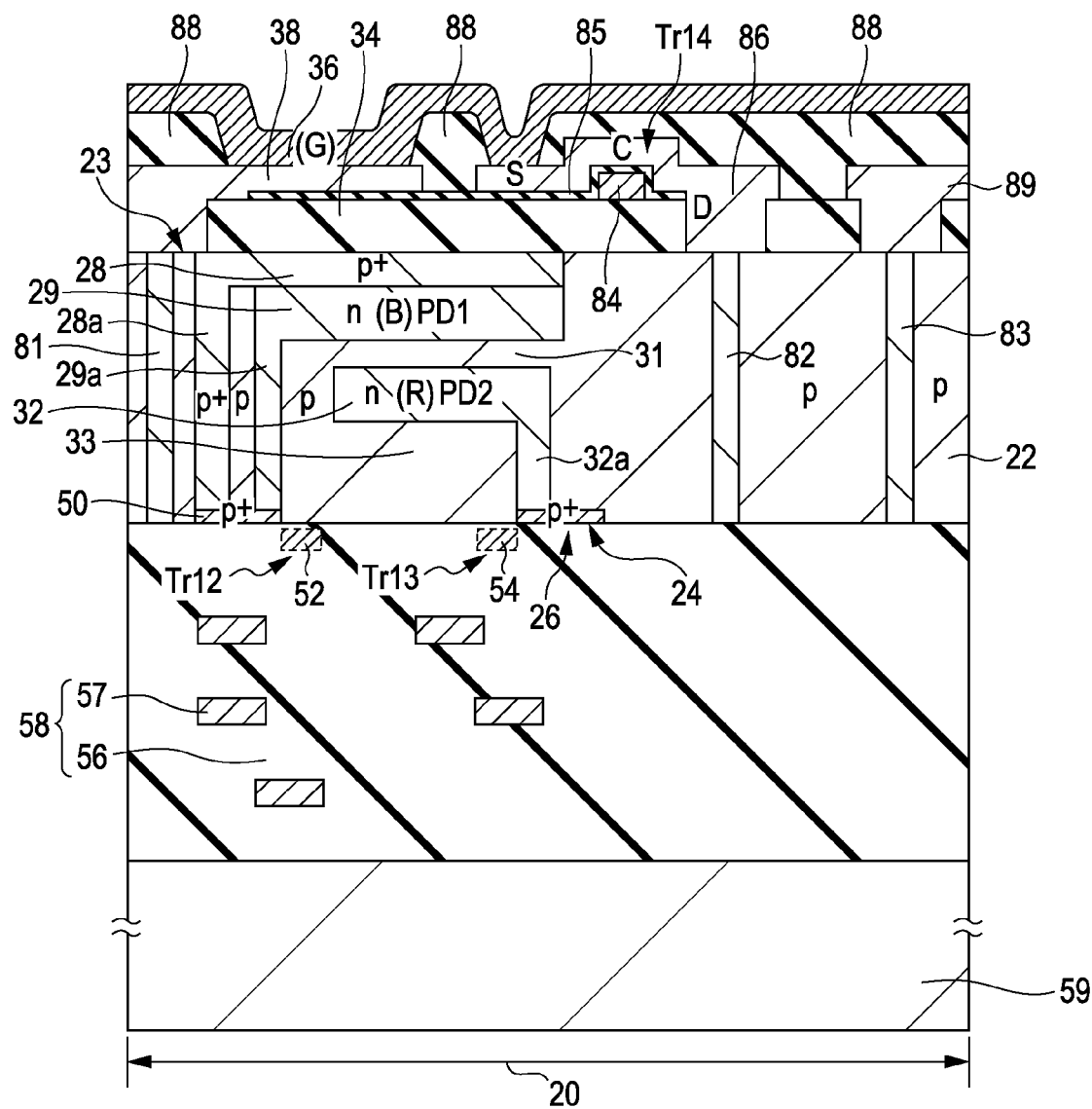
FIG. 43 is a diagram illustrating a process of manufacturing the solid-state imaging device according to the sixth embodiment.

Subsequently, as shown in FIG. 43, the organic photoelectric conversion layer 36 is formed on the entire surface so as to be adjacent on the lower electrode 38 facing the opening 94. The organic photoelectric conversion layer 36 can be formed by vapor deposition, for example.

Figure 44:
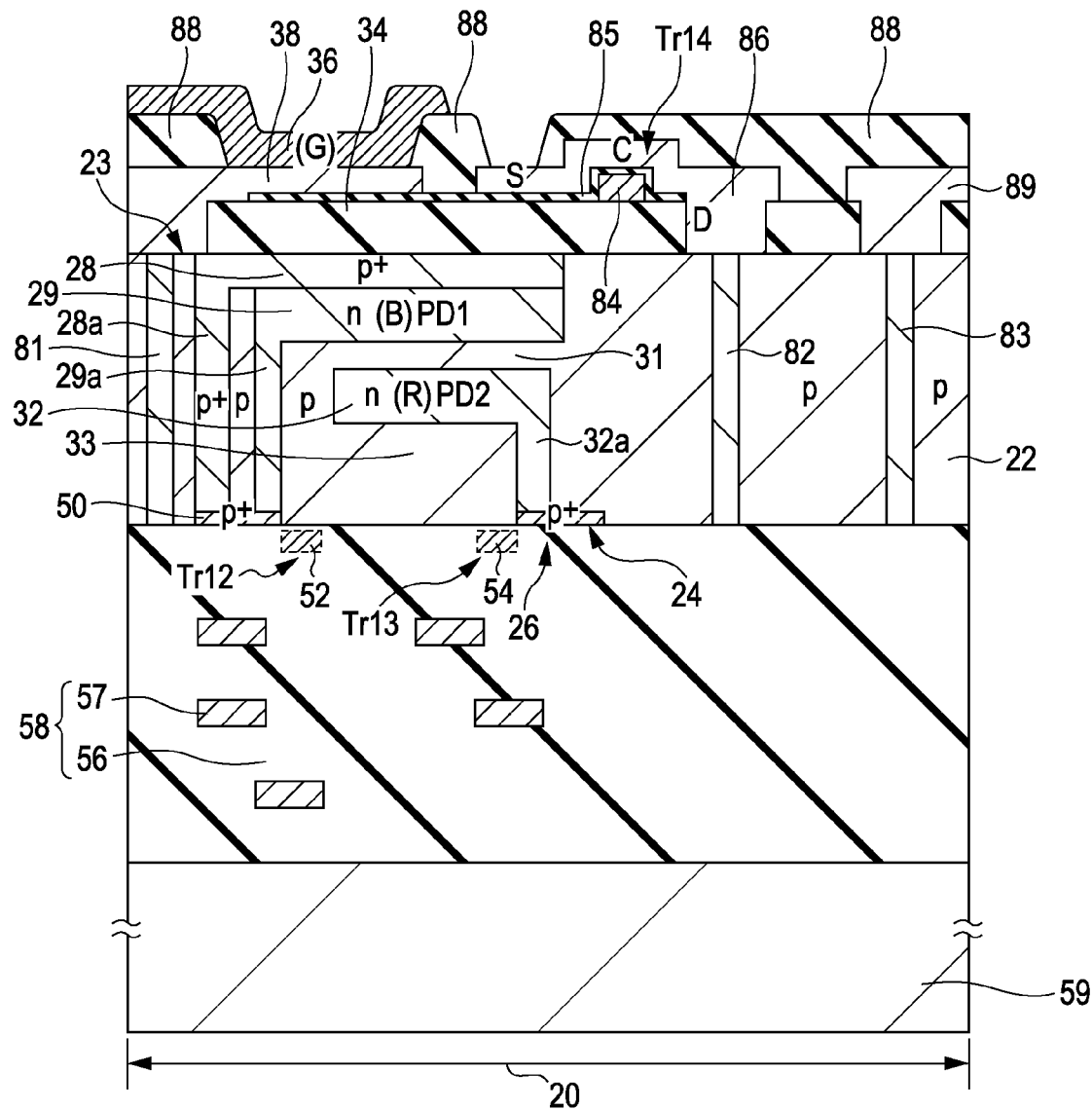
FIG. 44 is a diagram illustrating a process of manufacturing the solid-state imaging device according to the sixth embodiment.

Subsequently, as shown in FIG. 44, the organic photoelectric conversion layer 36 is patterned so that a part of the organic photoelectric conversion layer 36 extends on the lower electrode 38 and remains on the insulating layer 88.

Figure 45:
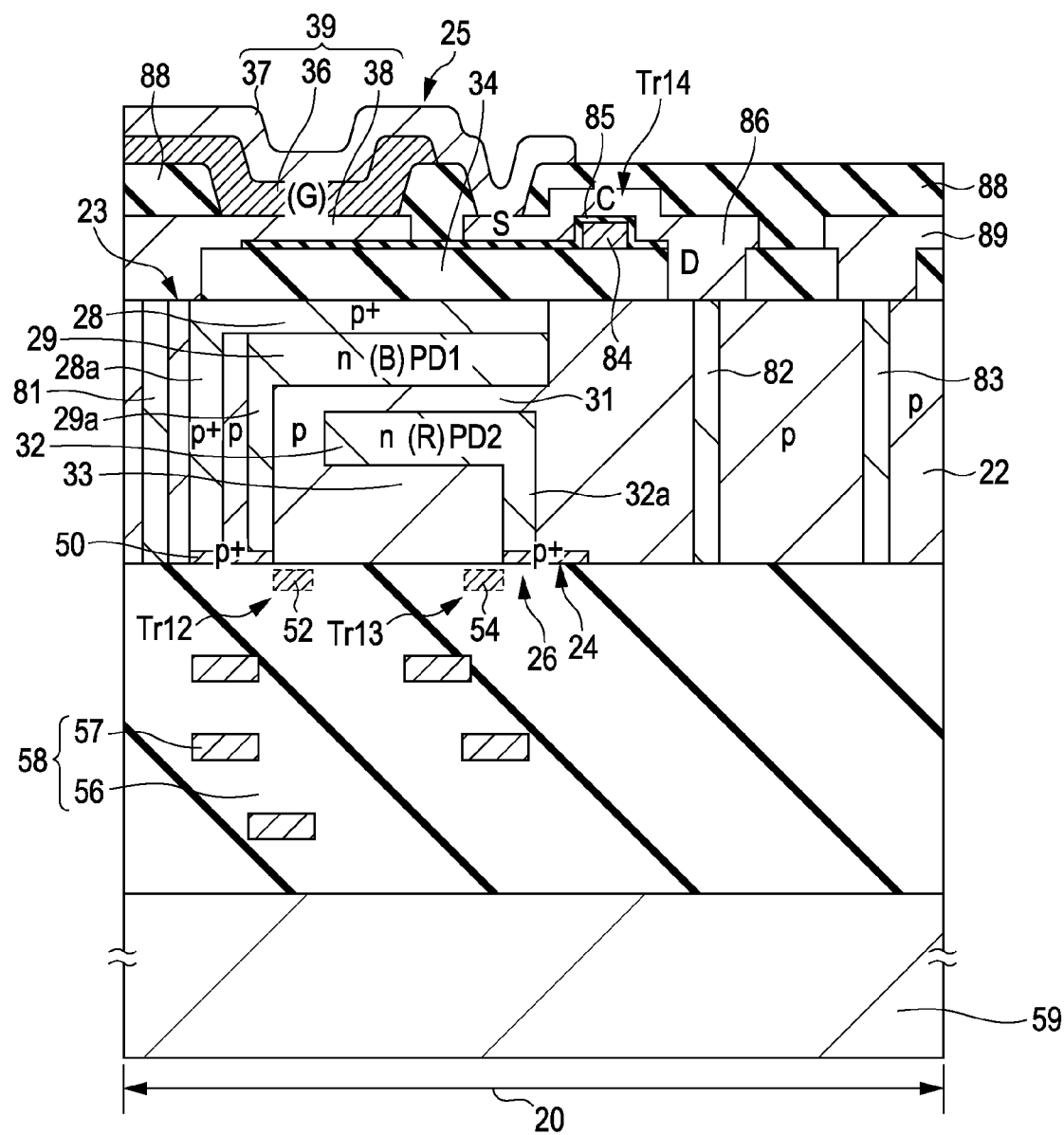
FIG. 45 is a diagram illustrating a process of manufacturing the solid-state imaging device according to the sixth embodiment.

Subsequently, as shown in FIG. 45, the upper electrode 37 formed of a transparent conductive layer is formed so as to be connected to the organic photoelectric conversion layer 36 and the source region S of the semiconductor thin film 86 via the opening 95.

Subsequently, the planarization layer 61 and the on-chip lens 62 are formed to form the desired solid-state imaging device 79 shown in FIG. 35.

According to the method of manufacturing the solid-state imaging device of this embodiment, it is possible to manufacture the back-illuminated solid-state imaging device in which the laminated organic photoelectric conversion unit 39 for one color is close to the photodiodes PD1 and PD2 for two colors. That is, the organic photoelectric conversion unit 39 can be formed on the upper layer of the photodiodes PD1 and PD2 without interposing the multi-layer wiring layer 58. Accordingly, it is possible to suppress the dependence on the red, green, and blue F numbers. Even when the F numbers are changed, it is possible to manufacture the solid-state imaging device capable of suppressing the variation in the sensitivity between the colors without the variation in the spectral balance of each color.

8. Seventh Embodiment

Exemplary Configuration of Solid-State Imaging Device

Figure 46:
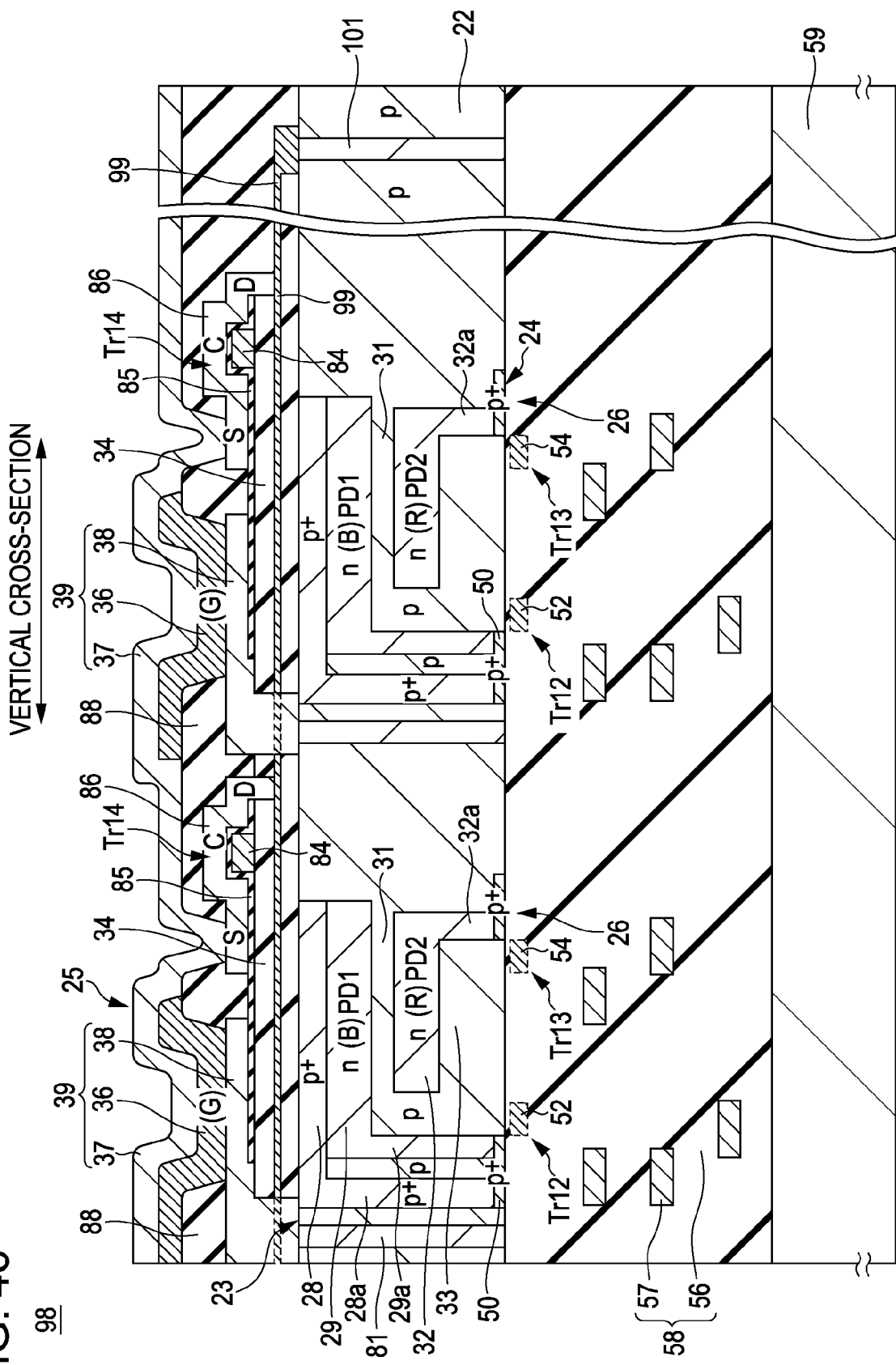
FIG. 46 is a diagram illustrating the configuration of major units of a solid-state imaging device according to a seventh embodiment of the invention.
Figure 47:
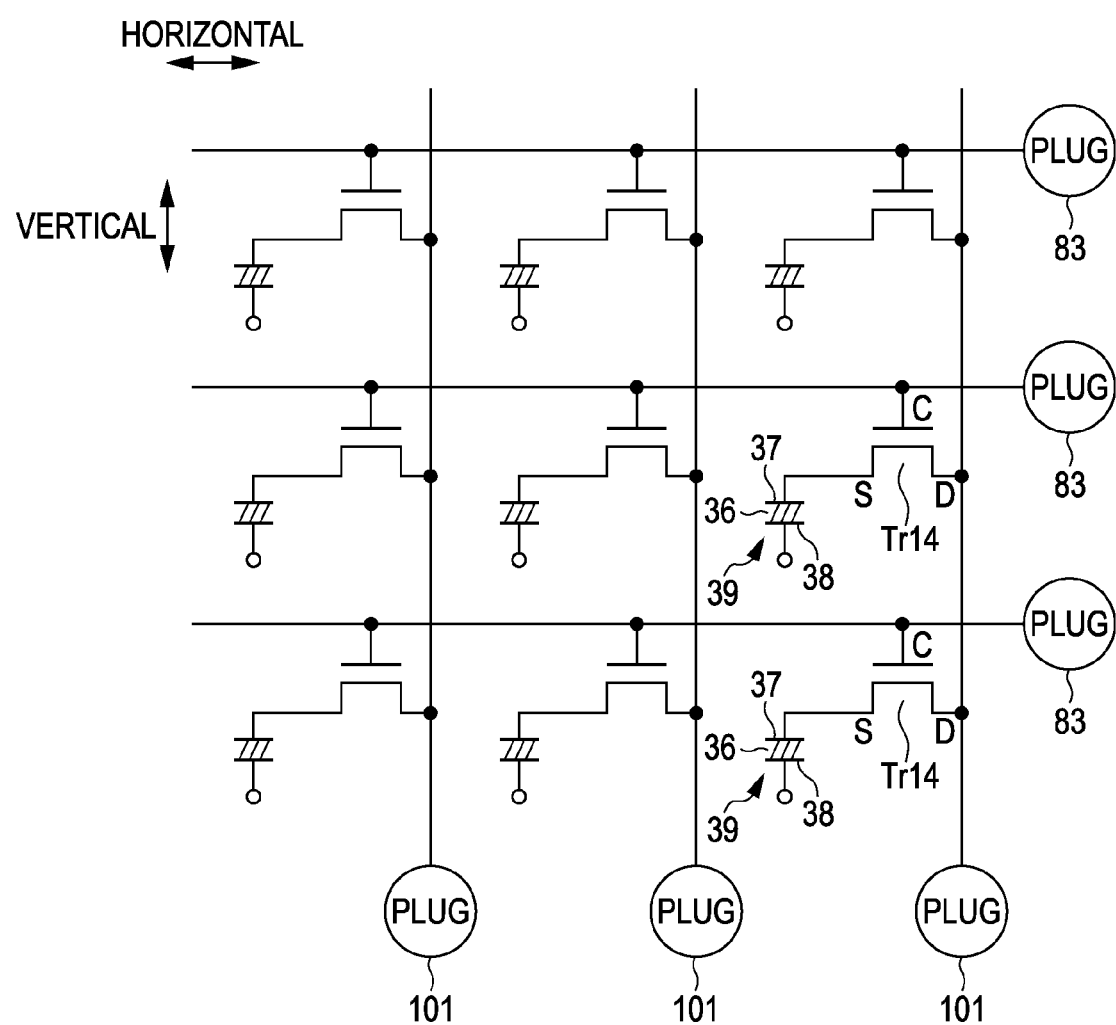
FIG. 47 is a diagram illustrating the circuit configuration of major units according to the seventh embodiment.

In FIGS. 46 and 47, a solid-state imaging device according to a seventh embodiment of the invention is shown. The solid-state imaging device according to this embodiment is a back-illuminated CMOS solid-state imaging device. In a solid-state imaging device 98 according to the seventh embodiment, the organic photoelectric conversion unit 39 for the first color, in which the thin film transistor Tr14 serves as a transmission transistor, the first photodiode PD1 for the second color, and the second photodiode PD2 for the third color are laminated in the depth direction in the same pixel. As in the sixth embodiment, the first photodiode PD1 and the second photodiode PD2 are formed in the semiconductor substrate 22. The transmission transistors Tr12 and Tr13 of the first photodiode PD1 and the second photodiode PD2 are formed on the front surface of the semiconductor substrate 22. The organic photoelectric conversion unit 39 and the thin film transistor Tr14 are formed on the rear surface of the semiconductor substrate 22 with the insulating layer 34 interposed therebetween.

In this embodiment, as described above, the solid-state imaging device includes the organic photoelectric conversion unit 39 executing the photoelectric conversion to the green-wavelength light, the first photodiode PD1 executing the photoelectric conversion to the blue-wavelength light, and the second photodiode PD2 executing the photoelectric conversion to the red-wavelength light.

FIG. 46 is a diagram illustrating the vertical cross-section configuration of the pixel section (imaging region). In this embodiment, conductive plugs, which commonly connect the drain regions D of the thin film transistors Tr14 of the pixels arranged in a vertical line to each other and are connected to the drain regions D, are shared by one conductive plug 101. Therefore, each thin film and the drain region D of the transistor Tr14 are connected to a common wiring 99 in each of the pixels arranged in each vertical line. Each common wiring 99 is connected to one conductive plug 101.

Conductive plugs, which commonly connect the gate electrodes 86 of the thin film transistors Tr14 of the pixels arranged in a vertical line to each other and are connected to gate electrodes 86, are commonly used by one conductive plug 83 (see FIG. 43).

As shown in a circuit diagram of FIG. 47, the upper electrode 37 on the organic photoelectric conversion unit 39 of each pixel is connected to the drain D of the thin film transistor Tr14. The drains of the thin film transistors Tr14 of each row vertically arranged are commonly connected to each other and connected to the conductive plug 101. On the other hand, the gates of the thin film transistors Tr14 of each row arranged vertically are commonly connected to each other and are connected to the conductive plug 83.

It is desirable that the common wiring 99 is formed so as to avoid the light-sensing opening of each pixel. However, the common wiring 99 may be formed so as to cross the light-sensing opening when the transparent conductive layer is formed. The common wiring 99 may be formed in the insulating layer 34. The conductive plugs 101 and 83 are likely to deteriorate a noise or reduce the size of a pixel, when the conductive plugs 101 and 83 are disposed in the pixel. Therefore, the conductive plugs 101 and 83 are formed on the side of the peripheral circuit.

Since the other configuration is the same as that of the sixth embodiment, the same reference numerals are given to the units of FIG. 46 corresponding to the units in FIG. 35 and the repeated description is omitted.

In the solid-state imaging device 98 according to the seventh embodiment, since it is not necessary to form one conductive plug 101 formed through the semiconductor substrate 22 in each pixel, it is possible to reduce the number of conducive plugs. Therefore, the area of the light-sensing passage of the photoelectric conversion unit can be broadened. Since the number of conductive plugs can be reduced, it is possible to suppress a noise in the pixel of blue (B) or red (R) due to the conductive plug.

In the seventh embodiment, as in the above-described embodiments, the organic photoelectric conversion unit 39 may be close to the two photodiodes PD1 and PD2. Even when the dependence on the F numbers of the colors is suppressed and the F numbers are changed, it is possible to suppress the variation in the sensitivity between the colors without the variation in the spectral balance of each color. Since the negative voltage VL (<0 V) is applied to the lower electrode 38 at the time of accumulating the charges, the interface with the silicon insulating layer 34 becomes the hole accumulation state. When the insulating layer 34 has the negative fixed charges, the hole accumulation state is further enhanced and it is possible to suppress the dark current.

9. Eighth Embodiment

Exemplary Configuration of Solid-State Imaging Device

Figure 48:
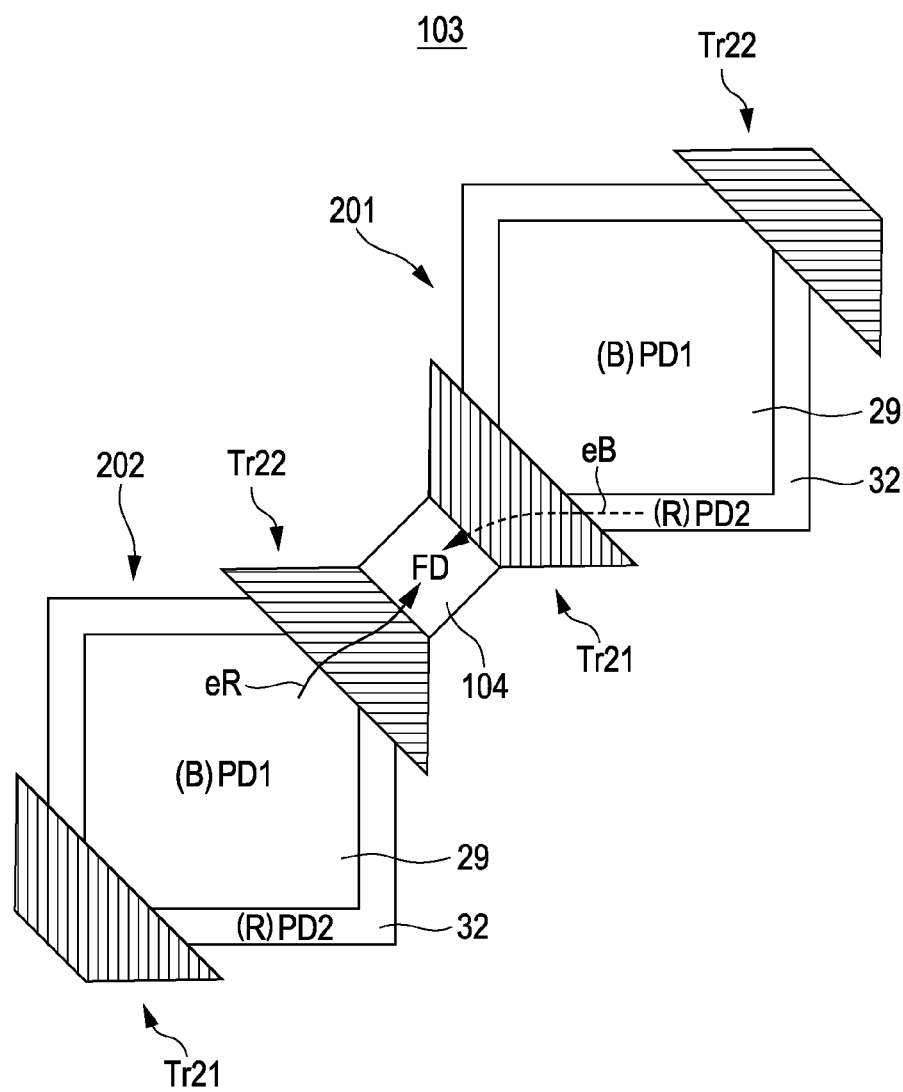
FIG. 48 is a schematic diagram illustrating the configuration of major units of a solid-state imaging device according to an eighth embodiment of the invention.
Figure 49:
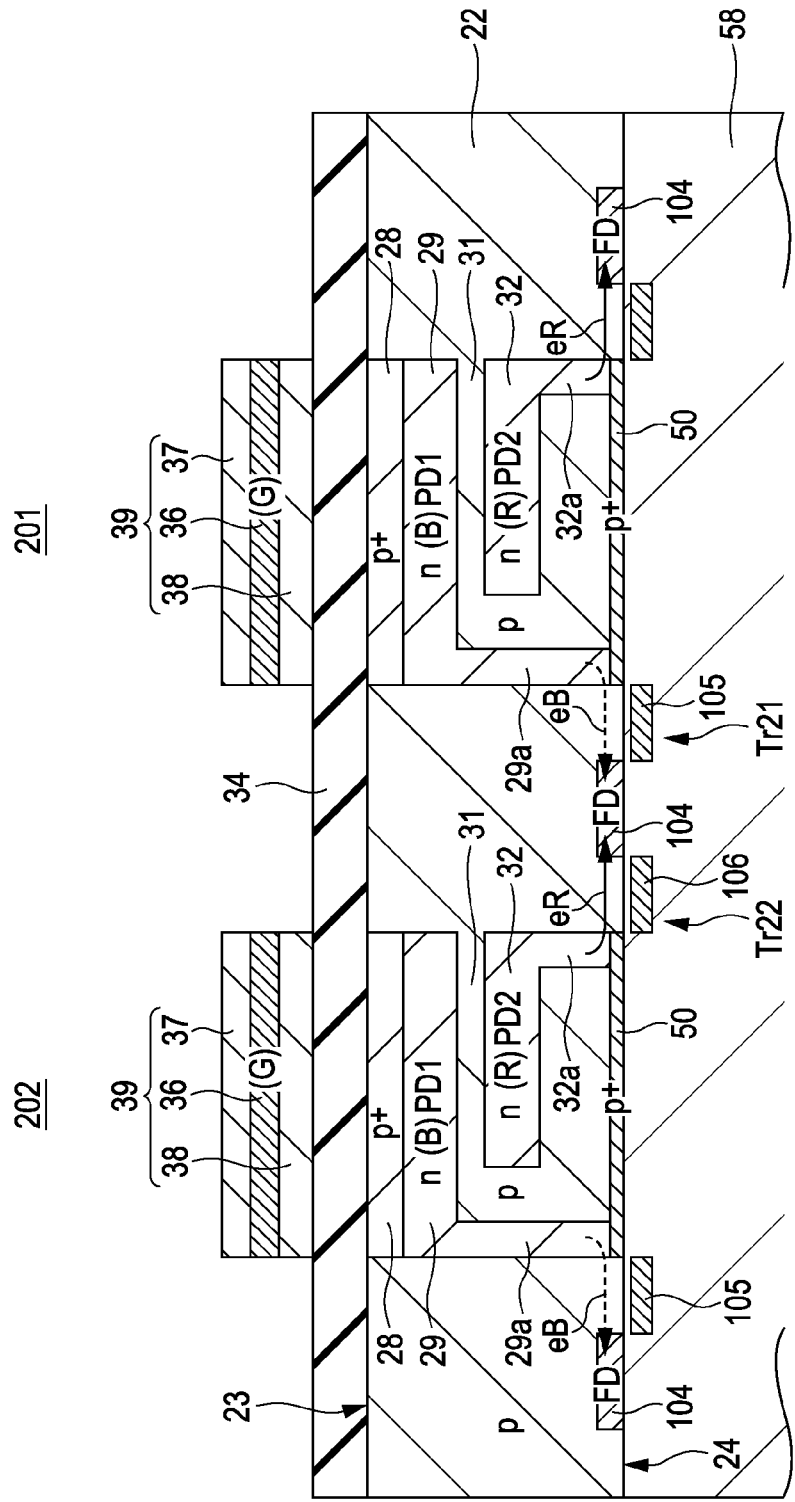
FIG. 49 is a schematic sectional view illustrating the solid-state imaging device in FIG. 44.

In FIGS. 48 and 49 (schematic diagrams), a solid-state imaging device according to an eighth embodiment of the invention is shown. The solid-state imaging device according to this embodiment is a back-illuminated CMOS solid-state imaging device. In a solid-state imaging device 103 according to the eighth embodiment, as in the above-described embodiments, the organic photoelectric conversion unit 39 for the first color, the first photodiode PD1 for the second color, and the second photodiode PD2 for the third color are laminated in the depth direction in the same pixel.

In this embodiment, as described above, the solid-state imaging device includes the organic photoelectric conversion unit 39 executing the photoelectric conversion to the green-wavelength light, the first photodiode PD1 executing the photoelectric conversion to the blue-wavelength light, and the second photodiode PD2 executing the photoelectric conversion to the red-wavelength light.

In this embodiment, as shown in FIGS. 48 and 49, the pixels are arranged in the matrix form, and the photodiodes PD [PD1 and PD2] of two pixels 20 [201 and 202] are arranged diagonal to each other and share one floating diffusion unit (FD) 104. That is, in the solid-state imaging device 103 shown in FIG. 49 (schematic sectional view), the first photodiode PD1 and the second photodiode PD2 are formed in the same pixel 20 of the semiconductor substrate 22, and the organic photoelectric conversion unit 39 is formed on the rear surface 23 of the substrate with the insulating layer 34 interposed therebetween. The organic photoelectric conversion unit 39 includes the organic photoelectric conversion layer 36 and includes the upper electrode 37 and the lower electrode 38 which interpose the organic photoelectric conversion layer 36.

On the side of the front surface 24 of the substrate, one floating diffusion unit (FD) 104 is formed between the photodiodes PD [PD1 and PD2] of the two pixels 201 and 202 arranged diagonal to each other. A gate electrode 105 of a transmission transistor Tr21 is formed between the floating diffusion unit (FD) 104 and the n-type semiconductor region (charge accumulation layer) 29 of the first photodiode PD1 of one pixel 201. A gate electrode 106 of the transmission transistor Tr22 is formed between the floating diffusion unit (FD) 104 and the n-type semiconductor region (charge accumulation layer) 32 of the second photodiode PD2 of the other pixel 202.

Although not shown, in the organic photoelectric conversion unit 39 of each pixel 20 [201 and 202], one floating diffusion unit (FD) is formed in each pixel. On the side of the front surface 24 of the substrate, the multi-layer wiring layer 58 having the wirings 57 of the plural layers is formed, and the supporting substrate 59 is attached to the multi-layer wiring layer 58. On the side of the rear surface 23 of the substrate, the unit corresponding to the on-chip lens in FIG. 1 is formed above the organic photoelectric conversion unit 39 with the planarization layer 61. The same reference numeral is given and the repeated description is omitted.

An operation (driving method) of the solid-state imaging device 103 according to the eighth embodiment will be described. As in the first embodiment, when light is incident from the rear surface 23 of the substrate 22 at the time of accumulating the charges, the green-wavelength light is subjected to photoelectric conversion in the organic photoelectric conversion unit 39 and the signal charges (electrons) are generated and accumulated in the charge accumulation layer (not shown). In the first photodiode PD1, the blue-wavelength light is subjected to photoelectric conversion and the signal charges (electrons) are generated and accumulated in the n-type semiconductor region 29. In the second photodiode PD2, the red-wavelength light is subjected to photoelectric conversion and the signal charges (electrons) are generated and accumulated in the n-type semiconductor region 32.

At the time of reading the charges, transmission pulses are applied to the gate electrode 105 and 106 of the transmission transistors Tr21 and Tr22 at different time. For example, when the transmission transistor Tr21 is turned on, blue signal charges eB of the pixel 201 are transmitted to one floating diffusion unit (FD) 104 via the transmission transistor Tr21, are converted into pixel signals, and are output. Next, when the transmission transistor Tr22 is turned on, red signal charges eR of the pixel 202 are transmitted to the other floating diffusion unit (FD) 104 via the transmission transistor Tr22, are converted into pixel signals, and are output.

Green signal charges in the organic photoelectric conversion unit 39 are transmitted to the floating diffusion unit (FD) disposed in each pixel, are converted into pixel signals, and are output.

In the solid-state imaging device 103 according to the eighth embodiment, the photodiodes PD of two pixels adjacent to each other share one floating diffusion unit (FD) 104. With such a configuration, even when the pixels become minute, the area of the photoelectric conversion unit can be broadened. Therefore, even when the pixels become minute, it is possible to improve the sensitivity.

According to the eighth embodiment, as in the above-described embodiments, the organic photoelectric conversion unit 39 is close to the two photodiodes PD1 and PD2. Even when the dependence on the F numbers of the colors is suppressed and the F numbers are changed, it is possible to suppress the variation in the sensitivity between the colors without the variation in the spectral balance of each color. Since the negative voltage VL (<0 V) is applied to the lower electrode 38 at the time of accumulating the charges, the interface with the silicon insulating layer 34 becomes the hole accumulation state. When the insulating layer 34 has the negative fixed charges, the hole accumulation state is further enhanced and it is possible to suppress the dark current.

In FIG. 49, the transmission transistors connected to the photodiodes PD [PD1 and PD2] have the gate electrode in which the transmission electrode is formed in a planar form. However, the vertical type transistor may be also possible in FIG. 48.

Figure 50:
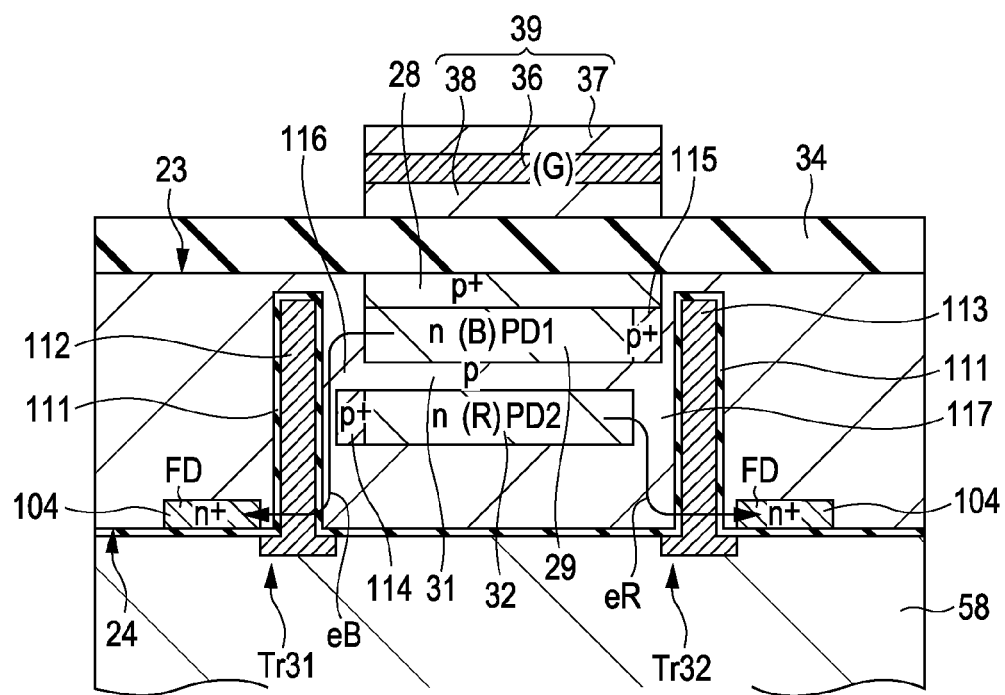
FIG. 50 is a schematic sectional view illustrating a transmission transistor of the solid-state imaging device according to a modified example of the sixth embodiment.

FIG. 50 is a schematic diagram illustrating the configuration in which the transmission transistors of the photodiodes PD are configured as the vertical type transistors. In this embodiment, the first photodiode PD1 and the second photodiode PD2 are formed in the same pixel 20 of the semiconductor substrate 22. The organic photoelectric conversion unit 39 is formed on the rear surface 23 of the substrate with the insulating layer 34 interposed therebetween. The organic photoelectric conversion unit 39 includes the organic photoelectric conversion layer 36 and includes the upper electrode 37 and the lower electrode 38 which interpose the organic photoelectric conversion layer 36.

The p-type semiconductor region 28 and the n-type semiconductor region 29 serving as the hole accumulation layer and forming the first photodiode PD1 and the p-type semiconductor region 31 and the n-type semiconductor region 32 forming the second photodiode PD2 are laminated in parallel in the depth direction. On the front surface 24 of the semiconductor substrate 22, one floating diffusion unit (FD) 104 is formed between the two pixels 201 and 202 arranged diagonal to each other in FIG. 48. Vertical type gate electrodes 112 and 113 forming the vertical transmission transistors Tr31 and Tr32 and buried in the depth direction of the substrate 2 with the gate insulating layer 111 interposed therebetween are formed with the photodiodes PD [PD1 and PD2] of each pixel interposed therebetween. The surface of the gate electrode 113 of the n-type semiconductor region 29 of the first photodiode PD1 is covered with a high-concentration p-type semiconductor region 115. The surface of the gate electrode 112 of the n-type semiconductor region 32 of the second photodiode PD2 is covered with a high-concentration p-type semiconductor region 114.

When the transmission transistor Tr31 is turned on at the time of reading the charges, the blue signal charges eB accumulated in the n-type semiconductor region 29 of the first photodiode PD1 are transmitted to one floating diffusion unit (FD) 104 via the channel region 116. Next, when the transmission transistor Tr32 is turned on, the red signal charges eR accumulated in the n-type semiconductor region 32 of the second photodiode PD2 are transmitted to the other floating diffusion unit (FD) 104 via the channel region 117.

In this way, the area of the photoelectric conversion unit of the pixel can be broadened in the vertical type transmission transistor, compared to the planar type transistor. Accordingly, it is advantageous when the pixels become minute.

10. Ninth Embodiment

Exemplary Configuration of Electronic Apparatus

The solid-state imaging device according to the above embodiments of the invention is applicable to an electronic apparatuses such as a camera system such as a digital camera or a video camera, a cellular phone having an imaging function, or other apparatuses having an imaging function.

Figure 52:
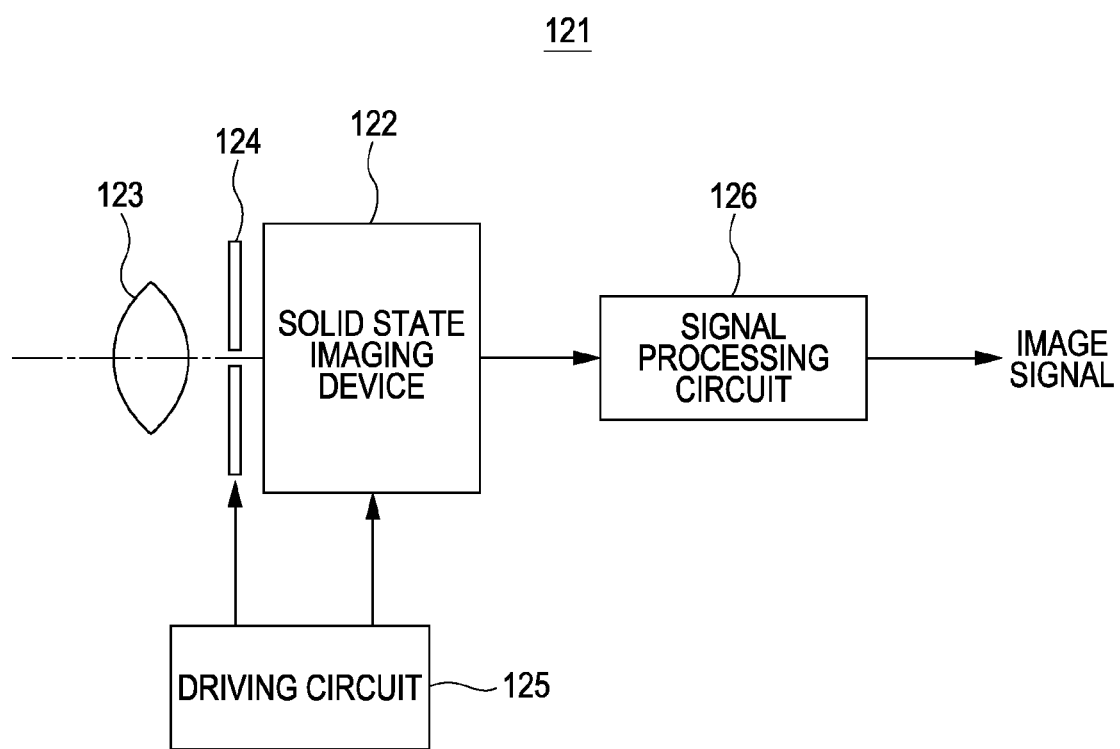
FIG. 52 is a schematic diagram illustrating the configuration of an electronic apparatus according to an embodiment of the invention.

FIG. 52 is a diagram illustrating a camera as an example of an electronic apparatus according to a tenth embodiment of the invention. The camera according to this embodiment is an exemplary video camera capable of imaging a still image or a moving image. A camera 121 according to this embodiment includes a solid-state imaging device 122, an optical system 123 guiding incident light to a light-sensing sensor of the solid-state imaging device 122, and a shutter device 124. The camera 121 includes a driving circuit 125 driving the solid-state imaging device 122 and a signal processing circuit 126 processing an output signal of the solid-state imaging device 122.

One of the solid-state imaging devices according to the above-described embodiments is applied to the solid-state imaging device 122. The optical system (optical lens) 123 images image light (incident light) from a subject on an imaging surface of the solid-state imaging device 122. At this time, signal charges are accumulated in the solid-state imaging device 122 for a certain period. The optical system 123 may be an optical lens including plural optical lenses. The shutter device 124 controls light-emitting time and light-shielding time for the solid-state imaging device 122. The driving circuit 125 supplies a driving signal to control a transmission operation of the solid-state imaging device 122 and a shutter operation of the shutter device 124. Signal transmission of the solid-state imaging device 122 is executed by the driving signal (timing-signal) supplied from the driving circuit 125. The signal processing circuit 126 executes various signal processes. An image signal subjected to the signal processes is stored in a memory medium such as a memory device or is output to a monitor.

In the electronic apparatus according to the tenth embodiment, since the organic photoelectric conversion unit is close to two photodiodes in the solid-state imaging device, the dependence on the F numbers of red, green, and blue is suppressed. Therefore, even when the F-number is changed, the spectral balance of each color is not varied and the variation in the sensitivity between colors can be prevented. Since the interface with the silicon insulating layer can be set to the hole accumulation state in the photodiode, the occurrence of the dark current is suppressed. Therefore, it is possible to supply an electronic apparatus with high resolution and high quality.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a silicon substrate having a light incident side and a second side opposite to the light incident side;
a first photodiode in the silicon substrate;
a first gate electrode and a second gate electrode in contact with the silicon substrate from the second side, wherein the first photodiode is disposed adjacent to where the first gate electrode contacts the silicon substrate;
an organic photoelectric conversion unit above the light incident side of the silicon substrate;
a first floating diffusion in the silicon substrate, the first floating diffusion being disposed adjacent to where the first gate electrode contacts the silicon substrate, wherein the first gate electrode is configured to transmit a charge in the first photodiode to the first floating diffusion; and
a second floating diffusion in the silicon substrate, the second floating diffusion being disposed adjacent to where the second gate electrode contacts in the silicon substrate.

2. The solid-state imaging device according to claim 1, wherein the organic photoelectric conversion unit has a lower electrode, an organic photoelectric conversion layer, and an upper electrode in order from the light incident side of the silicon substrate.

3. The solid-state imaging device according to claim 1, further comprising a second photodiode in the silicon substrate, wherein the second photodiode is disposed above the first photodiode.

4. The solid-state imaging device according to claim 3, wherein the first photodiode is for a red color and the second photodiode is for a blue color.

5. The solid-state imaging device according to claim 3, further comprising a semiconductor region having a p-type conductivity between the first photodiode and an insulating layer on the light incident side of the silicon substrate.

6. The solid-state imaging device according to claim 3, wherein the first photodiode is for a blue color and the second photodiode is for a red color.

7. The solid-state imaging device according to claim 1, further comprising an insulating layer disposed between the silicon substrate and the first gate electrode.

8. The solid-state imaging device according to claim 2, further comprising a conductive plug disposed through the silicon substrate, wherein the conductive plug is connected to the lower electrode.

9. The solid-state imaging device according to claim 1, further comprising a multi-layer wiring layer below the second side of the silicon substrate.

10. An electronic apparatus comprising:
an optical system;
a driving circuit;
a signal processing circuit; and
a solid-state imaging device, comprising:
a silicon substrate having a light incident side and a second side opposite to the light incident side;
a first photodiode in the silicon substrate;
a first gate electrode and a second gate electrode in contact with the silicon substrate from the second side, wherein the first photodiode is disposed adjacent to where the first gate electrode contacts the silicon substrate;
an organic photoelectric conversion unit above the light incident side of the silicon substrate;
a first floating diffusion in the silicon substrate, the first floating diffusion being disposed adjacent to where the first gate electrode contacts the silicon substrate, wherein the first gate electrode is configured to transmit a charge in the first photodiode to the first floating diffusion; and
a second floating diffusion in the silicon substrate, the second floating diffusion being disposed adjacent to where the second gate electrode contacts the silicon substrate.

11. The solid-state imaging device according to claim 1, wherein the first gate electrode and the second gate electrode are disposed between the first floating diffusion and the second floating diffusion.

12. The electronic apparatus according to claim 10, wherein the first gate electrode and the second gate electrode are disposed between the first floating diffusion and the second floating diffusion.

13. The electronic apparatus according to claim 10, wherein the organic photoelectric conversion unit has a lower electrode, an organic photoelectric conversion layer, and an upper electrode in order from the light incident side of the silicon substrate.

14. The electronic apparatus according to claim 10, further comprising a second photodiode in the silicon substrate, wherein the second photodiode is disposed above the first photodiode.

15. The electronic apparatus according to claim 14, wherein the first photodiode is for a red color and the second photodiode is for a blue color.

16. The electronic apparatus according to claim 14, wherein the first photodiode is for a blue color and the second photodiode is for a red color.

17. The electronic apparatus according to claim 10, further comprising:
   an insulating layer disposed between the silicon substrate and the first gate electrode.

18. The electronic apparatus according to claim 13, further comprising:
   a conductive plug disposed through the silicon substrate, wherein the conductive plug is connected to the lower electrode.

19. The electronic apparatus according to claim 10, further comprising:
   a multi-layer wiring layer below the second side of the silicon substrate.

* * * * *